(12) United States Patent  (10) Patent No.: US 7,737,543 B2
Jobetto et al.  (45) Date of Patent: Jun. 15, 2010

(54) SEMICONDUCTOR DEVICE AND METHOD OF MANUFACTURING THE SAME

(75) Inventors: Hiroyasu Jobetto, Hachioji (JP); Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/415,782

(22) Filed: Mar. 31, 2009

(65) Prior Publication Data

US 2009/0200665 A1  Aug. 13, 2009

Related U.S. Application Data

(60) Division of application No. 11/671,268, filed on Feb. 5, 2007, which is a division of application No. 10/826,039, filed on Apr. 16, 2004, now Pat. No. 7,294,922, which is a continuation of application No. PCT/JP03/09958, filed on Aug. 5, 2003.

(30) Foreign Application Priority Data

Aug. 9, 2002 (JP) .............................. 2002-232289
Aug. 9, 2002 (JP) .............................. 2002-232737
Aug. 30, 2002 (JP) .............................. 2002-254695

(51) Int. Cl.
*H01L 23/02* (2006.01)

(52) U.S. Cl. ................ 257/686; 257/700; 257/E25.006

(58) Field of Classification Search ................ 257/686, 257/700–703, 736–738, 777, 780, E25.006, 257/E25.013
See application file for complete search history.

(56) References Cited

U.S. PATENT DOCUMENTS

| | | | |
|---|---|---|---|
| 5,111,278 A | 5/1992 | Eichelberger | |
| 5,757,072 A | 5/1998 | Gorowitz et al. | |
| 5,841,193 A | 11/1998 | Eichelberger | |
| 5,989,982 A | 11/1999 | Yoshikazu | |
| 6,104,091 A | * 8/2000 | Ito et al. | .................. 257/738 |
| 6,140,155 A | 10/2000 | Mihara et al. | |
| 6,154,366 A | 11/2000 | Ma et al. | |

(Continued)

FOREIGN PATENT DOCUMENTS

EP  1 137 066 A2  9/2001

(Continued)

*Primary Examiner*—Hoai v Pham
(74) *Attorney, Agent, or Firm*—Frishauf, Holtz, Goodman & Chick, P.C.

(57) ABSTRACT

A semiconductor device includes a semiconductor construction assembly having a semiconductor substrate which has first and second surfaces, and has an integrated circuit element formed on the first surface, a plurality of connection pads which are connected to the integrated circuit element, a protective layer which covers the semiconductor substrate and has openings for exposing the connection pads, and conductors which are connected to the connection pads, arranged on the protective layer, and have pads. An upper insulating layer covers the entire upper surface of the semiconductor construction assembly including the conductors except the pads. A sealing member covers at least one side surface of the semiconductor construction assembly. An upper conductors is formed on the upper insulating layer, and has one ends electrically connected to the pads and an external connection pads, respectively, an external connection pad of at least one of the upper conductors being disposed in a region corresponding to the sealing member.

8 Claims, 84 Drawing Sheets

U.S. PATENT DOCUMENTS

| | | |
|---|---|---|
| 6,159,767 A | 12/2000 | Eichelberger |
| 6,271,469 B1 | 8/2001 | Ma et al. |
| 6,348,728 B1 | 2/2002 | Aiba et al. |
| 6,392,898 B1 | 5/2002 | Asai et al. |
| 6,400,573 B1 | 6/2002 | Mowatt et al. |
| 6,423,570 B1 | 7/2002 | Ma et al. |
| 6,545,354 B1 | 4/2003 | Aoki et al. |
| 6,590,291 B2 | 7/2003 | Akagawa |
| 6,607,970 B1 | 8/2003 | Wakabayashi |
| 6,674,162 B2 | 1/2004 | Takao |
| 6,680,529 B2 | 1/2004 | Chen et al. |
| 6,720,644 B2 | 4/2004 | Yoshizawa et al. |
| 6,765,299 B2 | 7/2004 | Takahashi et al. |
| 6,770,971 B2 | 8/2004 | Kouno |
| 6,774,467 B2 | 8/2004 | Horiuchi et al. |
| 6,847,066 B2 | 1/2005 | Tahara et al. |
| 6,870,256 B2 | 3/2005 | Aoki et al. |
| 6,894,282 B2 | 5/2005 | Freund et al. |
| 6,900,532 B1 | 5/2005 | Kelkar et al. |
| 6,952,049 B1 | 10/2005 | Ogawa et al. |
| 7,247,947 B2 | 7/2007 | Wakabayashi et al. |
| 7,514,335 B2 | 4/2009 | Wakabayashi et al. |
| 7,547,967 B2 | 6/2009 | Jobetto et al. |
| 7,618,886 B2 | 11/2009 | Jobetto et al. |
| 2002/0017730 A1 | 2/2002 | Tahara et al. |
| 2002/0084522 A1 | 7/2002 | Yoshizawa et al. |
| 2003/0122244 A1 | 7/2003 | Lin et al. |
| 2003/0133274 A1 | 7/2003 | Chen et al. |
| 2003/0197285 A1 | 10/2003 | Strandberg et al. |
| 2004/0046254 A1 | 3/2004 | Lin et al. |
| 2004/0195686 A1 | 10/2004 | Jobetto et al. |
| 2005/0140007 A1 | 6/2005 | Jobetto |
| 2005/0186768 A1 | 8/2005 | Sugaya et al. |
| 2007/0042594 A1 | 2/2007 | Wakabayashi et al. |
| 2007/0126128 A1 | 6/2007 | Jobetto et al. |
| 2008/0247703 A1 | 10/2008 | Kodama et al. |

FOREIGN PATENT DOCUMENTS

| | | |
|---|---|---|
| JP | 9-266183 A | 10/1997 |
| JP | 11-233678 A | 8/1999 |
| JP | 2000-124354 A | 4/2000 |
| JP | 2001-144121 A | 5/2001 |
| JP | 2001-168231 A | 6/2001 |
| JP | 2001-217381 A | 8/2001 |
| JP | 2001-320015 A | 11/2001 |
| JP | 2001-326299 A | 11/2001 |
| JP | 2001-332643 A | 11/2001 |
| JP | 2002-016173 A | 1/2002 |
| JP | 2002-246504 A | 8/2002 |
| JP | 2002-246758 A | 8/2002 |
| JP | 2003-318323 A | 11/2003 |
| WO | WO 92/17901 A1 | 10/1992 |
| WO | WO 02/27786 A1 | 4/2002 |

\* cited by examiner

SEMICONDUCTOR DEVICE AND METHOD OF MANUFACTURING THE SAME

CROSS-REFERENCE TO RELATED APPLICATIONS

The present application is a Divisional Application of U.S. Ser. No. 11/671,268 filed Feb. 5, 2007, which is a Divisional Application of U.S. Ser. No. 10/826,039 filed Apr. 16, 2004 (now U.S. Pat. No. 7,294,922), which is a Continuation Application of PCT Application No. PCT/JP03/09958, filed Aug. 5, 2003, which was published under PCT Article 21(2) in English.

This application is based upon and claims the benefit of priority from prior Japanese Patent Applications No. 2002-232289, filed Aug. 9, 2002; No. 2002-232737, filed Aug. 9, 2002; and No. 2002-254695, filed Aug. 30, 2002, the entire contents of all of which are incorporated herein by reference.

BACKGROUND OF THE INVENTION

1. Field of the Invention

The present invention relates to a semiconductor device which incorporates a chip-size semiconductor package, and a method of manufacturing the semiconductor device.

2. Description of the Related Art

For example, in a semiconductor device called BGA (Ball Grid Array), a semiconductor chip formed with an LSI and the like is mounted on the upper center surface of a relay board (interposer) slightly larger in size than the semiconductor chip. Connection terminals of solder balls are arrayed in a matrix on the lower surface of the relay board. The relay board is used to sufficiently increase the size and pitch by a distribution wire in order to ensure connection strength and reliability in bonding an external connection electrode formed on the semiconductor chip to another circuit board.

FIG. 84 is a sectional view showing an example of a conventional semiconductor device. A semiconductor chip 1 has a structure in which a plurality of bump electrodes 3 of copper or the like are arranged at the periphery on the lower surface of a silicon substrate 2.

A relay board 4 has a base film 5 slightly larger in size than the silicon substrate 2 of the semiconductor chip 1. Distribution wires 6 which are respectively connected to the bump electrodes 3 of the semiconductor chip 1 are formed on the upper surface of the base film 5.

The distribution wires 6 are comprised of first connection pads 7 which are arranged in correspondence with the bump electrodes 3 of the semiconductor chip 1, second connection pads 8 which are arrayed in a matrix, and lead lines 9 which connect the first and second connection pads 7 and 8. Circular holes 10 are formed in the base film 5 at portions corresponding to the centers of the second connection pads 8.

The semiconductor chip 1 is mounted on the upper center surface of the relay board 4 via an anisotropic conductive adhesive 11. The anisotropic conductive adhesive 11 is prepared by adding many conductive particles 13 into a thermosetting resin 12.

When the semiconductor chip 1 is to be mounted on the relay board 4, the semiconductor chip 1 is aligned and simply placed on the upper center surface of the relay board 4 via the sheet-like anisotropic conductive adhesive 11.

A predetermined pressure is applied for bonding at a temperature at which the thermosetting resin 12 sets. The bump electrodes 3 then push away the thermosetting resin 12 and are electrically connected to the upper surfaces of the first connection pads 7 via the conductive particles 13. In addition, the lower surface of the semiconductor chip 1 is adhered to the upper surface of the relay board 4 via the thermosetting resin 12.

A resin sealing film 14 made of an epoxy resin is formed on the entire upper surface of the relay board 4 including the semiconductor chip 1. Solder balls 15 are formed in the circular holes 10, and connected to the lower surfaces of the second connection pads 8. Since the second connection pads 8 are arrayed in a matrix, the solder balls 15 are also arrayed in a matrix.

The solder ball 15 is larger in size than the bump electrode 3 of the semiconductor chip 1. In order to avoid contact between the solder balls 15, their arrangement interval must be larger than that of the bump electrodes 3. When the number of bump electrodes 3 of the semiconductor chip 1 increases, the arrangement region of the solder balls 15 must be set larger than the size of the semiconductor chip 1 in order to obtain an arrangement interval necessary for the solder balls 15. For this purpose, the relay board 4 is designed slightly larger in size than the semiconductor chip 1. Of the solder balls 15 arrayed in a matrix, peripheral solder balls 15 are arranged around the semiconductor chip 1.

The conventional semiconductor device adopts the relay board 4 having the distribution wire 6. By bonding after alignment, the lower surface of the bump electrode 3 of the semiconductor chip 1 is electrically connected to the upper surface of the first connection pad 7 of the distribution wire 6 on the relay board 4 via the conductive particles 13 of the anisotropic conductive adhesive 11. If the number of bump electrodes 3 of the semiconductor chip 1 increases and the size and arrangement interval of the bump electrodes 3 decrease, alignment becomes very difficult. By increasing the size of the semiconductor chip 1, the size and arrangement interval of the bump electrodes 3 can be increased. However, the number of semiconductor chips which can be formed from a wafer greatly decreases, resulting in an expensive semiconductor chip. The semiconductor chips 1 must be bonded and mounted on the relay board 4 one by one, which makes the manufacturing process cumbersome. This also applies to a multi-chip module type semiconductor device having a plurality of semiconductor chips.

BRIEF SUMMARY OF THE INVENTION

It is an object of the present invention to provide a semiconductor device capable of increasing the arrangement interval of external connection electrodes without bonding, and a method of manufacturing the semiconductor device.

It is another object of the present invention to provide a semiconductor device manufacturing method capable of manufacturing a plurality of semiconductor devices at once.

According to an aspect of the present invention, there is provided a semiconductor device comprising a semiconductor construction assembly having a semiconductor substrate which has one surface, the other surface facing the one surface, and a plurality of side surfaces between the one surface and the other surface, and has an integrated circuit element formed on the one surface, a plurality of connection pads which are arranged on the one surface and connected to the integrated circuit element, a protective layer which is formed to cover the one surface of the semiconductor substrate and has openings for exposing the connection pads, and a plurality of conductors which are connected to the connection pads, arranged on the protective layer, and have pads;

an upper insulating layer which entirely covers the one surface of the semiconductor construction assembly including the conductors except the pads;

a sealing member which covers at least one side surface of the semiconductor construction assembly; and upper conductors which are formed on the upper insulating layer, and has one ends electrically connected to the pads and an external connection pads, respectively, an external connection pad of at least one of the upper conductors being disposed in a region corresponding to the sealing member.

According to another aspect of the present invention, there is provided a semiconductor device manufacturing method comprising arranging on a base plate a plurality of semiconductor construction assemblies in which a plurality of conductors having pads are formed on a semiconductor substrate, so as to space apart the semiconductor construction assemblies from each other;

forming an insulating layer on an entire upper surface of the base plate including the plurality of semiconductor construction assemblies;

forming, on an upper surface of the insulating layer, upper conductors which have connection pads and are to be connected to corresponding pads of conductors of the semiconductor construction assemblies, so as to arrange at least one of the upper conductors on the insulating layer formed between the semiconductor construction assemblies; and cutting the insulating layer between the semiconductor construction assemblies to obtain a plurality of semiconductor devices each having at least one semiconductor construction assembly in which the connection pad of the upper conductors is formed on the insulating layer in a region outside the semiconductor construction assembly.

DETAILED DESCRIPTION OF THE INVENTION

First Embodiment

Figure 1:
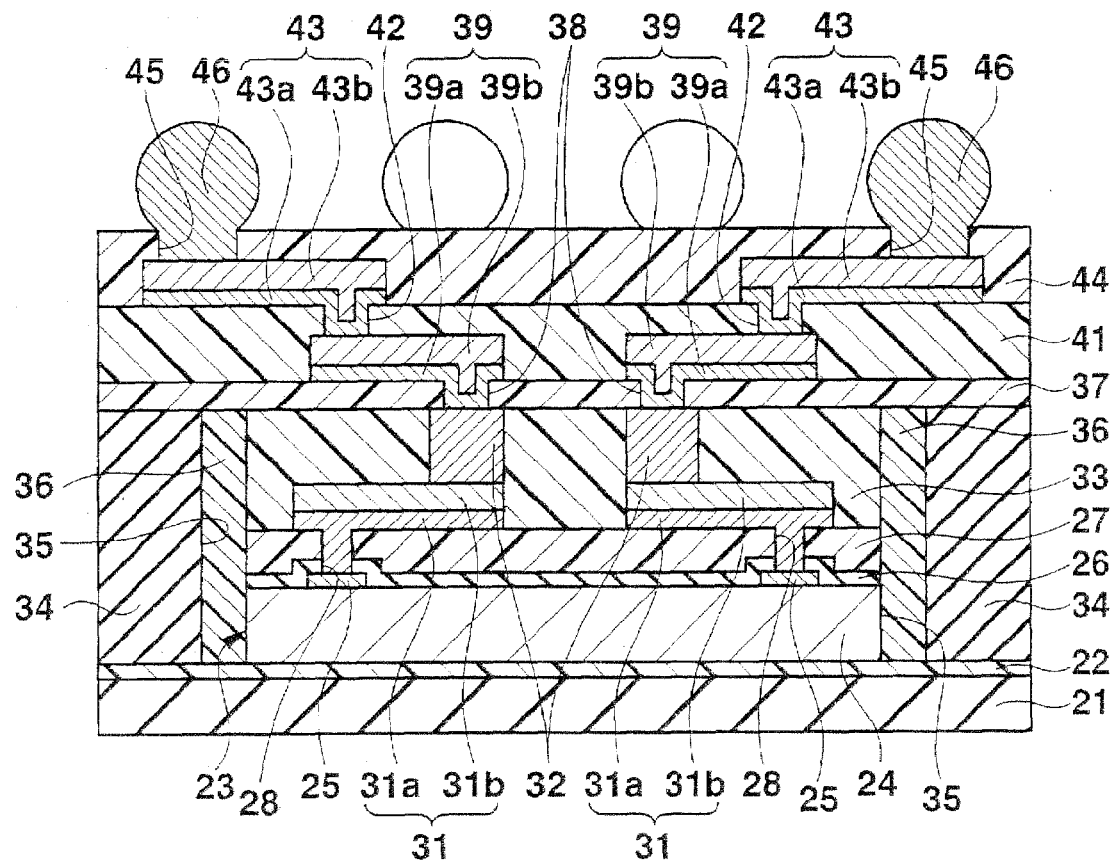
FIG. 1 is an enlarged sectional view showing a semiconductor device according to the first embodiment of the present invention.

FIG. 1 is a sectional view showing a semiconductor device according to the first embodiment of the present invention. The semiconductor device comprises a flat square base plate 21 made of silicon, glass, ceramic, a resin, a metal, or the like. An adhesive layer 22 is formed from an adhesive, pressure sensitive adhesive sheet, double-sided adhesive tape, or the like on the upper surface of the base plate 21.

The lower surface of a flat square semiconductor construction assembly 23 slightly smaller in size than the base plate 21 is adhered to the upper center surface of the adhesive layer 22. In this case, the semiconductor construction assembly 23 is called a CSP (Chip Size Package), and has a silicon substrate (semiconductor substrate) 24 which is adhered to the upper center surface of the adhesive layer 22. Integrated circuit elements which constitute a memory circuit or control circuit are formed on the upper center surface of the silicon substrate 24. A plurality of connection pads 25 which are made of aluminum or the like and connected to the integrated circuit elements are arranged around the integrated circuit. An insulating film 26 made of silicon oxide or the like is formed on the upper surface of the silicon substrate 24 except the centers of the connection pads 25. In practice, many connection pads 25 are arrayed at the periphery on the upper surface of the silicon substrate 24. For illustrative convenience, only a pair of connection pads 25 are typically shown.

A structure in which the connection pads 25 and insulating film 26 are formed on the silicon substrate 24 is generally obtained by dicing a semiconductor substrate in the wafer state into chips. In the first embodiment, however, no dicing is done in a state in which the connection pads 25 and insulating film 26 are formed on a semiconductor substrate in the wafer state. As will be described later, a semiconductor substrate in the wafer state is diced after the semiconductor construction assembly 23 having distribution wires and columnar electrodes is obtained. The structure of the semiconductor construction assembly 23 will be explained.

A protective film 27 made of polyimide or the like is formed on the insulating film 26 formed on the silicon substrate 24. The centers of the connection pads 25 are exposed via openings 28 which are formed in the insulating film 26 and protective film 27. Distribution wires 31 each comprised of a lower metal layer 31a and an upper metal layer 31b formed on the lower metal layer 31a are formed to extend from the upper surfaces of the connection pads 25 that are exposed via the openings 28 to predetermined portions on the upper surface of the protective film 27.

Columnar electrodes 32 are arranged on the upper surfaces of the connection pads of the distribution wires 31. Each columnar electrode 32 is formed of copper and 100 to 200 μm in height. A sealing film (insulating film) 33 made of an epoxy resin or the like is formed on the upper surface of the protective film 27 including the distribution wires 31 such that the upper surface of the sealing film 33 becomes flush with that of the columnar electrode 32. In this manner, the semiconductor construction assembly 23 includes the silicon substrate 24, connection pads 25, and insulating film 26, and further includes the protective film 27, distribution wires 31, columnar electrodes 32, and sealing film 33.

A square frame-like buried member 34 is adhered to the upper surface of the adhesive layer 22 around the semiconductor construction assembly 23. FIG. 1 is a sectional view in one direction. Even on a section in a direction perpendicular to FIG. 1, the buried member 34 is adhered to the side surfaces of the semiconductor construction assembly 23. In other words, the buried member 34 has a shape surrounding all the side surfaces of the semiconductor construction assembly 23. In this case, the buried member 34 can adopt the same material as that of the base plate 21, or a heat-resistant circuit board material such as a glass fiber-filled epoxy resin. The thickness of the buried member 34 is almost equal to the total thickness of the semiconductor construction assembly 23. A relatively narrow gap 35 is formed between the semiconductor construction assembly 23 and the square frame-like buried member 34 which is arranged outside the semiconductor construction assembly 23. A sealing film (insulating film) 36 made of an epoxy resin or the like is filled in the gap 35 such that the upper surface of the sealing film 36 becomes almost flush with those of the sealing film 33 and buried member 34.

A first upper insulating film 37 made of photosensitive or non-photosensitive polyimide or the like is formed on the entire upper surfaces of the semiconductor construction assembly 23, buried member 34, and sealing film 36. Openings 38 are formed at portions of the first upper insulating film 37 that correspond to the upper center surfaces of the columnar electrodes 32. First upper distribution wires 39 each comprised of a first lower metal layer 39a and a first upper metal layer 39b formed on the first lower metal layer 39a are formed on and from the upper surfaces of the columnar electrodes 32 that are exposed via the openings 38 to predetermined portions on the upper surface of the first upper insulating film 37.

A second upper insulating film 41 made of photosensitive or non-photosensitive polyimide or the like is formed on the entire upper surface of the first upper insulating film 37 including the first upper distribution wires 39. Openings 42 are formed at portions of the second upper insulating film 41 that correspond to the connection pads of the first upper distribution wires 39. Second upper distribution wires 43 each comprised of a second lower metal layer 43a and a second upper metal layer 43b formed on the second lower metal layer 43a are formed from the upper surfaces of the connection pads of the first upper distribution wires 39 that are exposed via the openings 42 to predetermined portions on the upper surface of the second upper insulating film 41.

A third upper insulating film 44 made of photosensitive or non-photosensitive polylmide or the like is formed on the entire upper surface of the second upper insulating film 41 including the second upper distribution wires 43. Openings 45 are formed at portions of the third upper insulating film 44 that correspond to the connection pads of the second upper distribution wires 43. Solder balls (projecting connection terminals) 46 are formed in and on the openings 45, and connected to the connection pads of the second upper distribution wires 43. The solder balls 46 are arrayed in a matrix on the third upper insulating film 44.

As described above, the base plate 21 is slightly larger in size than the semiconductor construction assembly 23 in order to set the arrangement region of the solder balls 46 slightly larger than the size of the semiconductor construction assembly 23 in accordance with an increase in the number of connection pads 25 on the silicon substrate 24 and set the size and arrangement interval of the connection pads 25 larger than those of the columnar electrodes 32.

The connection pads (portions in the openings 45 of the third upper insulating film 44) of the second upper distribution wires 43 arrayed in a matrix are arranged not only in a region corresponding to the semiconductor construction assembly 23, but also in the region of the buried member 34 around the semiconductor construction assembly 23 and the region of the sealing film 36 filled in the gap 35 between the semiconductor construction assembly 23 and the buried member 34. Of the solder balls 46 arrayed in a matrix, at least the outermost solder balls 46 are arranged around the semiconductor construction assembly 23.

In this case, as a modification, all the connection pads of the second upper distribution wires 43 may be arranged around the semiconductor construction assembly 23. The upper distribution wire can be formed from only one layer, i.e., the first upper distribution wire 39, and at least the outermost connection pads can be arranged around the semiconductor construction assembly 23.

In the semiconductor device, the sealing film 36 and buried member 34 are arranged around the semiconductor construction assembly 23 in which not only the connection pads 25 and insulating film 26, but also the protective film 27, distribution wires 31, columnar electrodes 32, sealing film 33, and the like are formed on the silicon substrate 24. At least the first upper insulating film 37, and the first upper distribution wires 39 which are connected to the columnar electrodes 32 via the openings 38 formed in the first upper insulating film 37 are formed on the upper surface of the semiconductor construction assembly 23.

In this case, the relatively narrow gap 35 is formed between the semiconductor construction assembly 23 and the square frame-like buried member 34 around the semiconductor construction assembly 23. The sealing film 36 made of an epoxy resin or the like is filled in the gap 35. Compared to the absence of any buried member 34, the amount of sealing film 36 can be reduced by the volume of the buried member 34. As a result, the stress by shrinkage in curing the sealing film 36 made of an epoxy resin or the like can be reduced, preventing warpage of the base plate 21.

Figure 2:
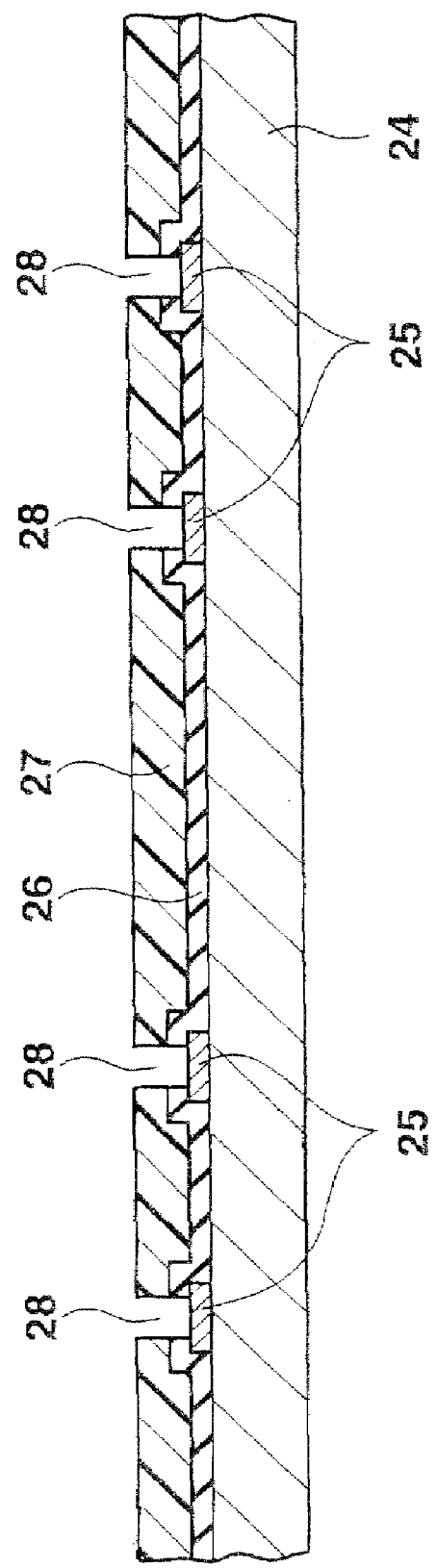
FIG. 2 is an enlarged sectional view showing a structure prepared in advance in an example of a method of manufacturing the semiconductor device shown in FIG. 1.

An example of a semiconductor device manufacturing method will be explained with reference to FIGS. 2 to 18. An example of a method of manufacturing the semiconductor construction assembly 23 will be described with reference to FIGS. 2 to 8. As shown in FIG. 2, a structure in which aluminum connection pads 25, a silicon oxide insulating film 26, and a polyimide protective film 27 are formed on a silicon substrate (semiconductor substrate) 24 in the wafer state, and the centers of the connection pads 25 are exposed via openings 28 formed in the insulating film 26 and protective film 27 is prepared.

Figure 3:
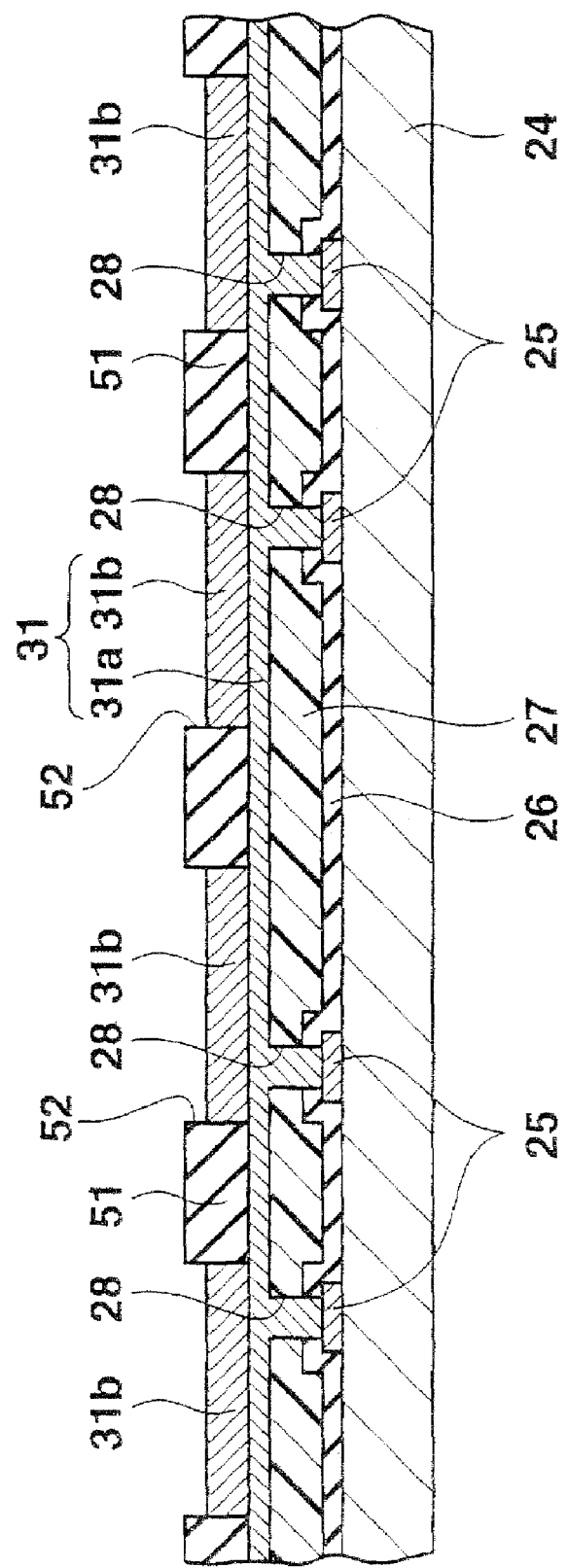
FIG. 3 is an enlarged sectional view showing a manufacturing step subsequent to FIG. 2.

As shown in FIG. 3, a lower metal layer 31a is formed on the entire upper surface of the protective film 27 including the upper surfaces of the connection pads 25 that are exposed via the openings 28. In this case, the lower metal layer 31a is comprised of only a copper layer formed by electroless plating. However, the lower metal layer 31a may be comprised of only a copper layer formed by sputtering, or a copper layer formed by sputtering on a thin film layer of titanium or the like formed by sputtering. This also applies to the lower metal layers 39a and 43a of upper layers (to be described later).

A plating resist film 51 is formed and patterned on the upper surface of the lower metal layer 31a. Thus, openings 52 are formed in the plating resist film 51 at portions corresponding to formation regions of distribution wires 31. Copper is electroplated using the lower metal layer 31a as a plating current path, thereby forming upper metal layers 31b on the upper surface of the lower metal layer 31a in the openings 52 of the plating resist film 51. After that, the plating resist film 51 is peeled.

Figure 4:
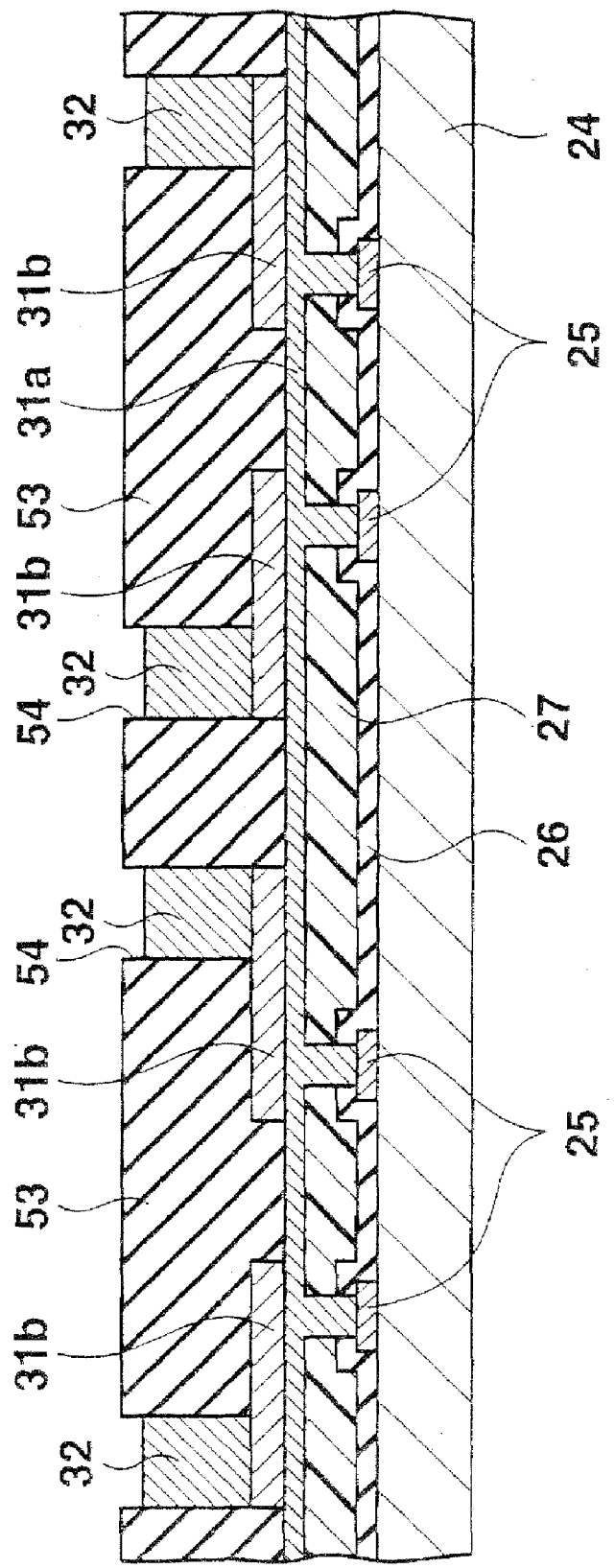
FIG. 4 is an enlarged sectional view showing a manufacturing step subsequent to FIG. 3.

As shown in FIG. 4, a plating resist film 53 is formed and patterned on the upper surface of the lower metal layer 31a including the upper metal layer 31b. Thus, openings 54 are formed in the plating resist film 53 at portions corresponding to formation regions of columnar electrodes 32. Copper is electroplated using the lower metal layer 31a as a plating current path, forming the columnar electrodes 32 on the upper surfaces of the connection pads of the upper metal layers 31b in the openings 54 of the plating resist film 53.

Figure 5:
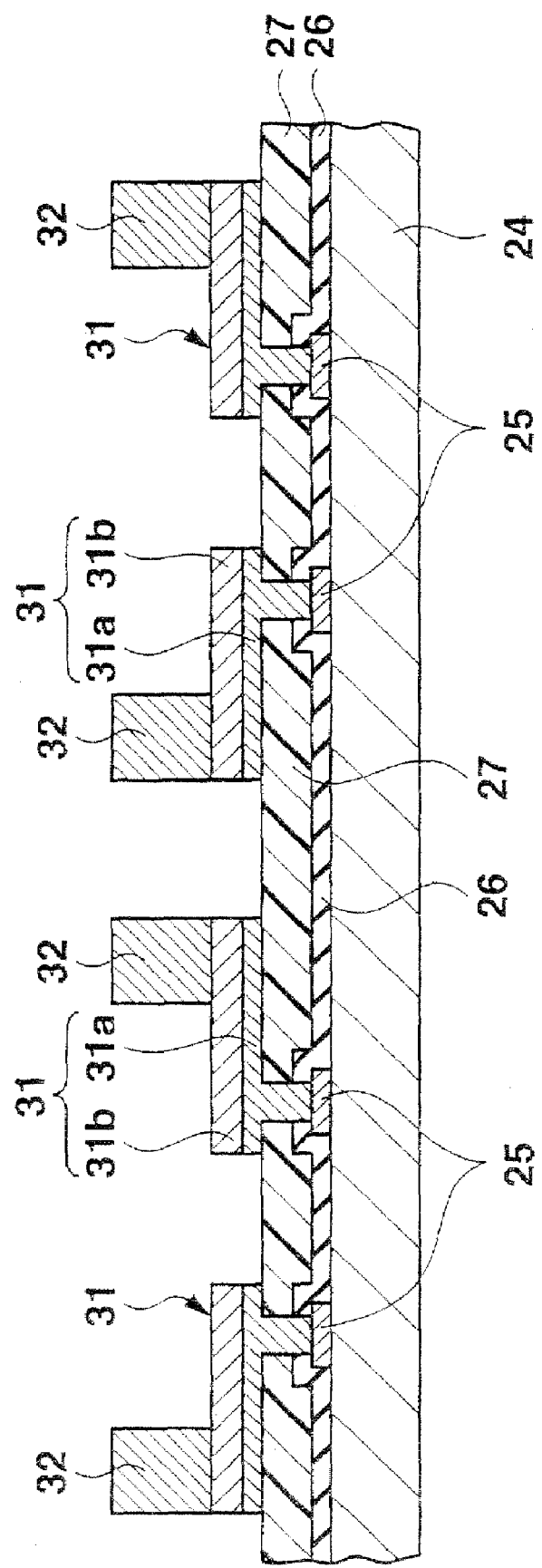
FIG. 5 is an enlarged sectional view showing a manufacturing step subsequent to FIG. 4.

The plating resist film 53 is peeled, and unnecessary portions of the lower metal layer 31a are etched away, using the columnar electrodes 32 and upper metal layers 31b as a mask. As shown in FIG. 5, the lower metal layers 31a remain only below the upper metal layers 31b. The remaining lower metal layers 31a and the upper metal layers 31b formed on the entire upper surfaces of the lower metal layers 31a form distribution wires 31.

Figure 6:
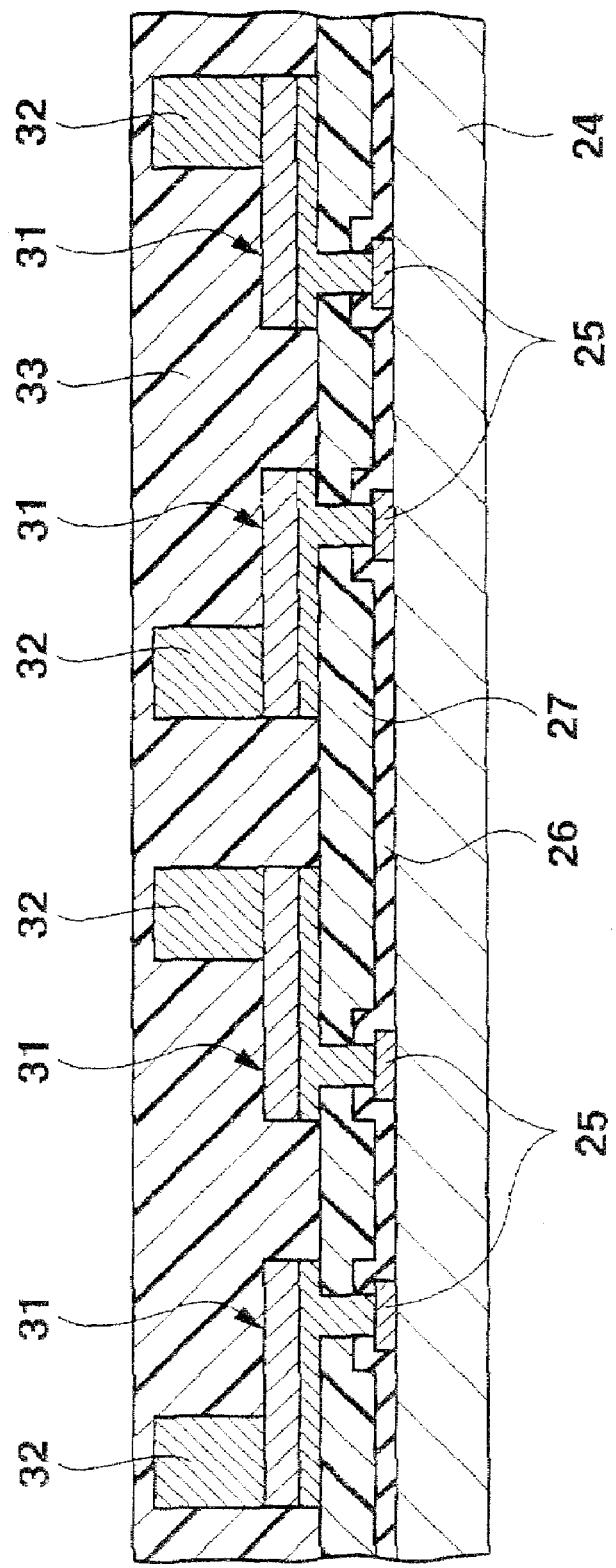
FIG. 6 is an enlarged sectional view showing a manufacturing step subsequent to FIG. 5.
Figure 7:
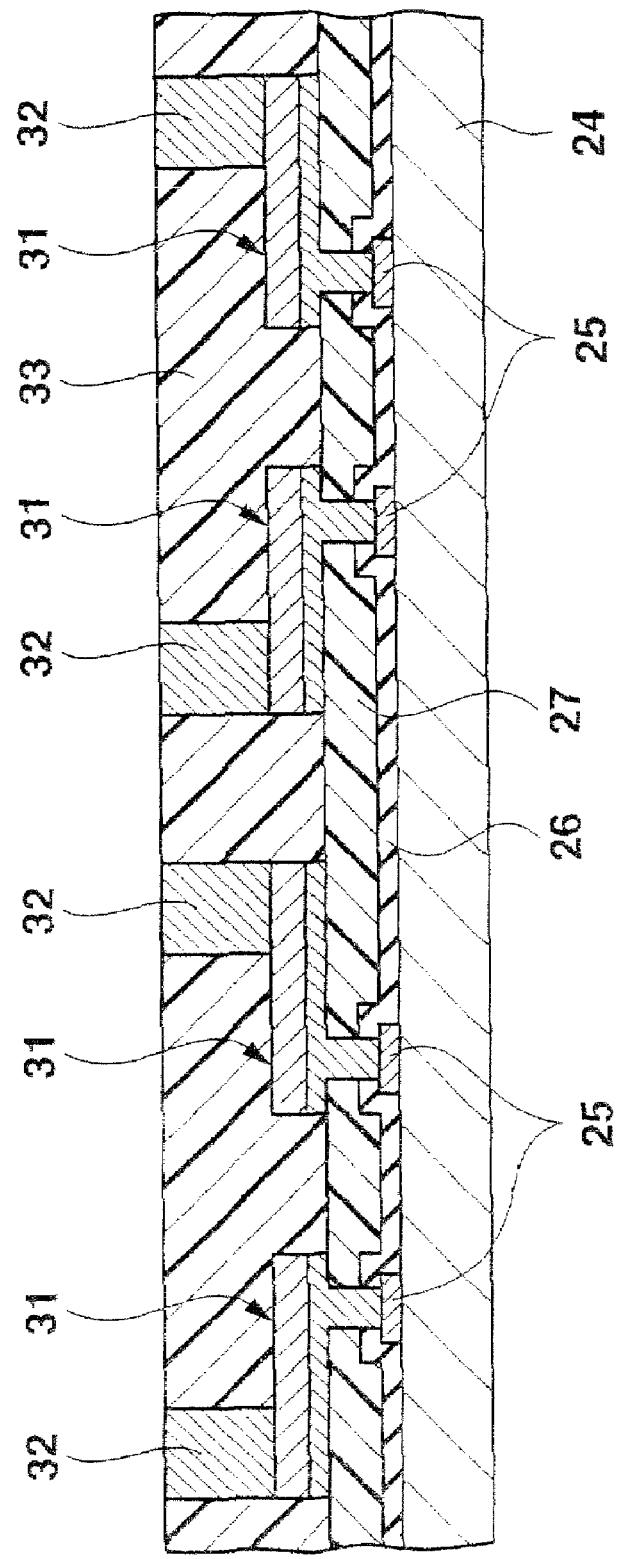
FIG. 7 is an enlarged sectional view showing a manufacturing step subsequent to FIG. 6.
Figure 8:
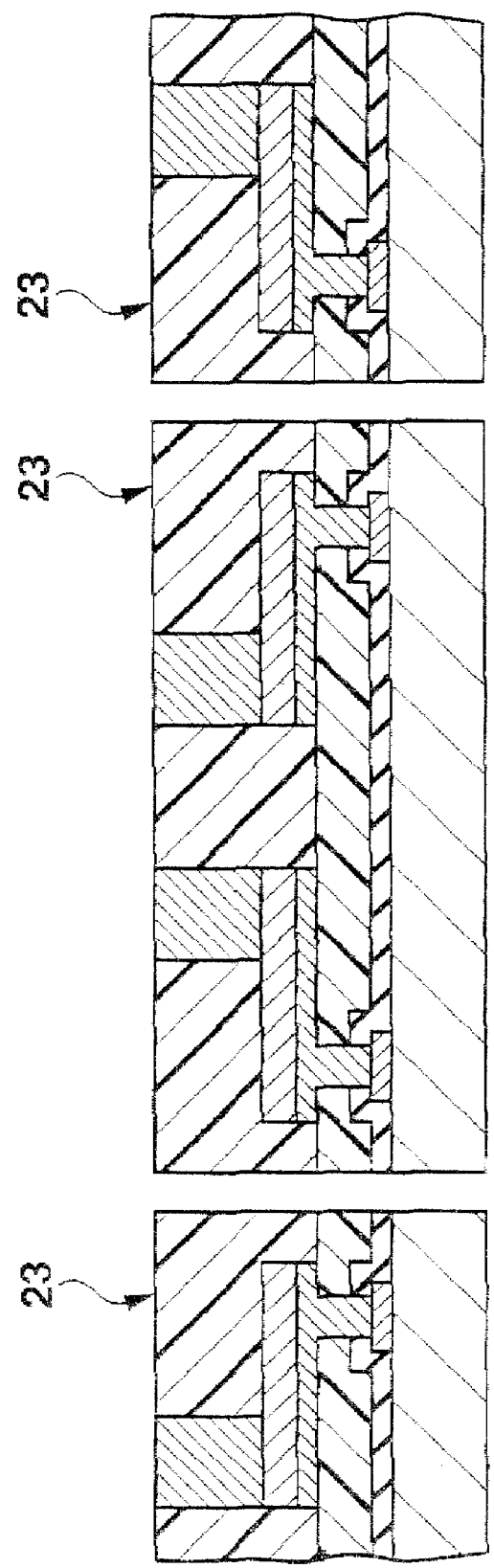
FIG. 8 is an enlarged sectional view showing a manufacturing step subsequent to FIG. 7.

As shown in FIG. 6, a sealing film 33 made of an epoxy resin is formed on the entire upper surface of the protective film 27 including the columnar electrodes 32 and distribution wires 31 such that the thickness of the sealing film 33 becomes larger than the height of the columnar electrode 32. In this state, the upper surface of the columnar electrode 32 is covered with the sealing film 33. The upper surfaces of the sealing film 33 and columnar electrodes 32 are properly polished to expose the upper surfaces of the columnar electrodes 32, as shown in FIG. 7. Thus, the upper surface of the sealing film 33 and the exposed upper surfaces of the columnar electrodes 32 are planarized. As shown in FIG. 8, a plurality of semiconductor construction assemblies 23 shown in FIG. 1 are obtained after a dicing step of the resultant assembly.

The columnar electrodes 32 formed by electroplating may be inferably varied in height. Thus, the upper surfaces of the columnar electrodes 32 are polished as described above, eliminating variations in height and making the heights of the columnar electrodes 32 equal to each other. Polishing of the upper surfaces of the copper columnar electrodes 32 uses an expensive, high-precision grinder.

Figure 9:
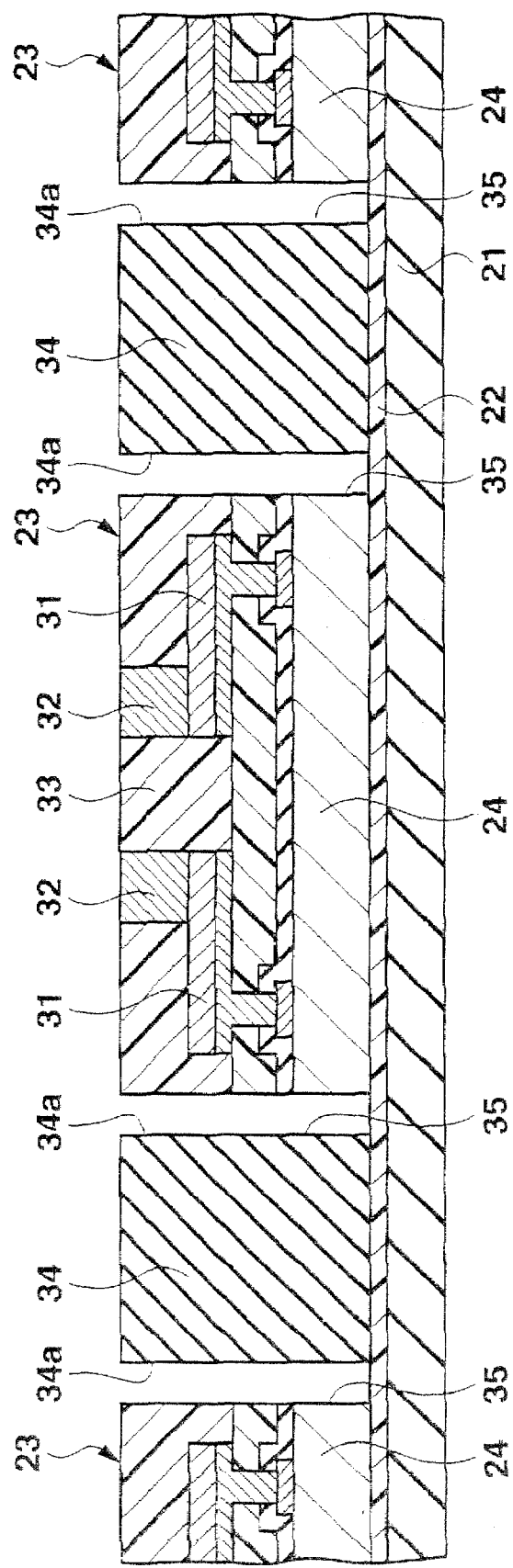
FIG. 9 is an enlarged sectional view showing a manufacturing step subsequent to FIG. 8.

An example of manufacturing the semiconductor device shown in FIG. 1 by using the semiconductor construction assembly 23 obtained in this manner will be described. As shown in FIG. 9, a structure in which an adhesive layer 22 is formed on the entire upper surface of a base plate 21 capable of forming a plurality of base plates 21 shown in FIG. 1 is prepared.

The lower surface of a grid-like buried member 34 is adhered to a predetermined portion on the upper surface of the adhesive layer 22. For example, the grid-like buried member 34 is obtained by forming by die cutting, etching, or the like a plurality of square openings 34a in a sheet-like buried member 34 made of silicon, glass, ceramic, a resin, a metal, or the like. The grid-like buried member 34 may also be formed by spot facing by adhering the sheet-like buried member 34 to the entire upper surface of the adhesive layer 22.

The lower surface of the silicon substrate 24 of each semiconductor construction assembly 23 is adhered to the upper center surface of the adhesive layer 22 in each opening 34a of the grid-like buried member 34. In this state, the upper surfaces of the buried member 34 and semiconductor construction assembly 23 are almost flush with each other. A relatively narrow gap 35 is formed between the semiconductor construction assembly 23 and the square frame-like buried member 34 around the semiconductor construction assembly 23.

Figure 10:
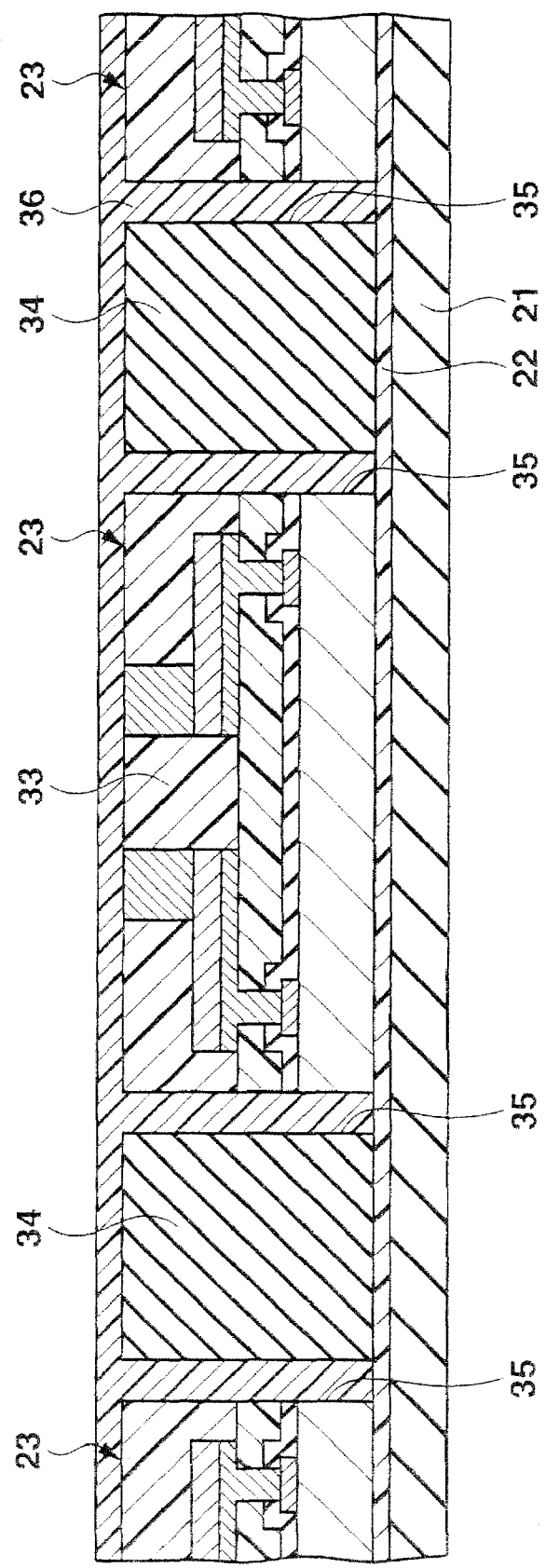
FIG. 10 is an enlarged sectional view showing a manufacturing step subsequent to FIG. 9.
Figure 11:
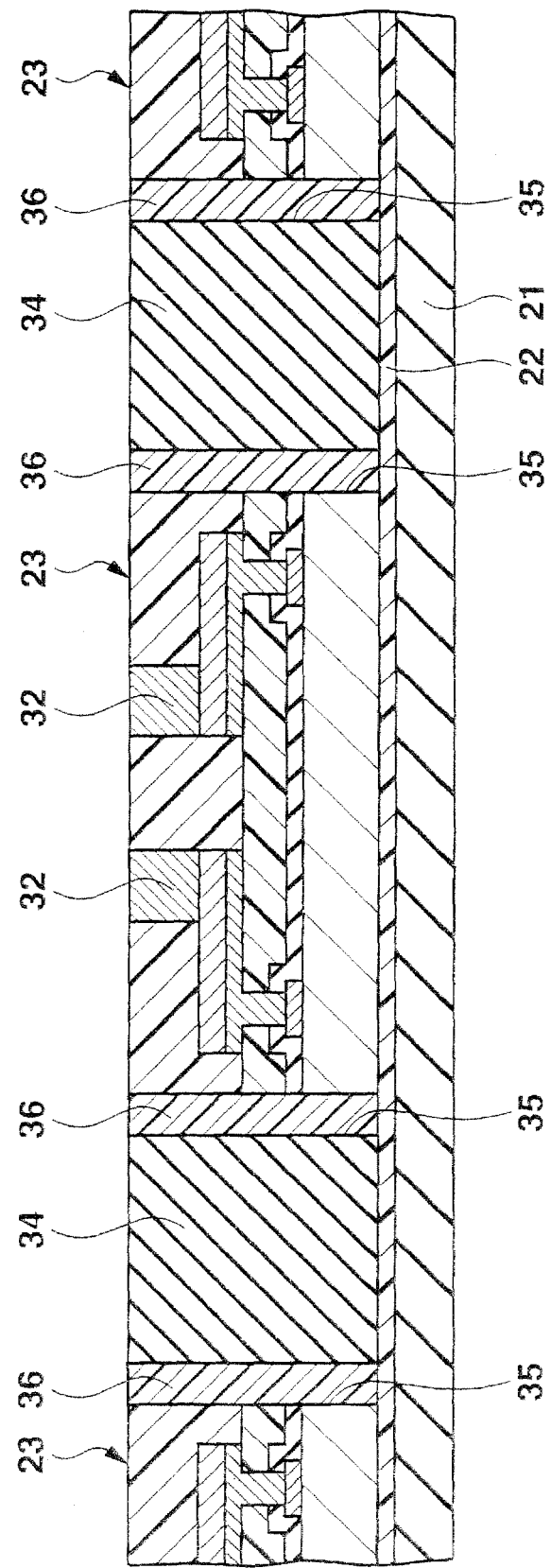
FIG. 11 is an enlarged sectional view showing a manufacturing step subsequent to FIG. 10.

As shown in FIG. 10, a sealing film 36 made of an epoxy resin or the like is applied by printing or the like to the entire upper surfaces of the semiconductor construction assembly 23 and buried member 34 including the inside of the gap 35. In this state, the upper surfaces of the semiconductor construction assembly 23 and buried member 34 are covered with the sealing film 36. The uncured sealing film 36 which covers the upper surfaces of the semiconductor construction assembly 23 and buried member 34 is removed by buff polishing. Consequently, as shown in FIG. 11, the upper surfaces of the semiconductor construction assembly 23 and buried member 34 are exposed. In addition, the upper surface of the portion of the sealing film 36 in the gap 35 is made almost flush with those of the semiconductor construction assembly 23 and buried member 34, substantially planarizing the entire upper surface. Thereafter, the sealing film 36 is set.

This polishing can use a low-cost, low-precision buff because the upper surface of the semiconductor construction assembly 23, i.e., the upper surface of the copper columnar electrode 32 is not polished, but the uncured sealing film 36 covering the upper surfaces of the semiconductor construction assembly 23 and buried member 34 is removed. In order to prevent excessive polishing of the uncured sealing film 36 in the gap 35 and reduce cure shrinkage of the sealing film 36, the coated sealing film 36 may be provisionally cured by ultraviolet irradiation or heating. If the flatness is not enough due to large cure shrinkage of the sealing film 36 in the gap 35, application and polishing of the sealing resin may be repeated.

As another example of polishing, a low-cost, low-precision endless polishing belt may be used. After a part of the endless polishing belt may be formed flat, the uncured or provisionally cured sealing film 36 which covers the upper surfaces of the semiconductor construction assembly 23 and buried member 34 may be planarized and polished with the flat portion of the polishing belt not so as to exceed the upper surfaces of the semiconductor construction assembly 23 and silicon substrate 24 as a polishing limit surface.

The relatively narrow gap 35 is formed between the semiconductor construction assembly 23 and the square frame-like buried member 34 around the semiconductor construction assembly 23. The epoxy resin sealing film 36 is filled in the gap 35. Compared to the absence of any buried member 34, the amount of sealing film 36 can be reduced by the volume of the buried member 34. As a result, the stress by shrinkage in curing the epoxy resin sealing film 36 can be reduced, thus preventing warpage of the base plate 21.

Figure 12:
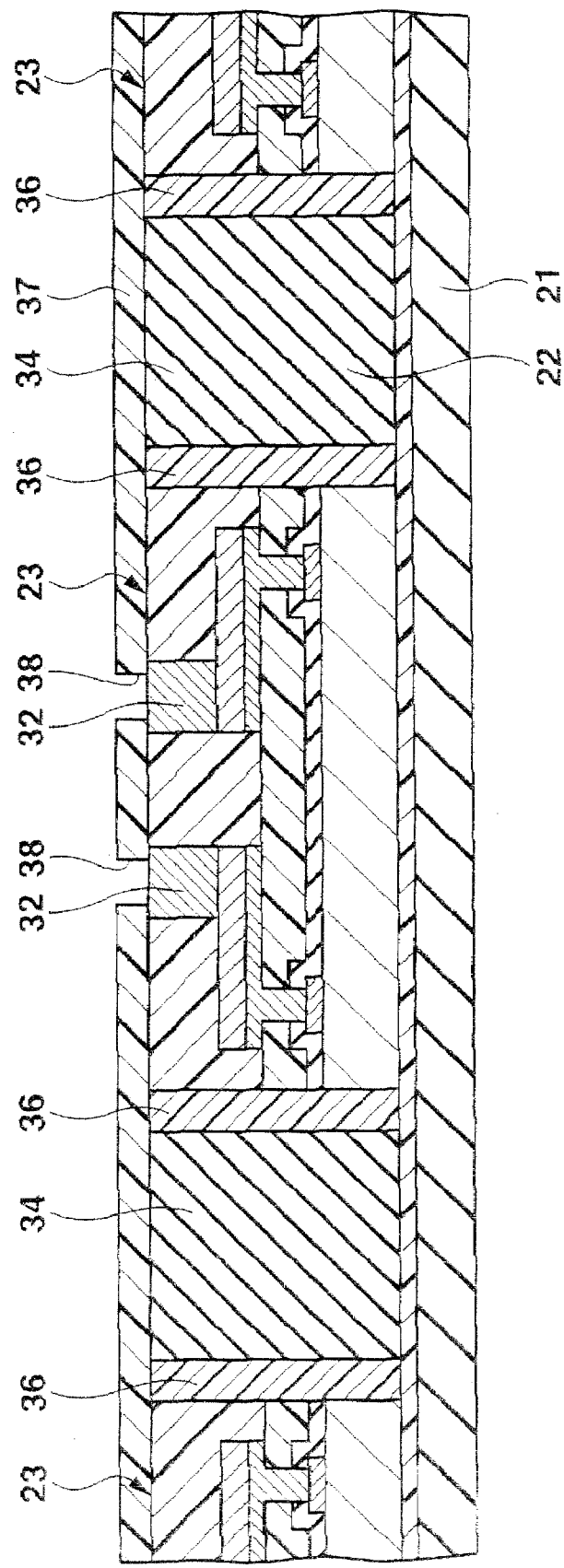
FIG. 12 is an enlarged sectional view showing a manufacturing step subsequent to FIG. 11.

At the end of the polishing step shown in FIG. 11, a first upper insulating film 37 is formed on the entire upper surfaces of the semiconductor construction assembly 23, buried member 34, and sealing film 36 which are almost flush with each other, as shown in FIG. 12. The first upper insulating film 37 is made of photosensitive polyimide, photosensitive polybenzoxazole, a photosensitive epoxy resin, a photosensitive novolac resin, or a photosensitive acrylic spiro-ortho-ester resin, and formed into a dry film. The dry film is laminated by a laminator to form the first upper insulating film 37. This also applies to the second and third upper insulating films 41 and 44 (to be described later). The first upper insulating film 37 may be formed by coating such as printing.

Figure 13:
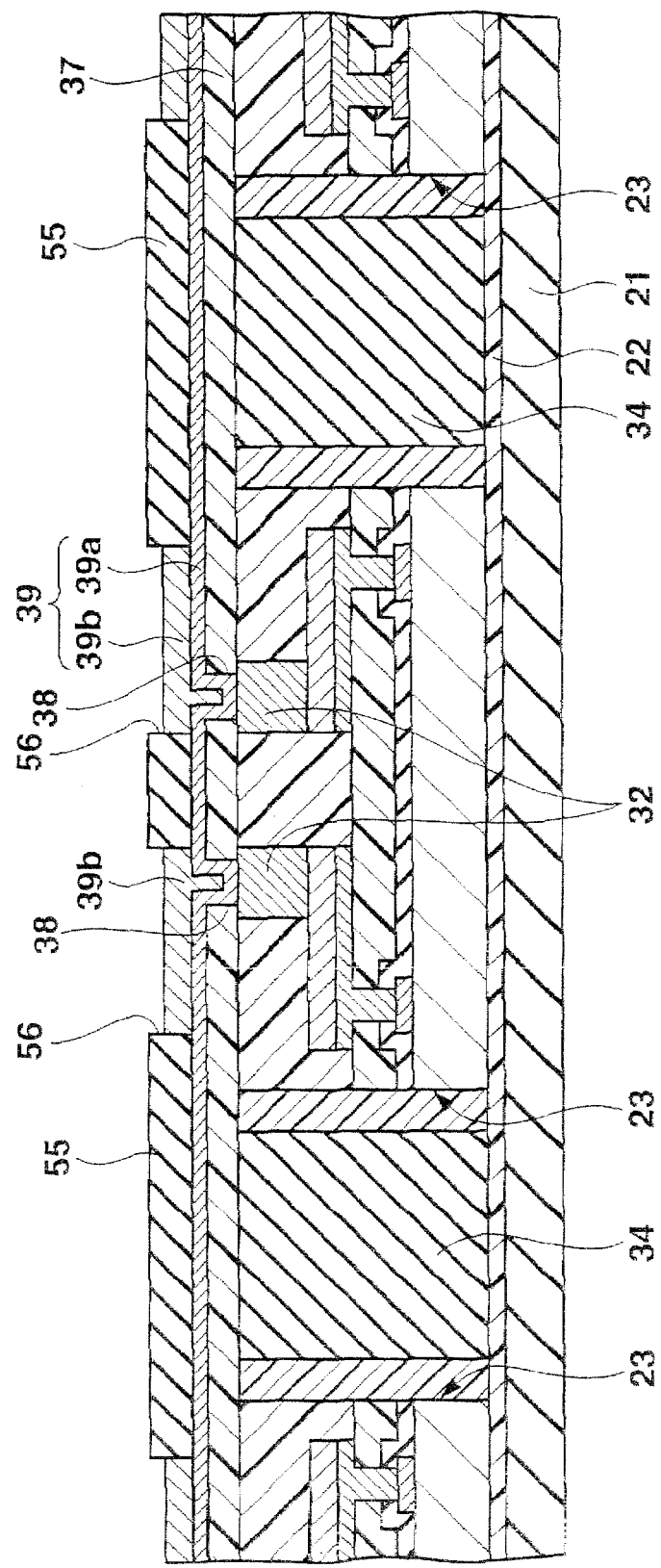
FIG. 13 is an enlarged sectional view showing a manufacturing step subsequent to FIG. 12.

Openings 38 are formed by photolithography at portions of the first upper insulating film 37 that correspond to the upper center surfaces of the columnar electrodes 32. As shown in FIG. 13, a first lower metal layer 39a is formed on the entire upper surface of the first upper insulating film 37 including the upper surfaces of the columnar electrodes 32 that are exposed via the openings 38. A plating resist film 55 is formed and patterned on the upper surface of the first lower metal layer 39a. Thus, openings 56 are formed in the plating resist film 55 at portions corresponding to the formation regions of the first upper distribution wires 39. Copper is electroplated using the first lower metal layer 39a as a plating current path, thereby forming first upper metal layers 39b on the upper surfaces of the portions of the first lower metal layer 39a in the openings 56 of the plating resist film 55.

Figure 14:
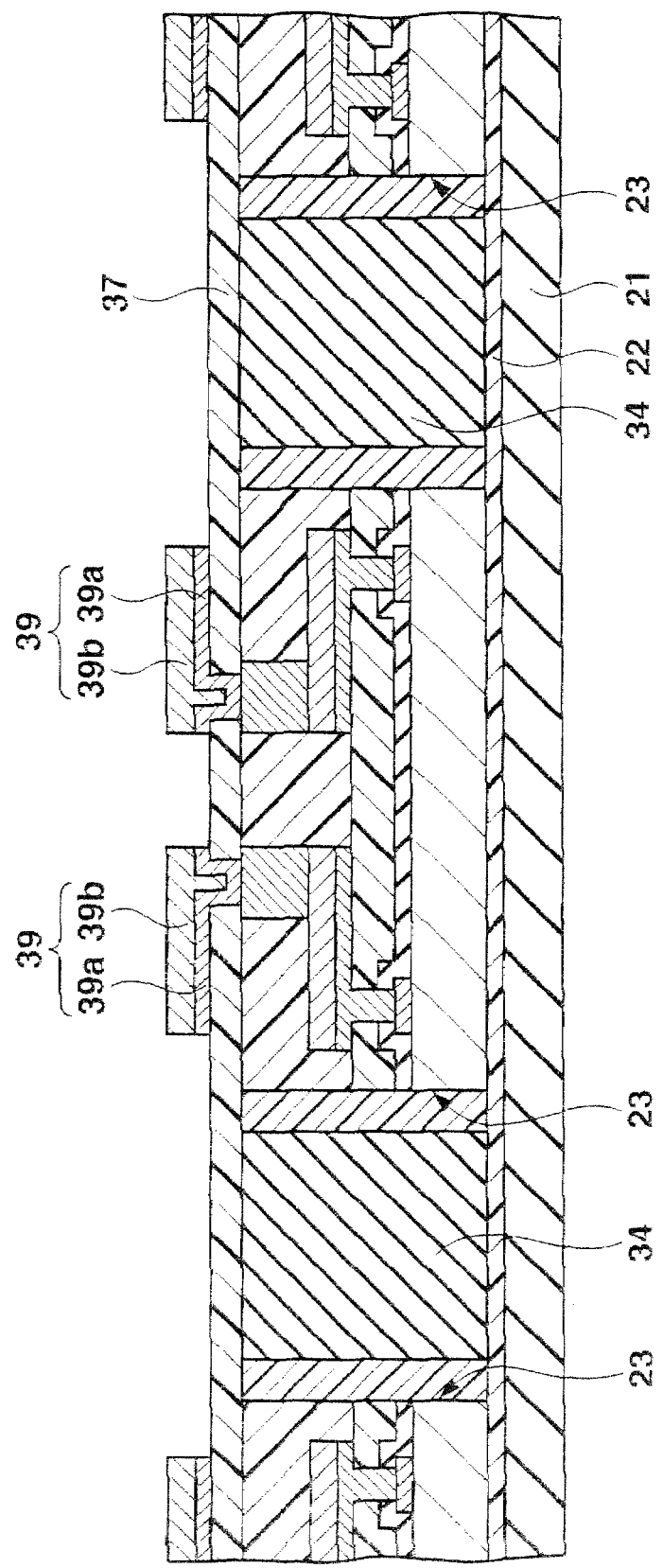
FIG. 14 is an enlarged sectional view showing a manufacturing step subsequent to FIG. 13.

Then, the plating resist film 55 is peeled, and unnecessary portions of the first lower metal layer 39a are etched away using the first upper metal layers 39b as a mask. As shown in FIG. 14, the portions of the first lower metal layers 39 remain only below the first upper metal layers 39b. The remaining first lower metal layers 39a and the first upper metal layers 39b formed on the entire upper surfaces of the first lower metal layers 39a form first upper distribution wires 39.

Figure 15:
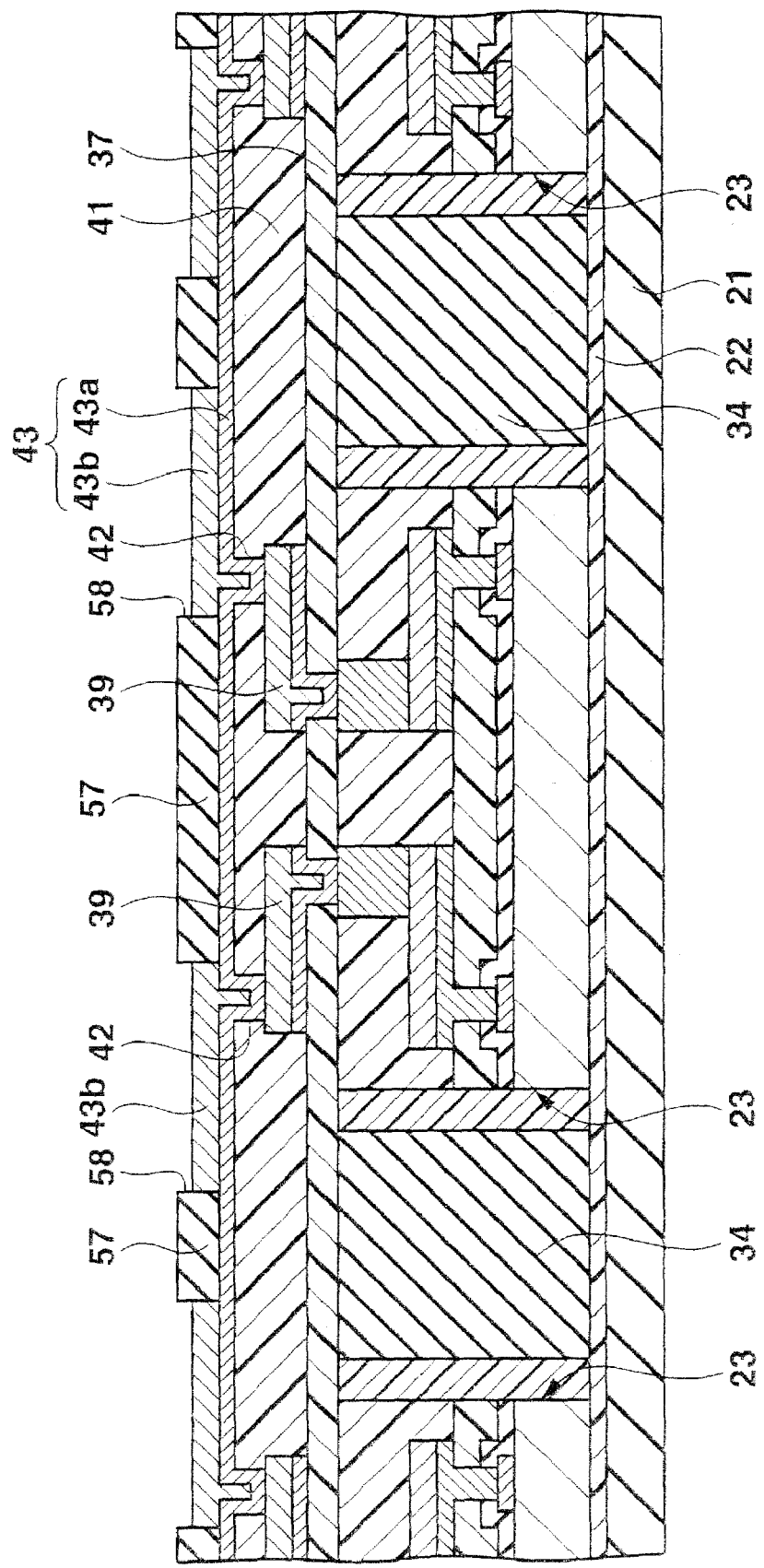
FIG. 15 is an enlarged sectional view showing a manufacturing step subsequent to FIG. 14.

As shown in FIG. 15, a second upper insulating film 41 made of photosensitive polyimide or the like is formed and patterned on the entire upper surface of the first upper insulating film 37 including the first upper distribution wires 39. Thus, openings 42 are formed at portions of the second upper insulating film 41 that correspond to the connection pads of the first upper distribution wires 39. A second lower metal layer 43a is formed by electroless plating on the entire upper surface of the second upper insulating film 41 including the connection pads of the first upper distribution wires 39 that are exposed via the openings 42.

A plating resist film 57 is formed and patterned on the upper surface of the second lower metal layer 43a. In this case, openings 58 are formed in the plating resist film 57 at portions corresponding to the formation regions of the second upper distribution wires 43. Copper is electroplated using the second lower metal layer 43a as a plating current path, forming second upper metal layers 43b on the upper surfaces of the second lower metal layers 43a in the openings 58 of the plating resist film 57.

Figure 16:
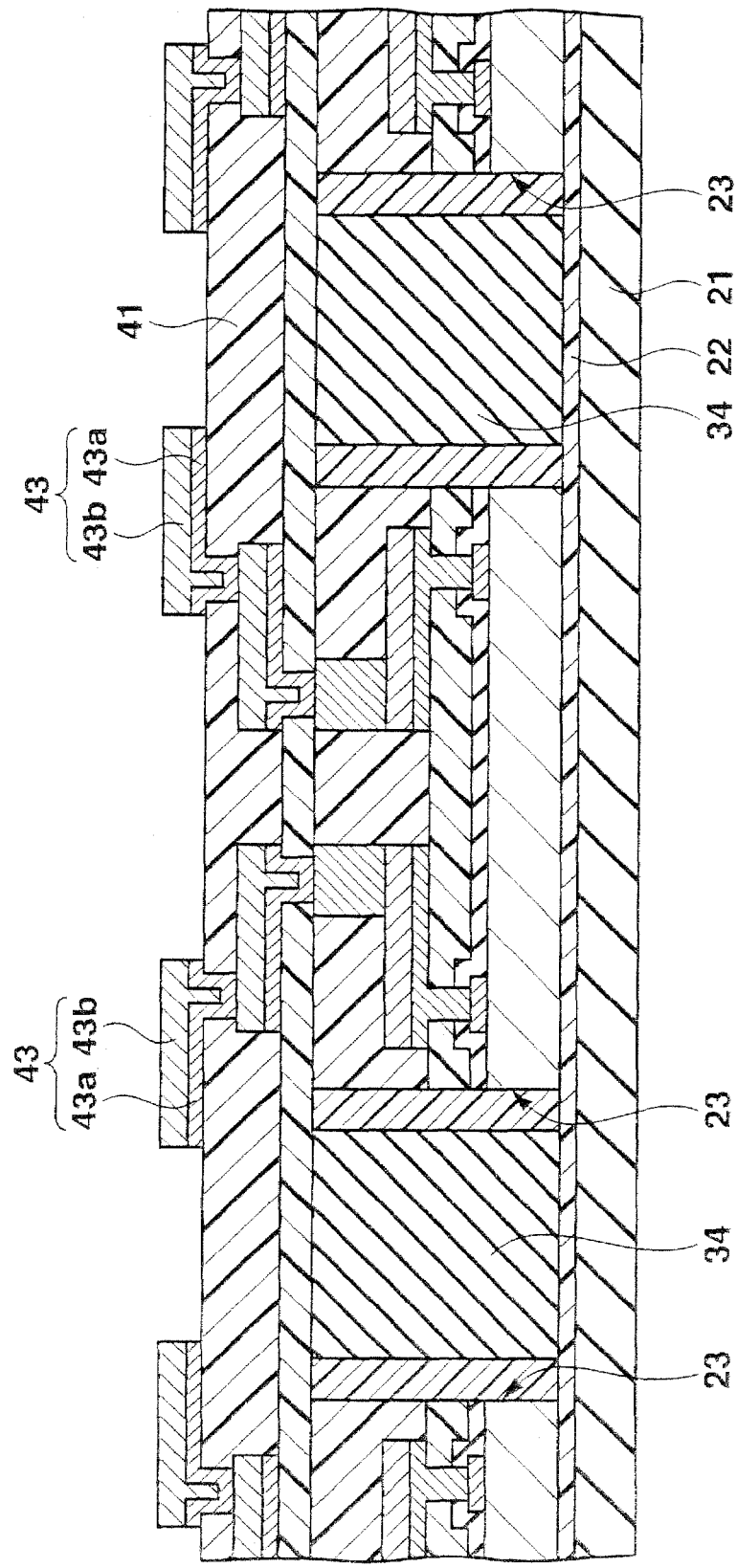
FIG. 16 is an enlarged sectional view showing a manufacturing step subsequent to FIG. 15.

The plating resist film 57 is peeled, and unnecessary portions of the second lower metal layer 43a are etched away using the second upper metal layers 43b as a mask. As shown in FIG. 16, the portions of the second lower metal layers 43a remain only below the second upper metal layers 43b. The remaining second lower metal layer 43a and the second upper metal layer 43b formed on the upper surfaces of the second lower metal layer 43a form second upper distribution wires 43.

Figure 17:
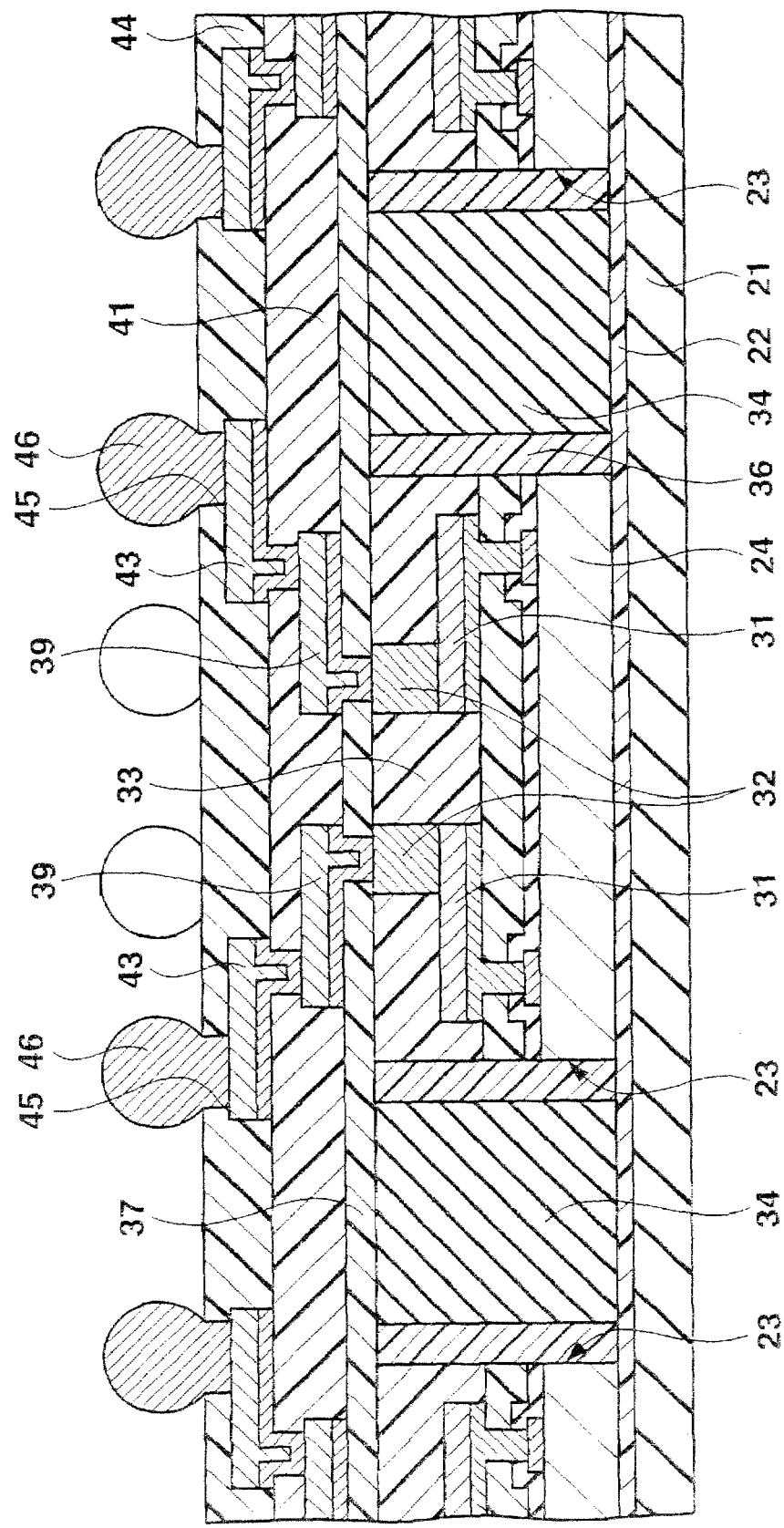
FIG. 17 is an enlarged sectional view showing a manufacturing step subsequent to FIG. 16.

As shown in FIG. 17, a third upper insulating film 44 made of photosensitive polyimide or the like is formed and patterned on the entire upper surface of the second upper insulating film 41 including the second upper distribution wires 43. Openings 45 are formed at portions of the third upper insulating film 44 that correspond to the connection pads of the second upper distribution wires 43. Solder balls 46 are formed in and extended from the openings 45, and connected to the connection pads of the second upper distribution wires 43.

Figure 18:
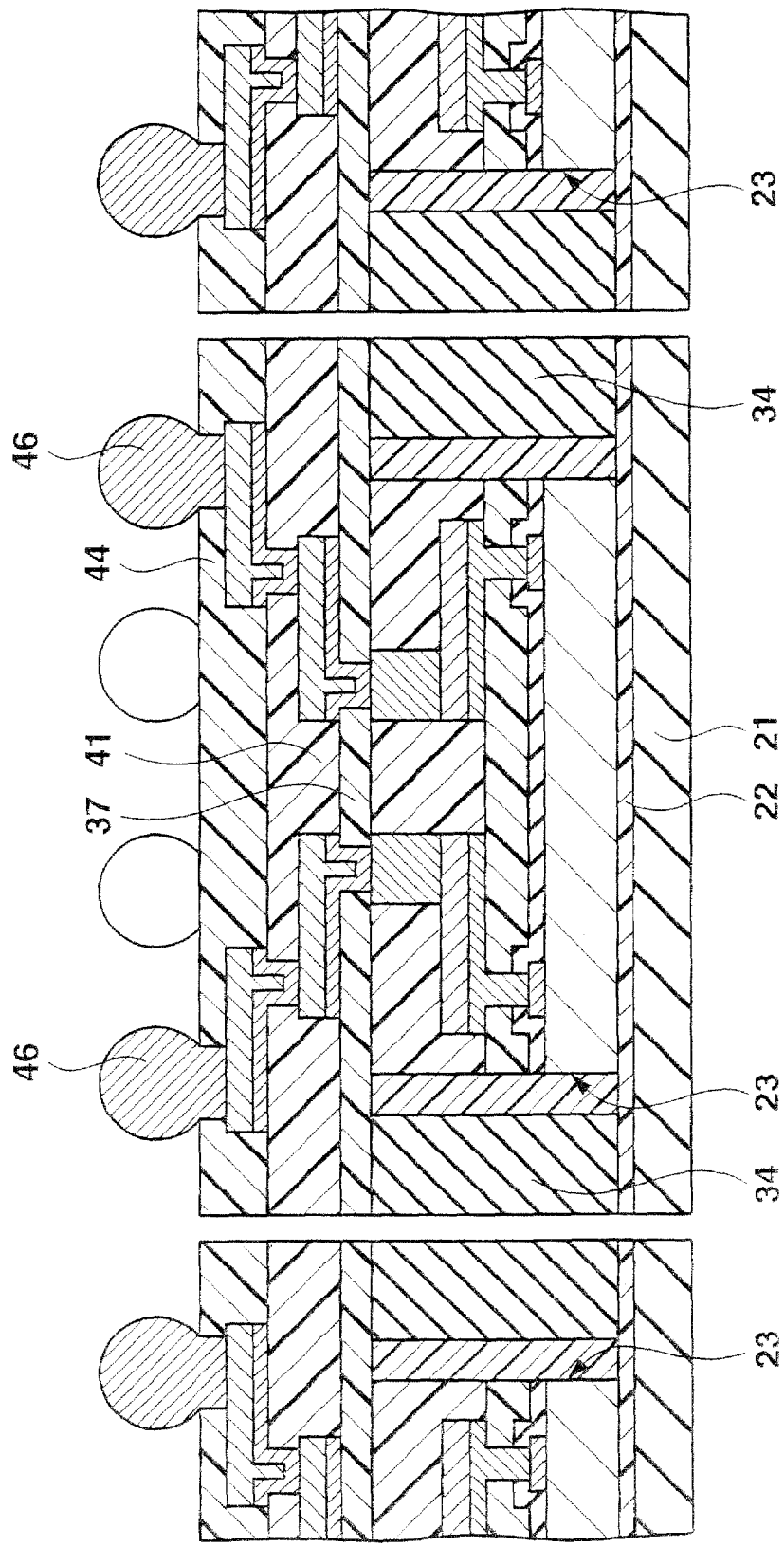
FIG. 18 is an enlarged sectional view showing a manufacturing step subsequent to FIG. 17.

As shown in FIG. 18, the three insulating films 44, 41, and 37, the buried member 34, the adhesive layer 22, and the base plate 21 are cut between adjacent semiconductor construction assemblies 23 to obtain a plurality of semiconductor devices shown in FIG. 1.

In the obtained semiconductor device, the first lower metal layer 39a and first upper metal layer 39b which are connected to the columnar electrode 32 of the semiconductor construction assembly 23 are formed by electroless plating (or sputtering) and electroplating. The second lower metal layer 43a and second upper metal layer 43b which are connected to the connection pad of the first upper distribution wire 39 are formed by ejectroless plating (or sputtering) and electroplating. The columnar electrode 32 of the semiconductor construction assembly 23 and the first upper distribution wire 39, and the first upper distribution wire 39 and the second upper distribution wire 43 can be electrically connected without bonding.

In the above manufacturing method, the grid-like buried member 34 and a plurality of semiconductor construction assemblies 23 are arranged and adhered to the adhesive layer 22 on the base plate 21. The sealing film 36, the first, second, and third upper insulating films 37, 41, and 44, the first and second lower metal layers 39a and 43a, the first and second upper metal layers 39b and 43b, and the solder balls 46 are formed at once for a plurality of semiconductor construction assemblies 23. After that, the resultant structure is cut into a plurality of semiconductor devices. This can simplify the manufacturing process.

A plurality of semiconductor construction assemblies 23 can be transferred together with the base plate 21, which can also simplify the manufacturing process. If the outer size of the base plate 21 is set constant, the transfer system can be shared regardless of the outer size of a semiconductor device to be manufactured.

According to the above manufacturing method, as shown in FIG. 9, a CSP type semiconductor construction assembly 23 having the distribution wire 31 and columnar electrode 32 is adhered onto the adhesive layer 22. The cost can be reduced in comparison with a case wherein a general semiconductor chip prepared by forming the connection pad 25 and insulating film 26 on the silicon substrate 24 is adhered onto the adhesive layer 22, and a distribution wire and columnar electrode are formed on a sealing film around the semiconductor chip.

For example, when the base plate 21 before cutting is almost circular with a predetermined size, like a silicon wafer, formation of a distribution wire and columnar electrode on, e.g., a sealing film around a semiconductor chip adhered onto the adhesive layer 22 increases the processing area. In other words, the number of processing chips per operation decreases due to low-density processing, resulting in a low throughput and high cost.

To the contrary, in the above manufacturing method, a semiconductor device is built up after the CSP type semiconductor construction assembly 23 having the distribution wire 31 and columnar electrode 32 is adhered onto the adhesive layer 22. Although the number of processes increases, the efficiency is high because of high-density processing up to formation of the columnar electrode 32. Even considering an increase in the number of processes, the total cost can be reduced.

In the first embodiment, the solder balls 46 are arrayed in a matrix corresponding to the entire semiconductor construction assemblies 23 and buried member 34. The solder balls 46 may be arranged in only a region above the buried member 34 around the semiconductor construction assembly 23. In this case, the solder balls 46 may be arranged not entirely around the semiconductor construction assembly 23 but on only one or three sides out of the four sides of the semiconductor construction assembly 23. In this case, the buried member 34 need not be shaped into a square frame, and may be arranged on only sides on which the solder balls 46 are arranged. The buried member 34 may be formed by printing, transfer, molding, or the like, or may be formed after the semiconductor construction assemblies 23 are arrayed on the base plate 21.

Figure 19:
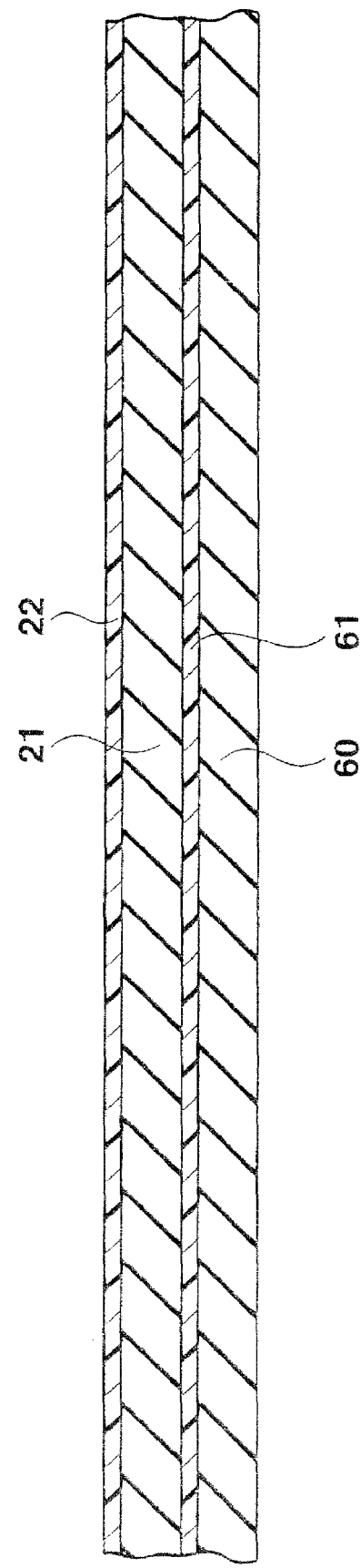
FIG. 19 is an enlarged sectional view showing a base member prepared in advance in another example of the method of manufacturing the semiconductor device shown in FIG. 1.

Another example of the method of manufacturing the semiconductor device shown in FIG. 1 will be explained. As shown in FIG. 19, a structure in which an adhesive layer 61 formed from an ultraviolet curing pressure sensitive adhesive sheet or the like is adhered onto the entire upper surface of another base plate 60 formed from an ultraviolet transmission transparent resin plate, glass plate, or the like, and the base plate 21 and adhesive layer 22 are adhered onto the upper surface of the adhesive layer 61 is prepared.

Figure 20:
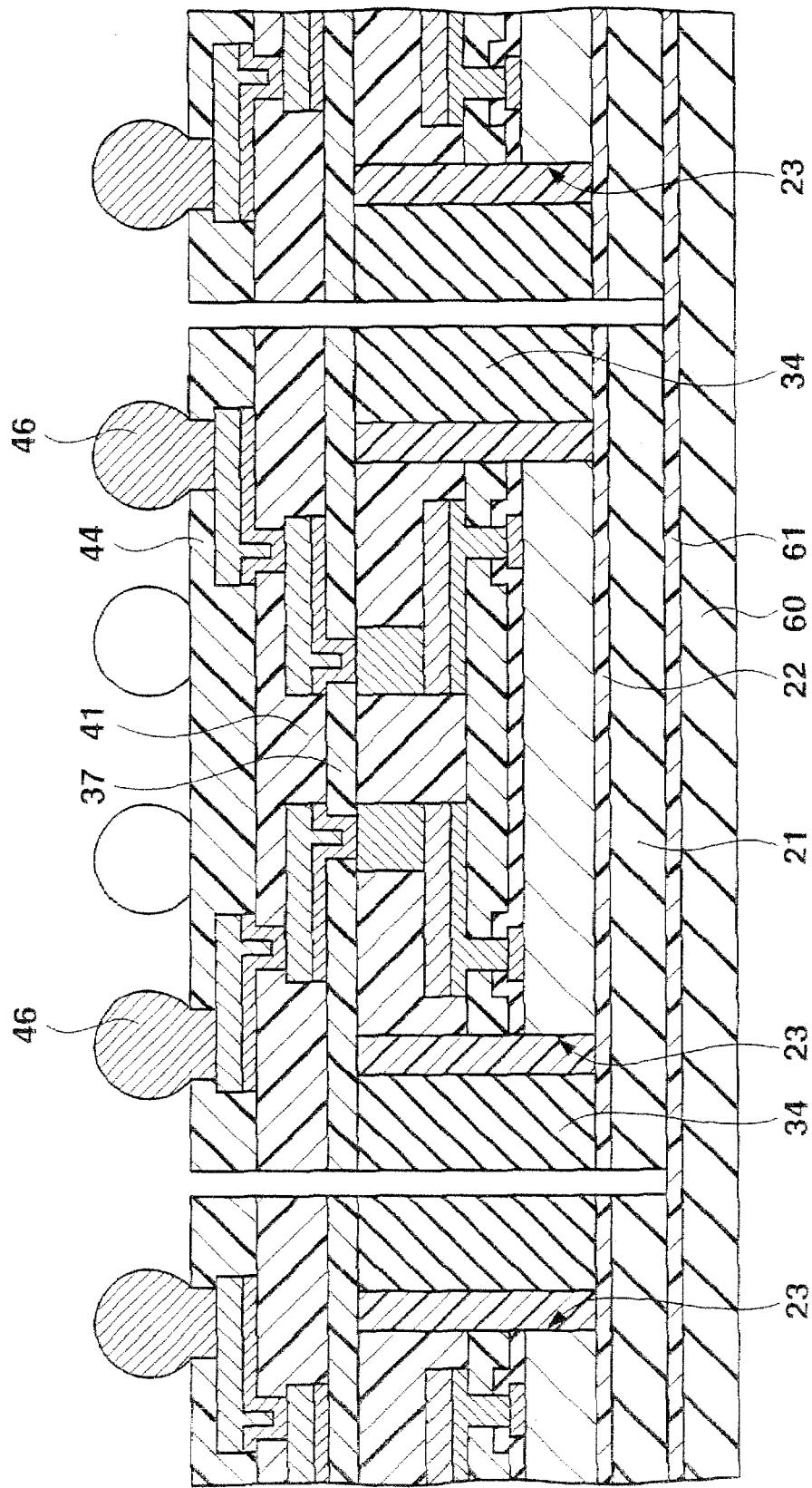
FIG. 20 is an enlarged sectional view for explaining details of a manufacturing step in this method.

After manufacturing steps shown in FIGS. 9 to 17, the three insulating films 44, 41, and 37, the buried member 34, the adhesive layer 22, the base plate 21, and the adhesive layer 61 are cut without cutting the base plate 60, as shown in FIG. 20. The lower surface of the base plate 60 is irradiated with ultraviolet rays to cure the adhesive layer 61. The adhesion properties of the adhesive layer 61 to the lower surface of the cut base plate 21 then degrade. Pieces on the adhesive layer 61 are peeled and picked up one by one to attain a plurality of semiconductor devices shown in FIG. 1.

According to this manufacturing method, individual semiconductor devices on the adhesive layer 61 are not separated in the state shown in FIG. 20, and can be peeled and picked up one by one in mounting onto a circuit board (not shown) without using any tray dedicated to mount a semiconductor device. After the adhesive layer 61 which exists on the upper surface of the base plate 60 and degrades in adhesion property is peeled, the base plate 60 can be reused. If the outer size of the base plate 60 is set constant, the transfer system can be shared regardless of the outer size of a semiconductor device to be manufactured.

For example, a general dicing tape which is expanded to remove a semiconductor device can be used as the base plate 60. In this case, the adhesive layer need not be made of an ultraviolet curing material. The base plate 60 may be removed by polishing or etching.

Figure 21:
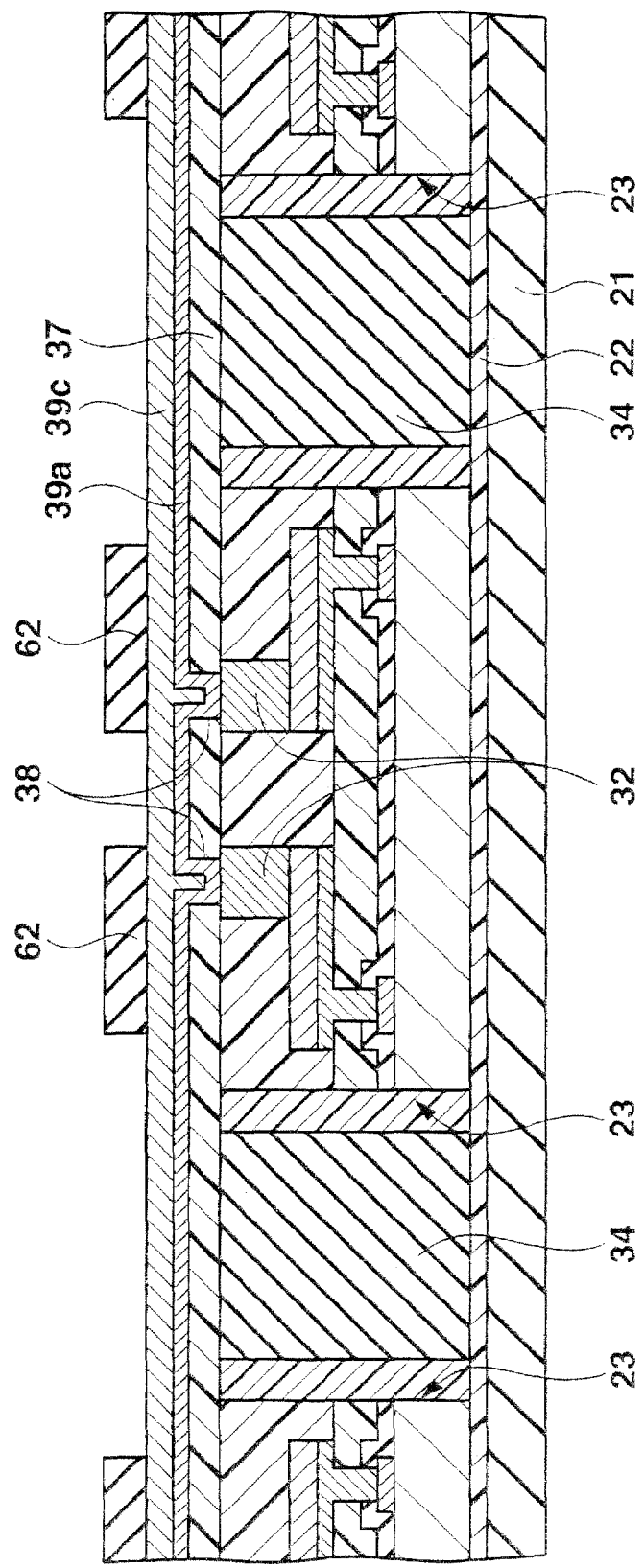
FIG. 21 is an enlarged sectional view showing a predetermined manufacturing step in still another example of the method of manufacturing the semiconductor device shown in FIG. 1.

Still another example of the method of manufacturing the semiconductor device shown in FIG. 1 will be explained. In this manufacturing method, after the manufacturing step shown in FIG. 12, the first lower metal layer 39a is formed by electroless plating of copper on the entire upper surface of the first upper insulating film 37 including the upper surfaces of the columnar electrodes 32 that are exposed via the openings 38, as shown in FIG. 21. Copper is electroplated using the first lower metal layer 39a as a plating current path, thereby forming a first upper metal formation layer 39c on the entire upper surface of the first lower metal layer 39a. Resist films 62 are patterned at portions of the upper surface of the first upper metal formation layer 39c that correspond to first upper distribution wire formation regions.

Figure 22:
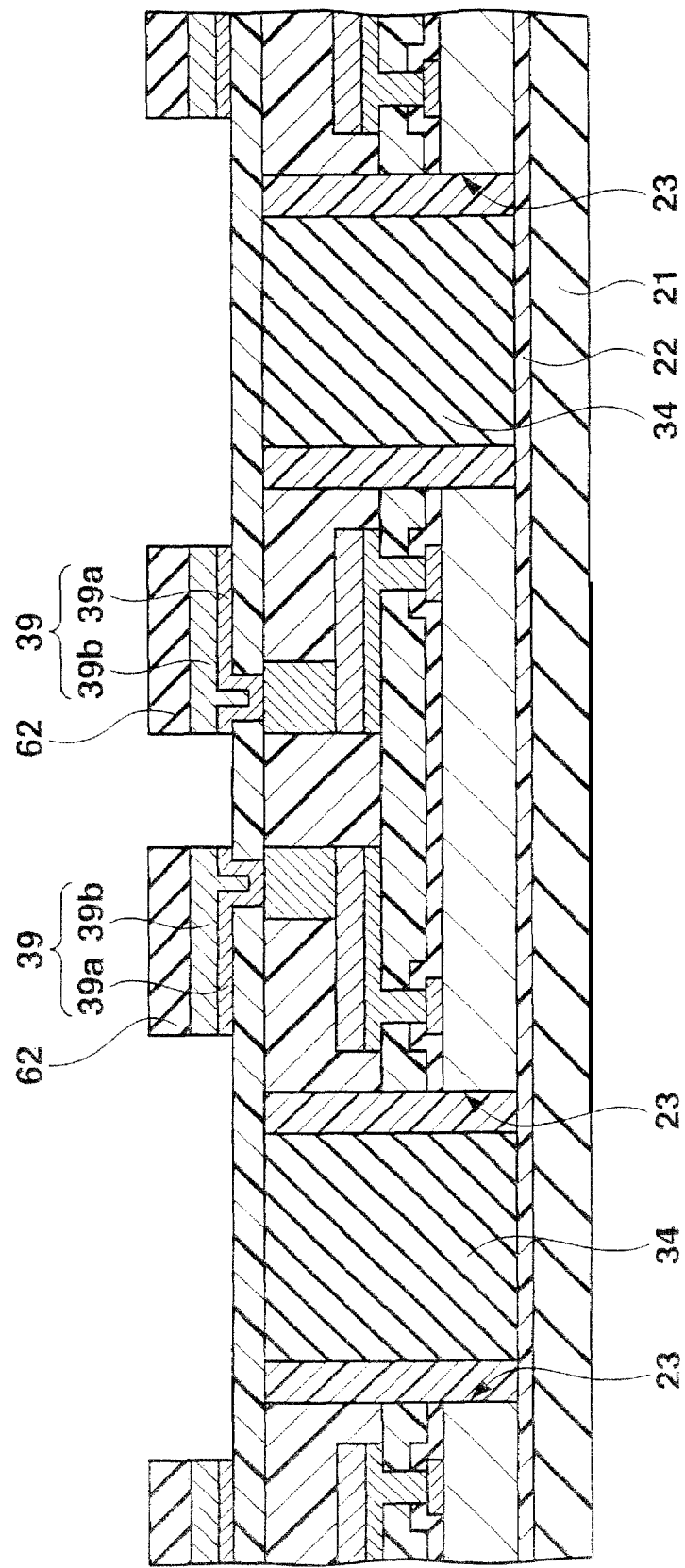
FIG. 22 is an enlarged sectional view showing a manufacturing step subsequent to FIG. 21.

Unnecessary portions of the first upper metal formation layer 39c and first lower metal layer 39a are etched away using the resist films 62 as a mask. As shown in FIG. 22, the first upper distribution wires 39 remain only below the resist films 62. After that, the resist films 62 are peeled. The second upper distribution wires 43 may be formed by the same formation method.

The base plate 21 shown in FIG. 9 or the base plate 60 shown in FIG. 19 may be shaped into a tray. That is, the base plate is shaped into a saucer in which a region where the semiconductor construction assemblies 23 are arrayed is recessed from the periphery. A metal layer for a plating current path is formed on the upper surface of the tray-shaped base plate at the periphery around the region where the semiconductor construction assemblies 23 are arrayed. The metal layer for a plating current path and a lower metal layer (39a or 43a) for a plating current path are connected by a conductive member, and electroplating is performed. In this case, if the outer size of the tray is designed constant, the same manufacturing apparatus can be efficiently used even for semiconductor devices to the manufactured at different sizes.

First Modification to First Embodiment

Figure 23:
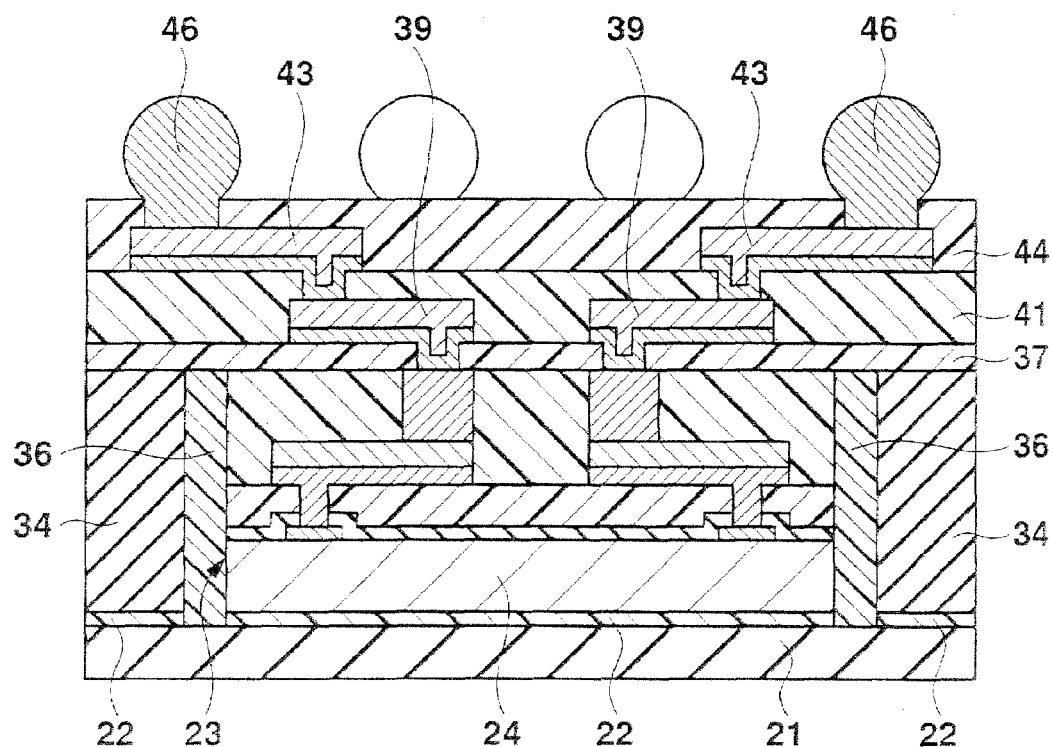
FIG. 23 is an enlarged sectional view showing the first modification to the semiconductor device according to the first embodiment of the present invention.

In the manufacturing step shown in FIG. 9, the adhesive layers 22 are formed on the lower surface of the silicon substrates 24 of the semiconductor construction assembly 23 and the lower surface of the buried member 34. The adhesive layer 22 is adhered to predetermined portions on the upper surface of the base plate 21. In this case, a semiconductor device can be obtained as the first modification shown in FIG. 23 of the first embodiment of the present invention.

In the obtained semiconductor device, for example, the lower surface of the silicon substrate 24 is attached to the upper surface of the base plate 21 via the adhesive layer 22.

The side surface of the silicon substrate 24 or the like is bonded to the upper surface of the base plate 21 via the sealing film 36. The bonding strength of the semiconductor construction assembly 23 and buried member 34 to the base plate 21 can be increased to a certain degree.

Second Modification of First Embodiment

Figure 24:
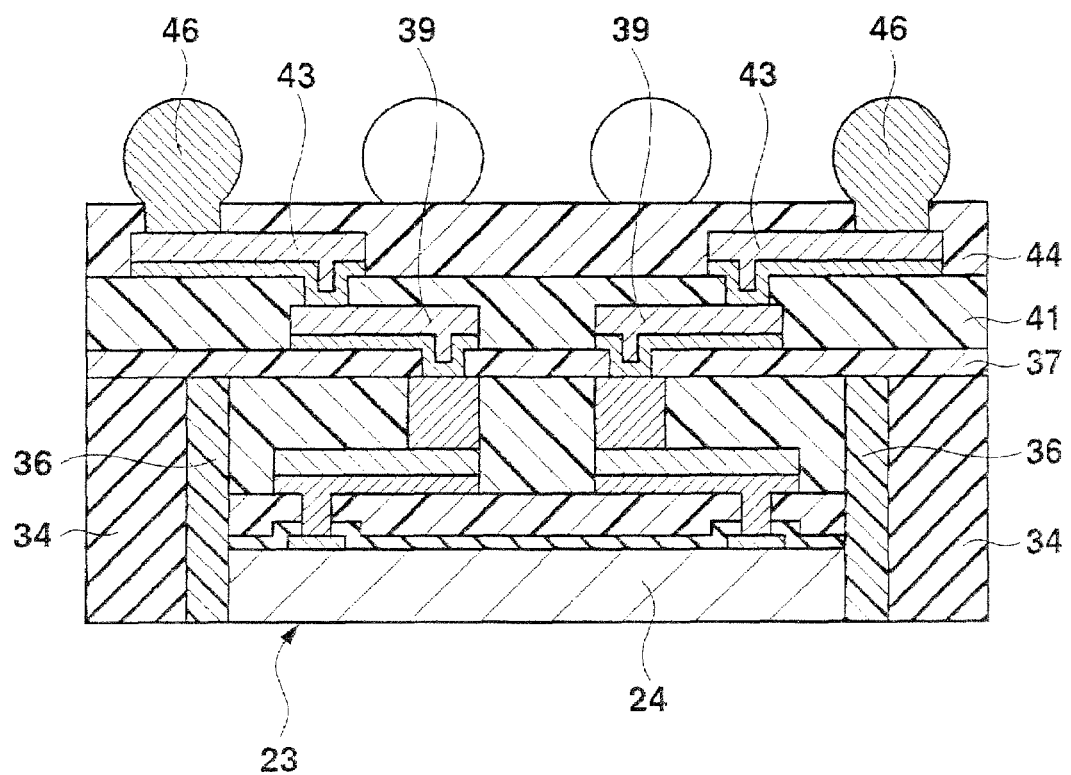
FIG. 24 is an enlarged sectional view showing the second modification to the semiconductor device according to the first embodiment of the present invention.

FIG. 24 is a sectional view showing a semiconductor device according to the second modification of the first embodiment of the present invention. This semiconductor device is different from the semiconductor device shown in FIG. 1 in the absence of the base plate 21 and adhesive layer 22.

In manufacturing the semiconductor device according to the second modification to the first embodiment, the base plate 21 and adhesive layer 22 are removed by polishing, etching, or the like after the solder balls 46 are formed, as shown in FIG. 17. The three insulating films 44, 41, and 37 and the buried member 34 are cut between adjacent semiconductor construction assemblies 23, obtaining a plurality of semiconductor devices shown in FIG. 24. The obtained semiconductor device does not comprise any base plate 21 and adhesive layer 22, and can be made lower in profile.

Third Modification of First Embodiment

Figure 25:
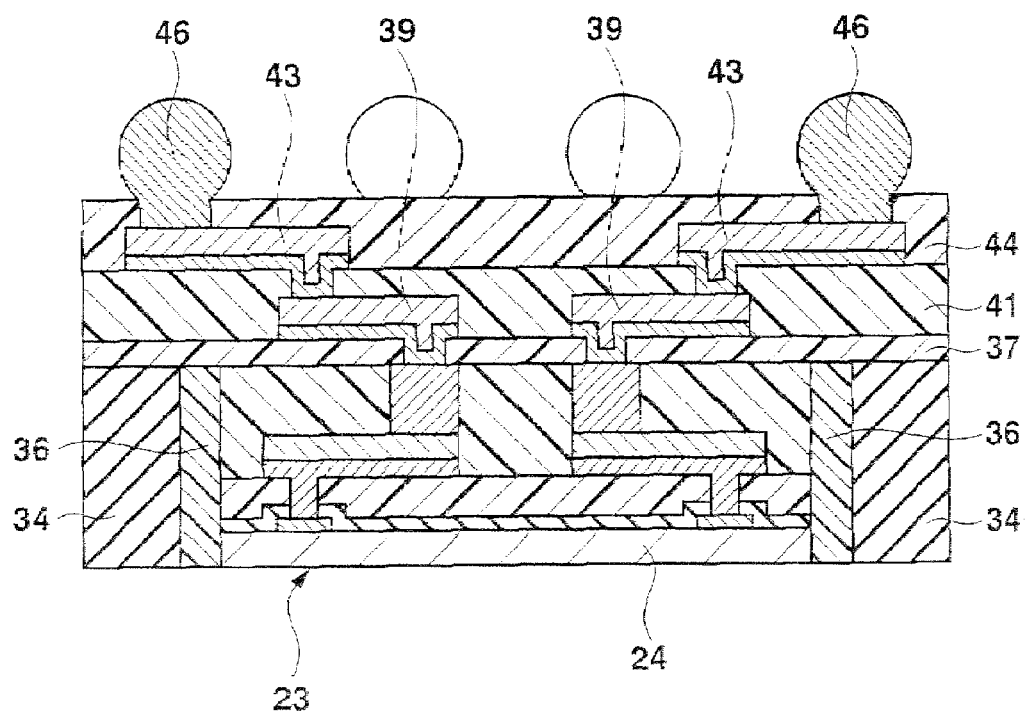
FIG. 25 is an enlarged sectional view showing the third modification to the semiconductor device according to the first embodiment of the present invention.

After the base plate 21 and adhesive layer 22 are removed by polishing, etching, or the like, the lower surfaces of the silicon substrate 24, buried member 34, and sealing film 36 are appropriately polished. The three insulating films 44, 41, and 37 and the buried member 34 are cut between adjacent semiconductor construction assemblies 23, obtaining a plurality of semiconductor devices shown in FIG. 25 according to the third modification to the first embodiment of the present invention. The obtained semiconductor device can be made much lower in profile.

Before the solder balls 46 are formed, the base plate 21 and adhesive layer 22 may be removed by polishing, etching, or the like. (If necessary, the lower surfaces of the silicon substrate 24, buried member 34, and sealing film 36 are appropriately polished.) Thereafter, the solder balls 46 may be formed, and the three insulating films 44, 41, and 37 and the buried member 34 may be cut between adjacent semiconductor construction assemblies 23.

Fourth Modification of First Embodiment

Figure 26:
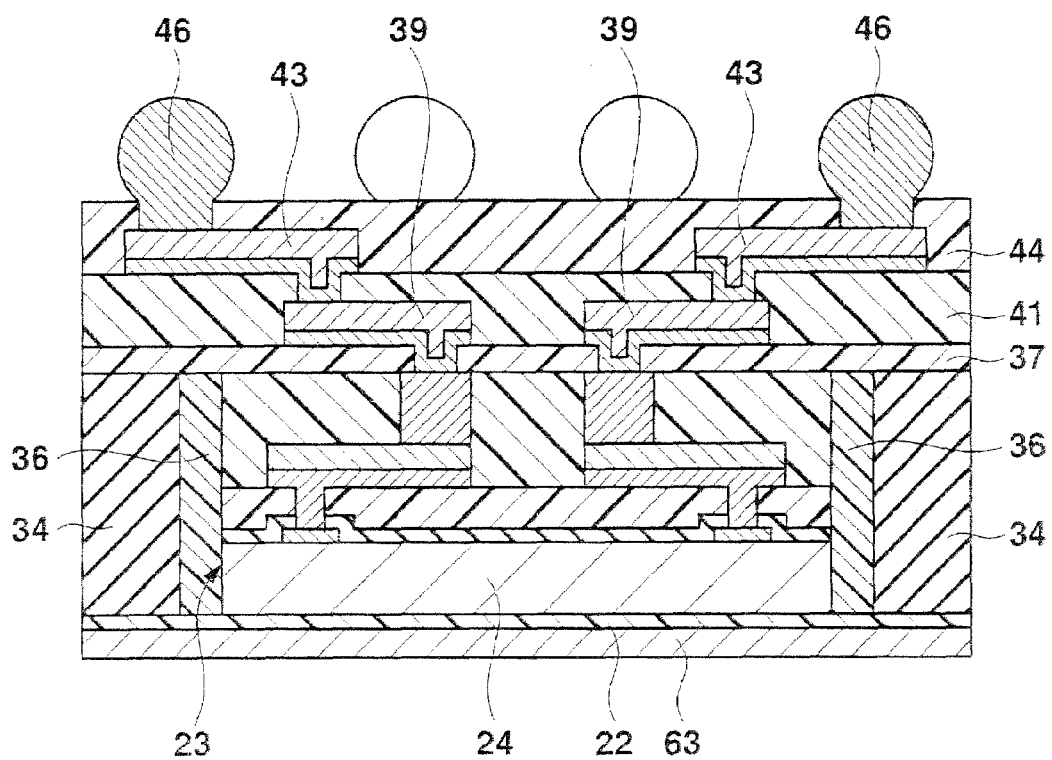
FIG. 26 is an enlarged sectional view showing the fourth modification to the semiconductor device according to the first embodiment of the present invention.

FIG. 26 is a sectional view showing a semiconductor device according to the fourth modification to the first embodiment of the present invention. This semiconductor device is different from the semiconductor device shown in FIG. 1 in that a heat dissipation metal layer 63 is adhered to the lower surface of the adhesive layer 22. The metal layer 63 is made of, e.g., copper foil several ten µm in thickness.

In manufacturing the semiconductor device according to the fourth modification to the first embodiment, the base plate 21 is removed by polishing, etching, or the like after the solder balls 46 are formed, as shown in FIG. 17. The metal layer 63 is adhered to the entire lower surface of the adhesive layer 22. The three insulating films 44, 41, and 37, the buried member 34, the adhesive layer 22, and the metal layer 63 are cut between adjacent semiconductor construction assemblies 23, obtaining a plurality of semiconductor devices shown in FIG. 26.

The adhesive layer 22 may also be removed by polishing, etching, or the like. (If necessary, the lower surfaces of the silicon substrate 24, buried member 34, and sealing film 36 are appropriately polished.) The metal layer 63 may be adhered to the lower surfaces of the silicon substrate 24, buried member 34, and sealing film 36 via a new adhesive layer.

Fifth Modification of First Embodiment

Figure 27:
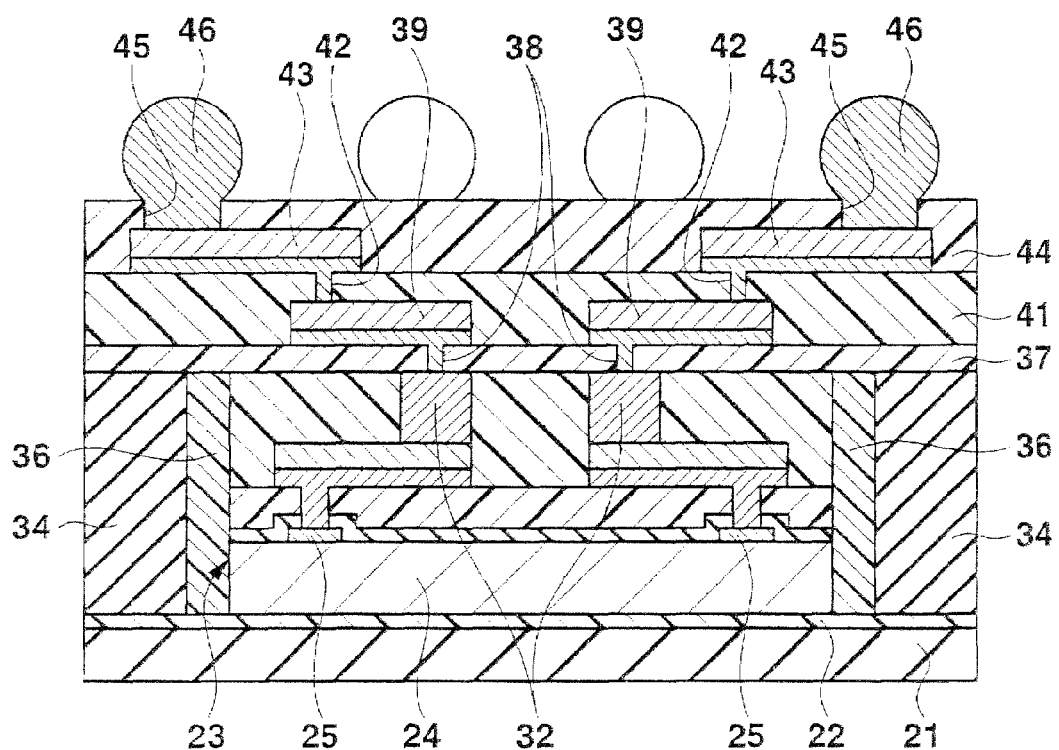
FIG. 27 is an enlarged sectional view showing the fifth modification to the semiconductor device according to the first embodiment of the present invention.

FIG. 27 is a sectional view showing a semiconductor device according to the fifth modification to the first embodiment of the present invention. This semiconductor device is different from the semiconductor device shown in FIG. 1 in that the sizes of the openings 38 and 42 of the first and second upper insulating films 37 and 41 are minimized and the lands of the first and second upper distribution wires 39 and 43 on the openings 38 and 42 are minimized.

For example, the first upper distribution wire 39 is directly bonded onto the columnar electrode 32 by plating. The opening 38 of the first upper insulating film 37 is strong enough as far as the opening 38 has a 10 µm×10 µm square area or the same circular area. The size of the opening 38 of the first upper insulating film 37 can be minimized, and the land of the first upper distribution wire 39 on the opening 38 can be minimized.

According to the fifth modification to the first embodiment, the sizes of the openings 38 and 42 of the first and second upper insulating films 37 and 41 can be minimized. The lands of the first and second upper distribution wires 39 and 43 on the openings 38 and 42 can be minimized. The areas occupied by the first and second upper distribution wires 39 and 43 can be reduced. Even if the number of connection pads 25 (i.e., columnar electrodes 32) on the silicon substrate 24 of the semiconductor construction assembly 23 increases, the overall semiconductor device can be downsized.

Sixth Modification of First Embodiment

Figure 28:
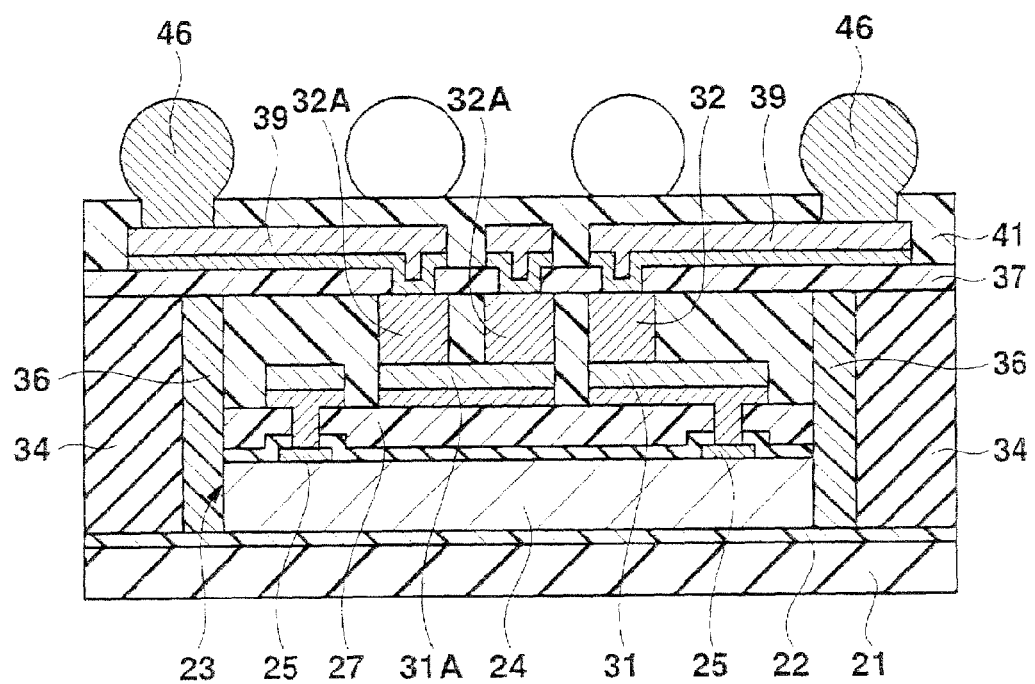
FIG. 28 is an enlarged sectional view showing the sixth modification to the semiconductor device according to the first embodiment of the present invention.

FIG. 28 is a sectional view showing a semiconductor device according to the sixth modification to the first embodiment of the present invention. This semiconductor device is different from the semiconductor device shown in FIG. 1 in that the upper distribution wire is formed from only one layer, i.e., the first upper distribution wire 39 and part of the distribution wire 31 of the semiconductor construction assembly 23 is designed as a cross distribution wire.

When the protective film 27 of the semiconductor construction assembly 23 has a margin for the area, a distribution wire 31A which is not connected to the connection pad 25 is formed on the protective film 27. Columnar electrodes 32A are formed at the two ends of the distribution wire 31A. The first upper distribution wire 39 is connected to the columnar electrodes 32A and the original columnar electrode 32, forming the distribution wire 31A into as a cross distribution wire. This can decrease the number of upper distribution wires.

Seventh Modification of First Embodiment

Figure 29:
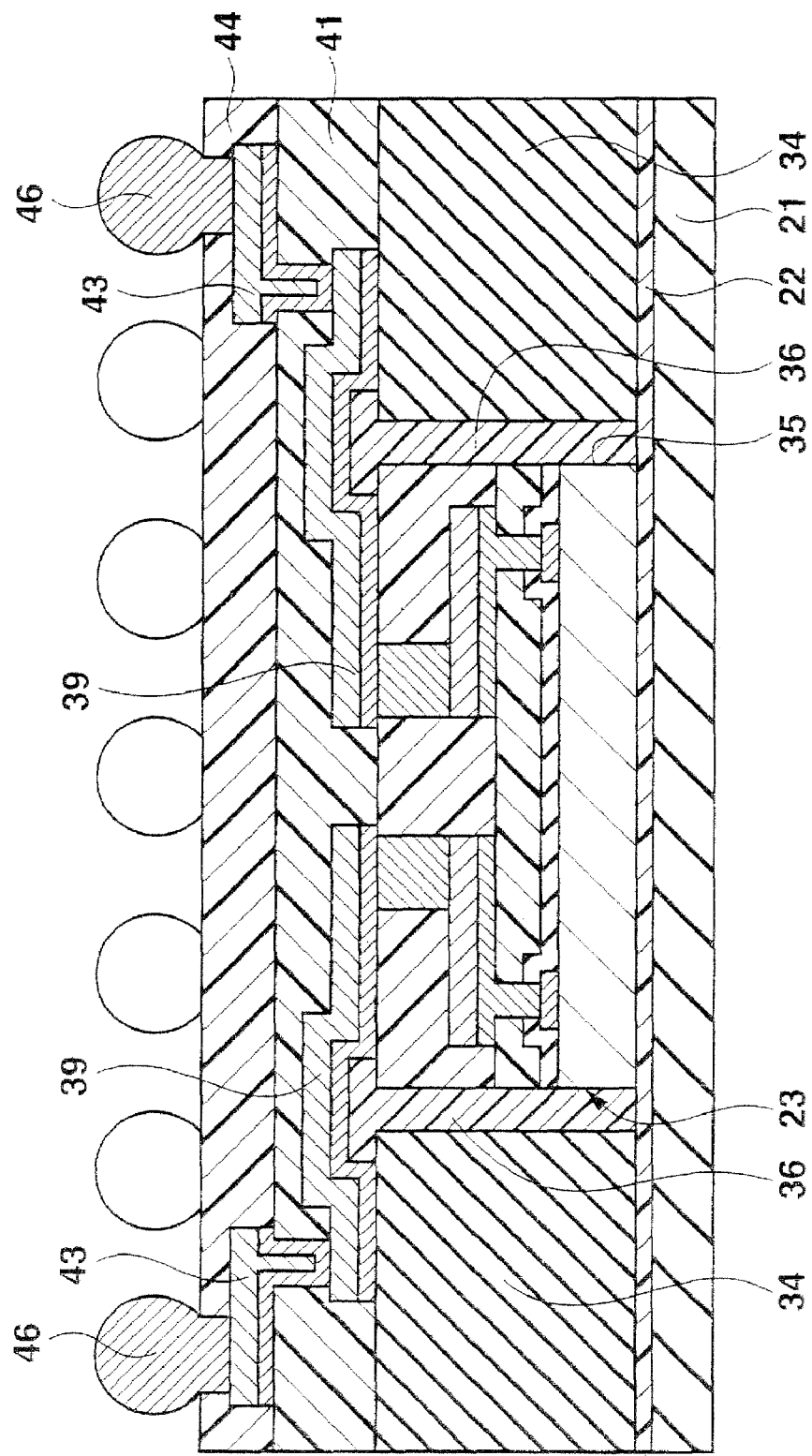
FIG. 29 is an enlarged sectional view showing the seventh modification to the semiconductor device according to the first embodiment of the present invention.

FIG. 29 is a sectional view showing a semiconductor device according to the seventh modification to the first embodiment of the present invention. This semiconductor device is different from the semiconductor device shown in FIG. 1 in that the first upper insulating film 37 is omitted, the sealing film 36 is swelled from the upper surfaces of the semiconductor construction assembly 23 and buried member 34 around the gap 35, and the first upper distribution wire 39 is formed on the upper surfaces of the swelling portion, semiconductor construction assembly 23, and buried member 34.

In this case, the sealing film 36 is formed using a metal mask or by screen printing.

Eighth Modification of First Embodiment

Figure 30:
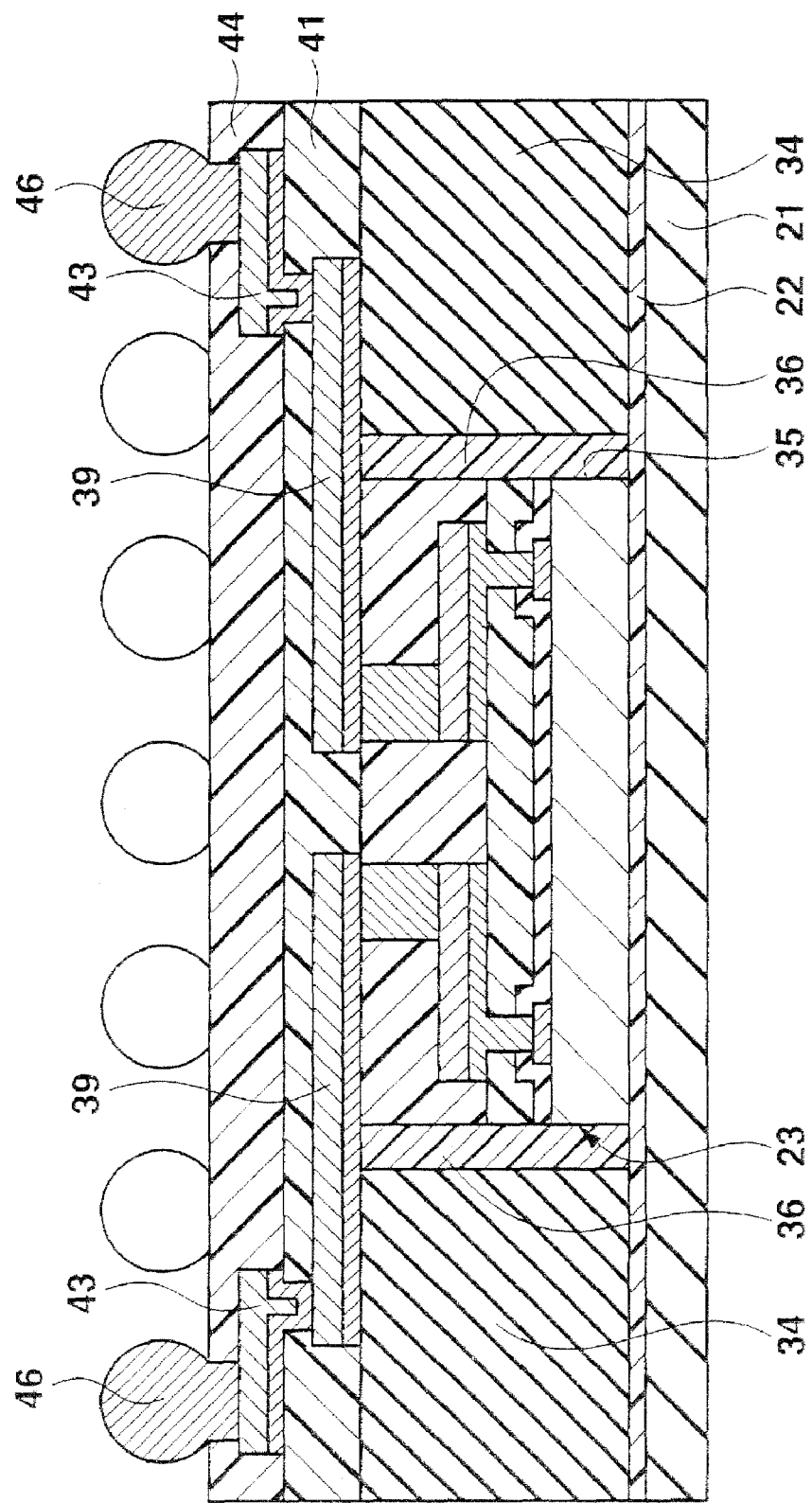
FIG. 30 is an enlarged sectional view showing the eighth modification to the semiconductor device according to the first embodiment of the present invention.

In the seventh modification to the first embodiment, the uncured or provisionally cured sealing film 36 which slightly swells from the upper surfaces of the semiconductor construction assembly 23 and buried member 34 around the gap 35 may be removed by buff polishing or the like. In this case, a semiconductor device shown in FIG. 30 according to the eighth modification to the first embodiment of the present invention can be obtained.

Ninth Modification of First Embodiment

Figure 31:
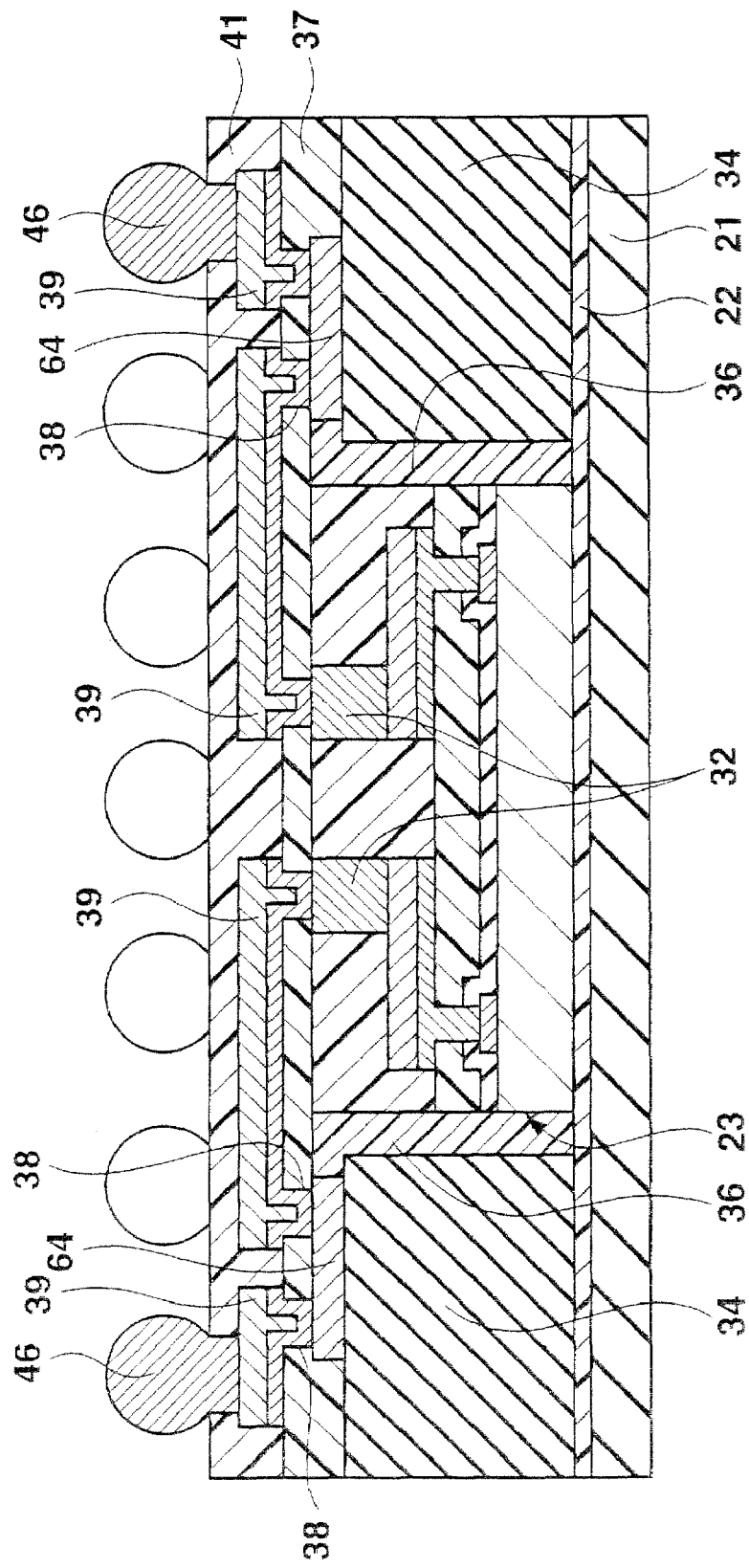
FIG. 31 is an enlarged sectional view showing the ninth modification to the semiconductor device according to the first embodiment of the present invention.

FIG. 31 is a sectional view showing a semiconductor device according to the ninth modification to the first embodiment of the present invention. This semiconductor device is different from the semiconductor device shown in FIG. 1 in that the second upper distribution wire 43 and third upper insulating film 44 are omitted, the solder ball 46 is set on the connection pad of the first upper insulating film 37, and a distribution wire 64 is formed on the upper surface of the buried member 34. In this case, the two ends of the distribution wire 64 on the buried member 34 are connected to the first upper distribution wires 39 via the openings 38 formed in the first upper insulating film 37 which covers the two ends.

10th Modification of First Embodiment

Figure 32:
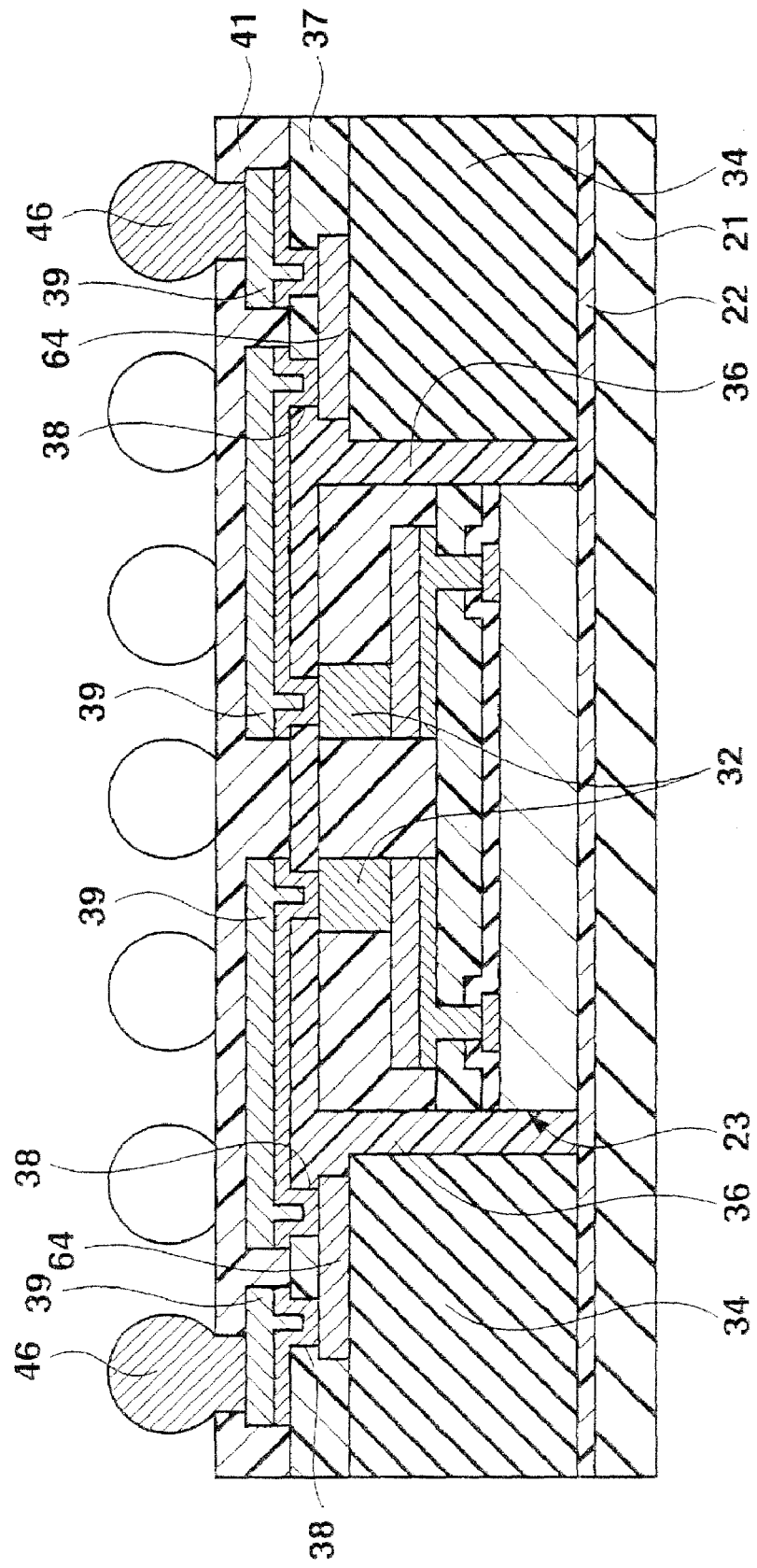
FIG. 32 is an enlarged sectional view showing the 10th modification to the semiconductor device according to the first embodiment of the present invention.

FIG. 32 is a sectional view showing a semiconductor device according to the 10th modification to the first embodiment of the present invention. This semiconductor device is different from the semiconductor device shown in FIG. 31 in that the sealing film 36 and first upper insulating film 37 are integrally formed by applying photosensitive polyimide or the like using a die coater or the like. In this case, the opening 38 may be formed in the first upper insulating film 37 by photolithography or $CO_2$ laser irradiation.

When the coating material is a thermosetting resin or a fluidal resin which becomes fluid by heating at a relatively low temperature before hardening, the insulating films 36 and 37 integrally formed by coating may be planarized by heating and pressurization processing. If the first upper insulating film 37 shown in FIG. 12 is also formed from such coating material, it may be planarized by heating and pressurization processing.

11th Modification of First Embodiment

Figure 33:
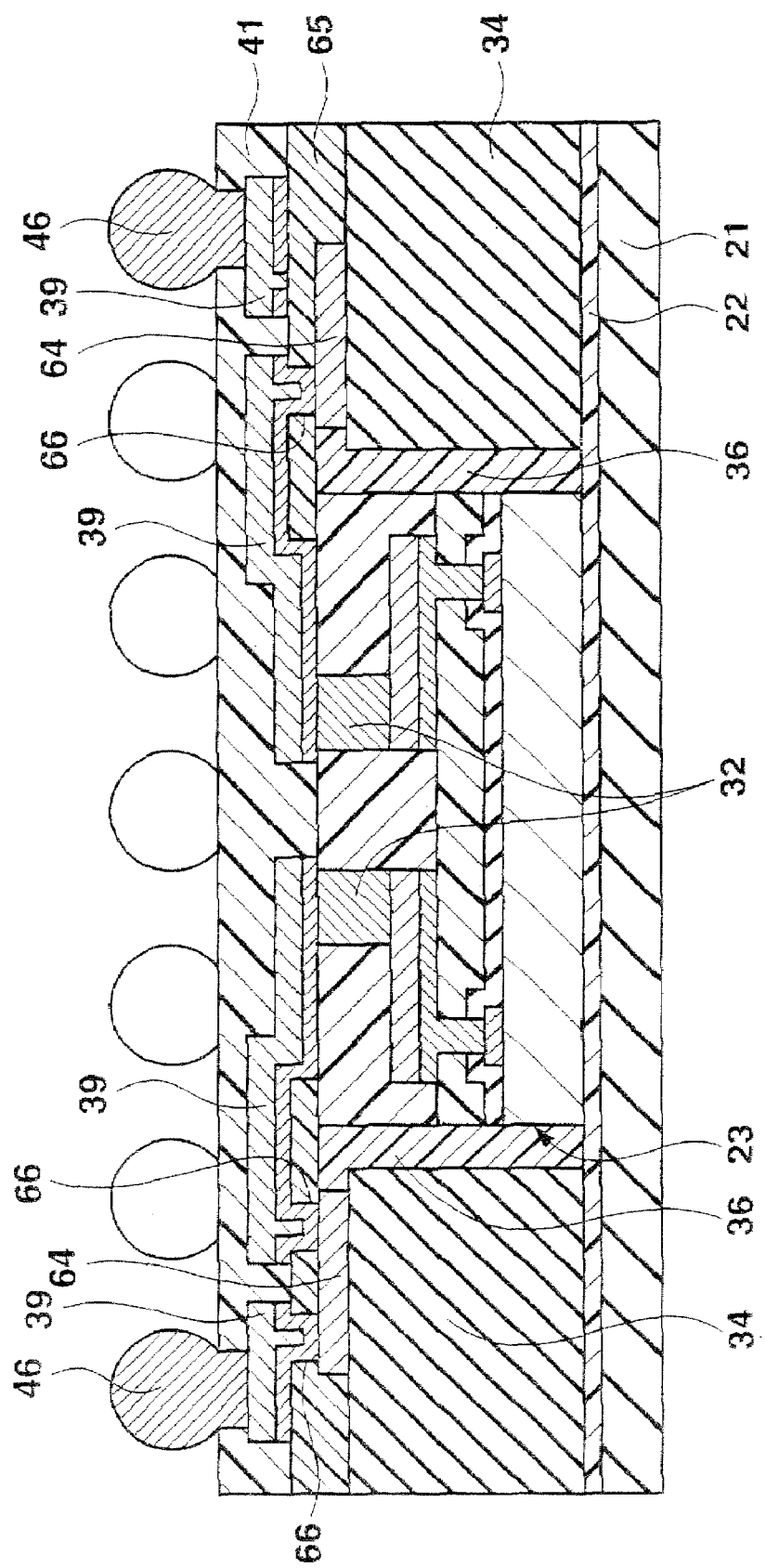
FIG. 33 is an enlarged sectional view showing the 11th modification to the semiconductor device according to the first embodiment of the present invention.

FIG. 33 is a sectional view showing a semiconductor device according to the 11th modification to the first embodiment of the present invention. This semiconductor device is different from the semiconductor device shown in FIG. 31 in that the first upper insulating film 37 is omitted, and another first upper insulating film 65 is formed by screen printing or the like at the periphery of the upper surface of the semiconductor construction assembly 23, on the upper surface of the sealing film 36, and on the entire upper surface of the buried member 34 including the distribution wire 64.

In this case, the two ends of the distribution wire 64 on the buried member 34 are connected to the first upper distribution wires 39 via openings 66 formed by $CO_2$ laser irradiation or the like in the first upper insulating film 65 which covers the two ends. The first upper distribution wire 39 is directly connected to the upper surface of the columnar electrode 32 without the mediacy of the opening of the insulating film.

12th Modification of First Embodiment

Figure 34:
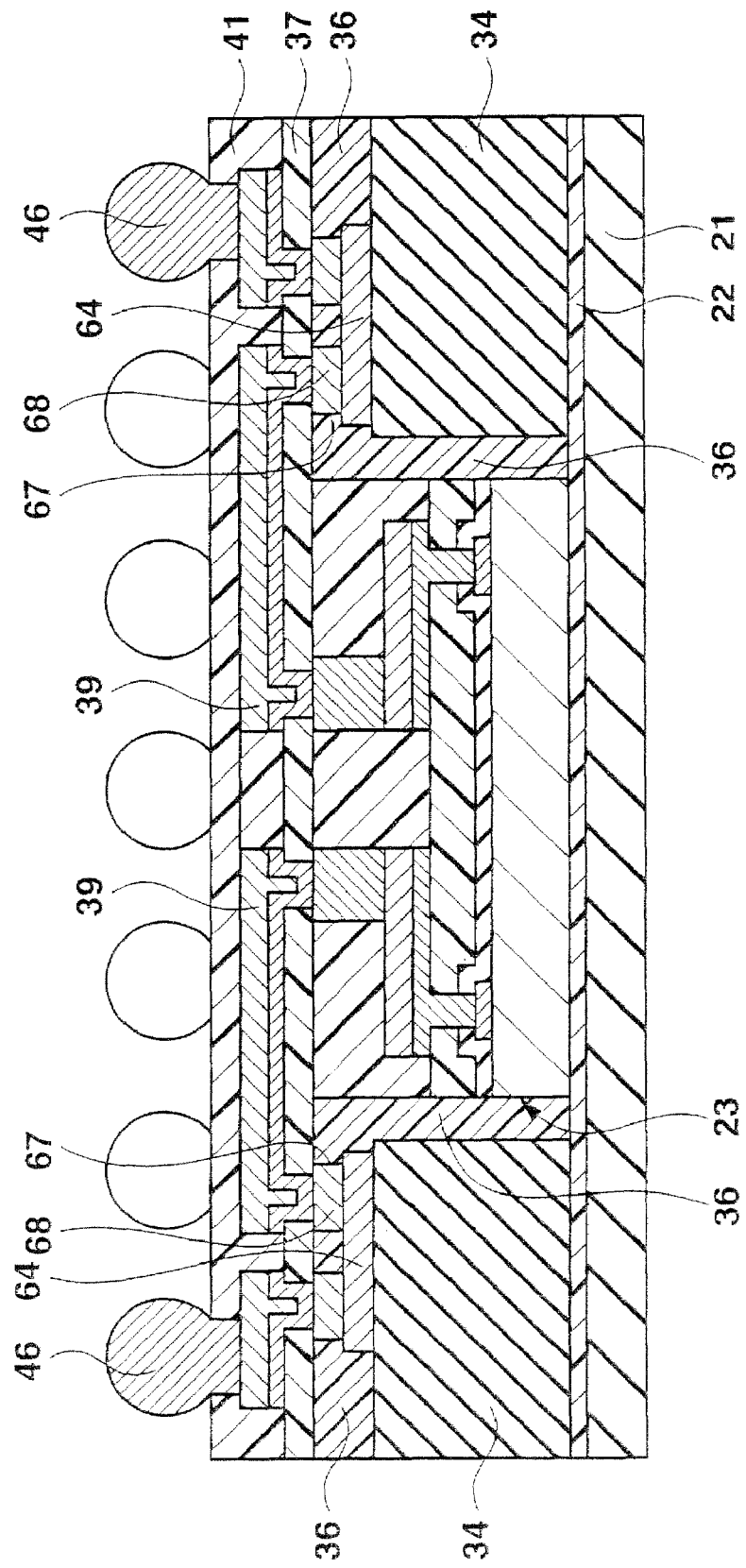
FIG. 34 is an enlarged sectional view showing the 12th modification to the semiconductor device according to the first embodiment of the present invention.

FIG. 34 is a sectional view showing a semiconductor device according to the 12th modification to the first embodiment of the present invention. This semiconductor device is greatly different from the semiconductor device shown in FIG. 31 in that the height of the buried member 34 including the distribution wire 64 is lower than that of the semiconductor construction assembly 23.

In this case, the upper surface of the buried member 34 including the distribution wire 64 is covered with the sealing film 36. The two ends of the distribution wire 64 on the buried member 34 are connected to the first upper distribution wires 39 via conductive members 68 which are made of a conductive resin or the like and if necessary, filled in openings 67 formed by $CO_2$ laser irradiation or the like in the sealing film 36 covering the two ends.

13th Modification of First Embodiment

Figure 35:
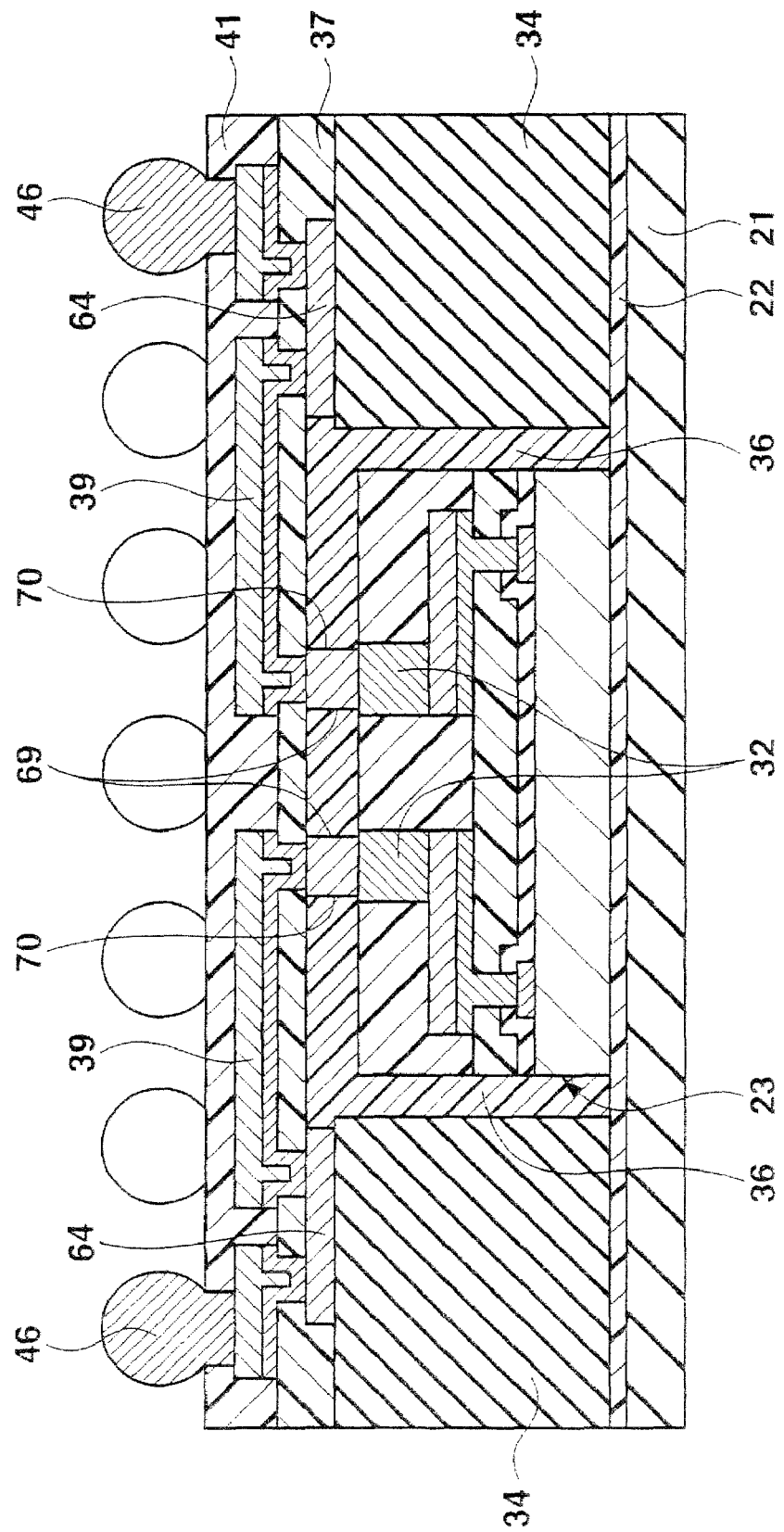
FIG. 35 is an enlarged sectional view showing the 13th modification to the semiconductor device according to the first embodiment of the present invention.

As the 13th modification shown in FIG. 35 to the first embodiment of the present invention, the height of the buried member 34 including the distribution wire 64 may be higher than that of the semiconductor construction assembly 23. In this case, the upper surface of the semiconductor construction assembly 23 is covered with the sealing film 36. The columnar electrode 32 is connected to the first upper distribution wire 39 via a conductive member 70 which is made of a conductive resin or the like and if necessary, filled in an opening 69 formed by $CO_2$ laser irradiation or the like in the sealing film 36 covering the two ends.

14th Modification of First Embodiment

Figure 36:
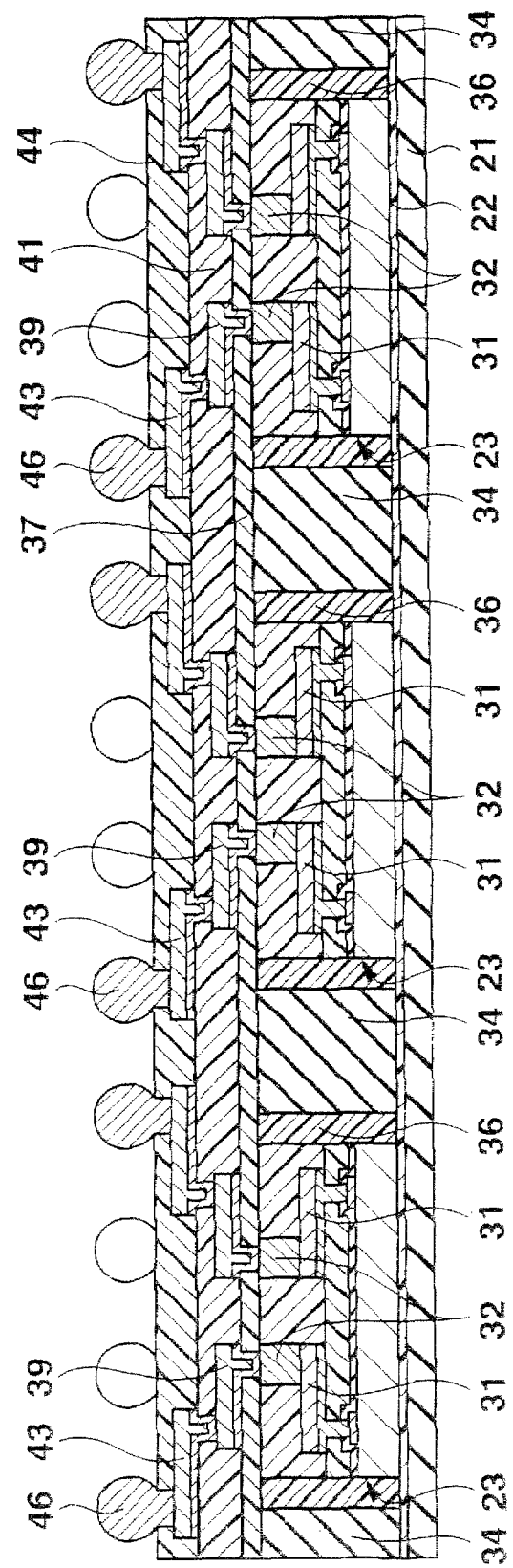
FIG. 36 is an enlarged sectional view showing the 14th modification to the semiconductor device according to the first embodiment of the present invention.

In the case shown in FIG. 18, the structure is cut between adjacent semiconductor construction assemblies 23. The present invention is not limited to this, and the structure may be cut for a set of two or more semiconductor construction assemblies 23. For example, as the 14th modification shown in FIG. 36 to the first embodiment of the present invention, the structure may be cut for a set of three semiconductor construction assemblies 23 to obtain a multi-chip module semiconductor device. A set of three semiconductor construction assemblies 23 may be of the same type or different types.

15th Modification of First Embodiment

Figure 37:
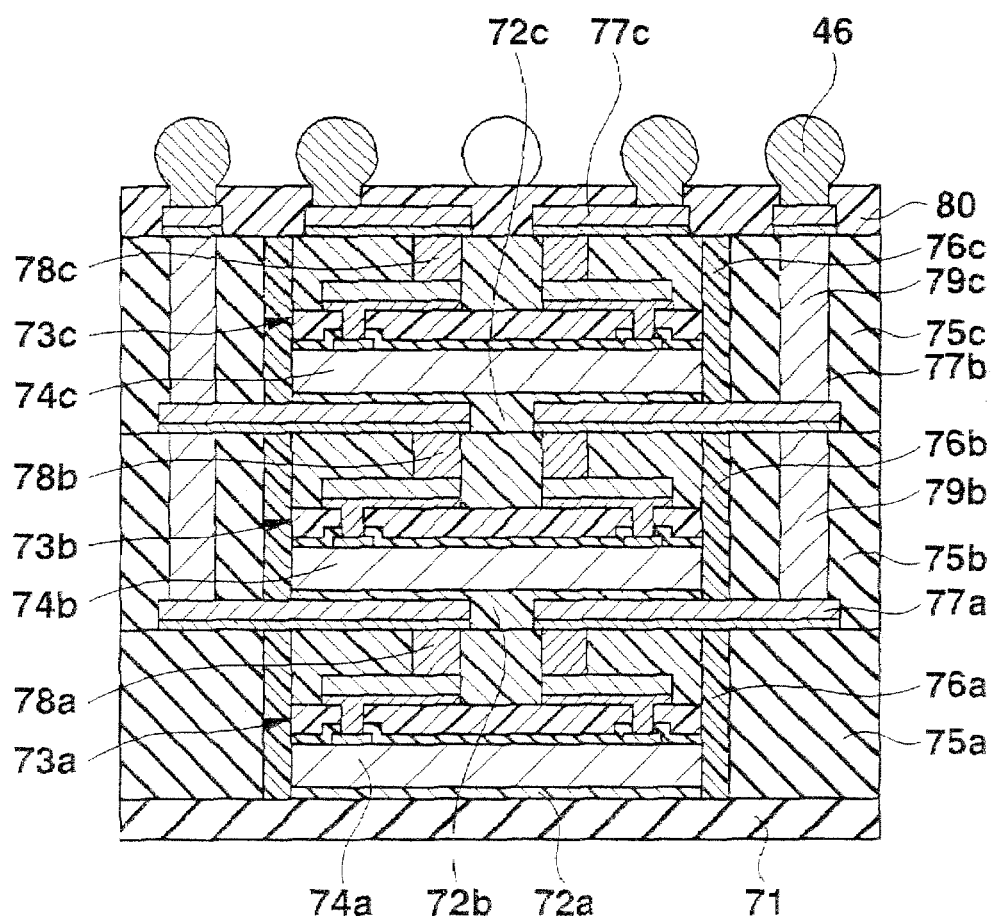
FIG. 37 is an enlarged sectional view showing the 15th modification to the semiconductor device according to the first embodiment of the present invention.

FIG. 37 is a sectional view showing a semiconductor device according to the 15th modification to the first embodiment of the present invention. In this semiconductor device, the lower surface of a silicon substrate 74a of a first semiconductor construction assembly 73a identical to that shown in FIG. 1 is adhered to the upper center surface of a flat square base plate 71 via a first adhesive layer 72a.

The lower surface of a square frame-like first buried member 75a is bonded to the upper surface of the base plate 71 at the periphery of the first semiconductor construction assembly 73a. A first sealing film 76a is sandwiched between the first semiconductor construction assembly 73a and the first buried member 75a. First upper distribution wires 77a are connected to columnar electrodes 78a of the first semiconductor construction assembly 73a at predetermined portions on the upper surfaces of the first semiconductor construction assembly 73a, first buried member 75a, and first sealing film 76a.

The lower surface of a silicon substrate 74b of a second semiconductor construction assembly 73b identical to that shown in FIG. 1 is adhered to the upper surface of the first semiconductor construction assembly 73a including the first upper distribution wires 77a via a second adhesive layer 72b. The lower surface of a square frame-like second buried member 75b is bonded to the upper surface of the first buried member 75a including the first upper distribution wires 77a. In this case, vertical electrical connection members 79b are formed at predetermined portions in the second buried member 75b. The lower surfaces of the vertical electrical connection members 79b are connected to the connection pads of the first upper distribution wires 77a. A second sealing film 76b is sandwiched between the second semiconductor construction assembly 73b and the second buried member 75b.

Second upper distribution wires 77b are connected to columnar electrodes 78b of the second semiconductor construction assembly 73b and the vertical electrical connection members 79b in the second buried member 75b at predetermined portions on the upper surfaces of the second semiconductor construction assembly 73b, second buried member 75b, and second sealing film 76b. The lower surface of a silicon substrate 74c of a third semiconductor construction assembly 73c identical to that shown in FIG. 1 is adhered to the upper surface of the second semiconductor construction assembly 73a including the second upper distribution wires 77b via a third adhesive layer 72c.

The lower surface of a square frame-like third buried member 75c is bonded to the upper surface of the second buried member 75b including the second upper distribution wires 77b. In this case, vertical electrical connection members 79c are formed at predetermined portions in the third buried member 75c. The lower surfaces of the vertical electrical connection members 79c are connected to the connection pads of the second upper distribution wires 77b. A third sealing film 76c is sandwiched between the third semiconductor construction assembly 73c and the third buried member 75c.

Third upper distribution wires 77c are connected to columnar electrodes 78c of the third semiconductor construction assembly 73c and the vertical electrical connection members 79c in the third buried member 75c at predetermined portions on the upper surfaces of the third semiconductor construction assembly 73c, third buried member 75c, and third sealing film 76c. An upper insulating film 80 is formed on the entire upper surfaces of the third semiconductor construction assembly 73c including the third upper distribution wires 77c, the third buried member 75c, and the third sealing film 76c. Solder balls 81 are formed at predetermined portions on the upper insulating film 80, and connected to the connection pads of the third upper distribution wires 77c.

Figure 38:
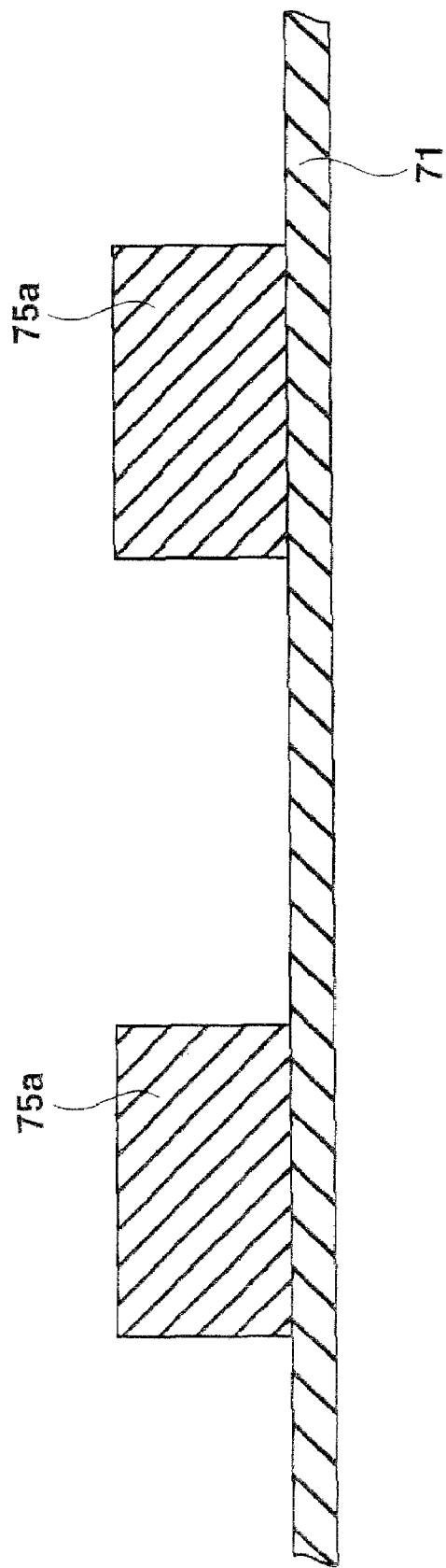
FIG. 38 is an enlarged sectional view for explaining an initial manufacturing step for the semiconductor device shown in FIG. 37.

An example of a method of manufacturing the semiconductor device according to the 15th modification to the first embodiment will be described. As shown in FIG. 38, a grid-like first buried member 75a is arranged at a predetermined portion on the upper surface of a base plate 71 capable of forming a plurality of base plates 71 shown in FIG. 37. In this case, the base plate 71, the first buried member 75a, and second and third buried members 75b and 75c (to be described later) are made of a thermosetting resin. The first buried member 75a is bonded to the predetermined portion on the upper surface of the base plate 71 by heating and pressurization.

Figure 39:
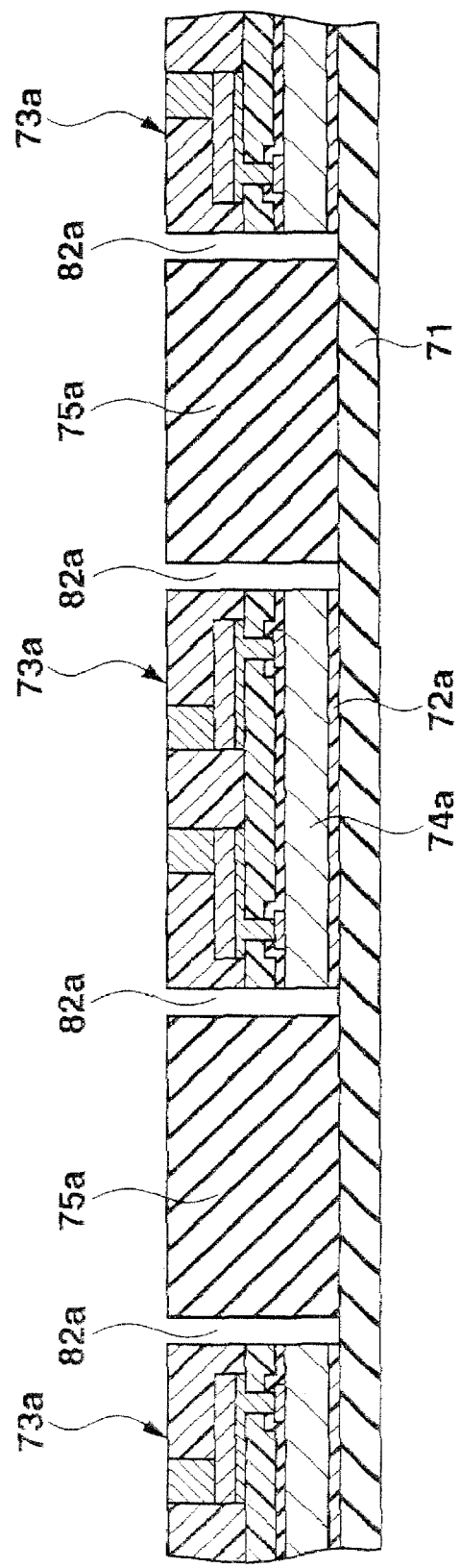
FIG. 39 is an enlarged sectional view showing a manufacturing step subsequent to FIG. 38.

As shown in FIG. 39, the lower surface of a silicon substrate 74a of each first semiconductor construction assembly 73a is adhered to the upper center surface of the base plate 71 within each opening of the grid-like first buried member 75a via a first adhesive layer 72a which is adhered in advance to the lower surface of the silicon substrate 74a. In this state, the upper surfaces of the first buried member 75a and first semiconductor construction assembly 73a are almost flush with each other. A relatively narrow first gap 82a is formed between the first semiconductor construction assembly 73a and the square frame-like first buried member 75a around the first semiconductor construction assembly 73a.

Figure 40:
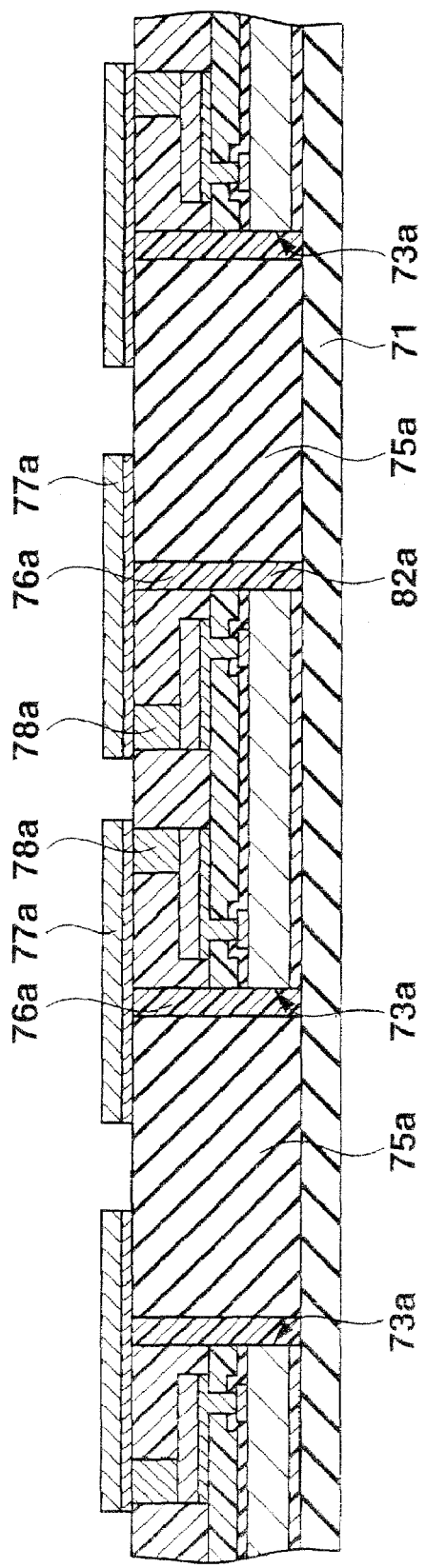
FIG. 40 is an enlarged sectional view showing a manufacturing step subsequent to FIG. 39.

As shown in FIG. 40, a first sealing film 76a is formed in the first gap 82a. First upper distribution wires 77a are connected to columnar electrodes 78a of the first semiconductor construction assembly 73a at predetermined portions on the upper surfaces of the first semiconductor construction assembly 73a, first buried member 75a, and first sealing film 76a.

Figure 41:
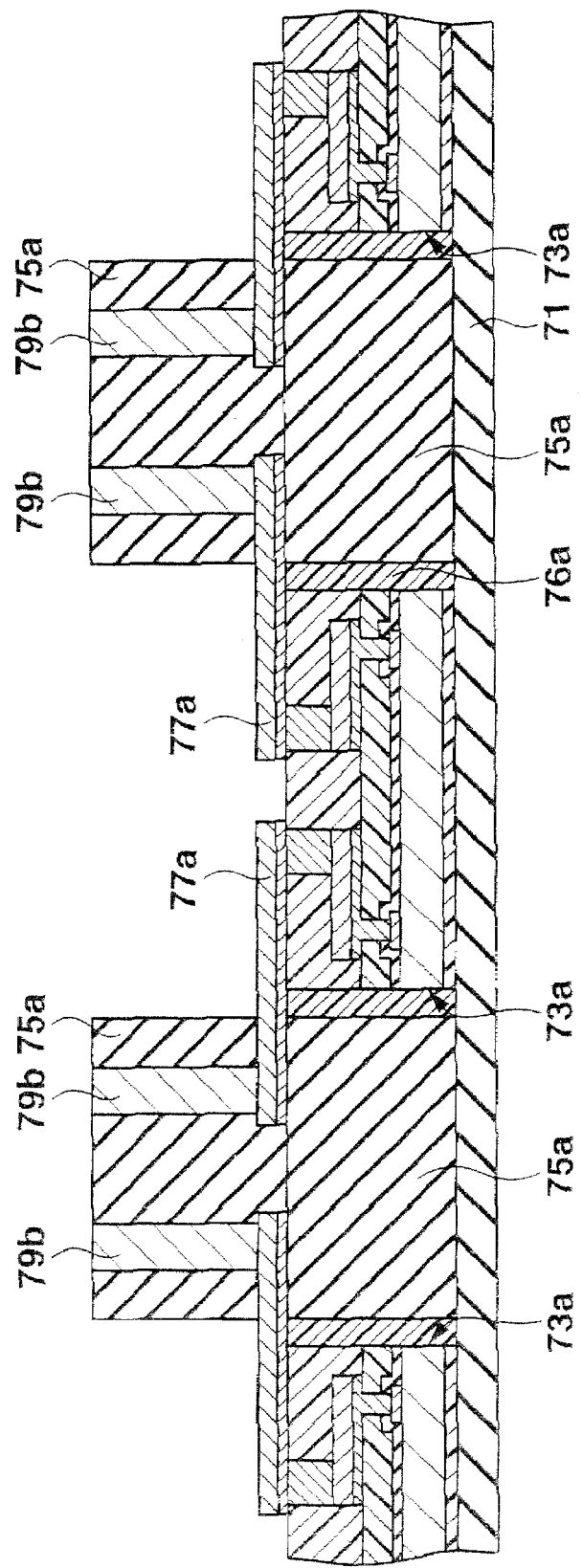
FIG. 41 is an enlarged sectional view showing a manufacturing step subsequent to FIG. 40.

As shown in FIG. 41, a grid-like second buried member 75b is thermally compression-bonded to the upper surface of the grid-like first buried member 75a including the first upper distribution wires 77a. In this case, vertical electrical connection members 79b are formed in advance at predetermined portions in the second buried member 75b. Steps by the first upper distribution wires 77a are eliminated by thermocompression bonding. The lower surfaces of the vertical electrical connection members 79b in the second buried member 75b are connected to the connection pads of the first upper distribution wires 77a.

Figure 42:
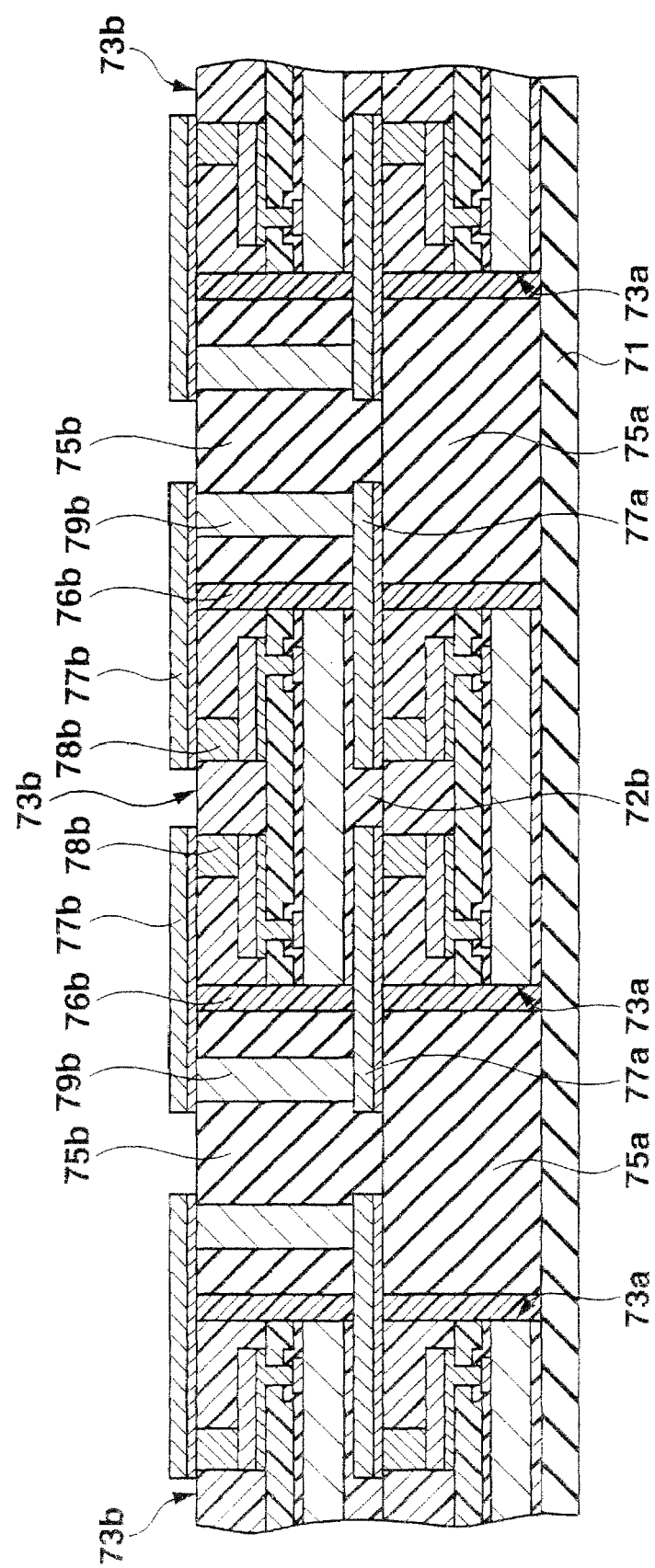
FIG. 42 is an enlarged sectional view showing a manufacturing step subsequent to FIG. 41.

As shown in FIG. 42, the lower surface of a silicon substrate 74b of a second semiconductor construction assembly 73b is adhered to the upper surface of the first semiconductor construction assembly 73a including the first upper distribution wires 77a within the opening of the grid-like second buried member 75b via a second adhesive layer 72b which is adhered in advance to the lower surface of the silicon substrate 74b.

A second sealing film 76b is formed in a relatively narrow second gap which is formed between the second semiconductor construction assembly 73b and the square frame-like second buried member 75b around the second semiconductor construction assembly 73b. Second upper distribution wires 77b are formed at predetermined portions on the upper surfaces of the second semiconductor construction assembly 73b, second buried member 75b, and second sealing film 76b, and connected to columnar electrodes 78b of the second semiconductor construction assembly 73b and the vertical electrical connection members 79b in the second buried member 75b.

Figure 43:
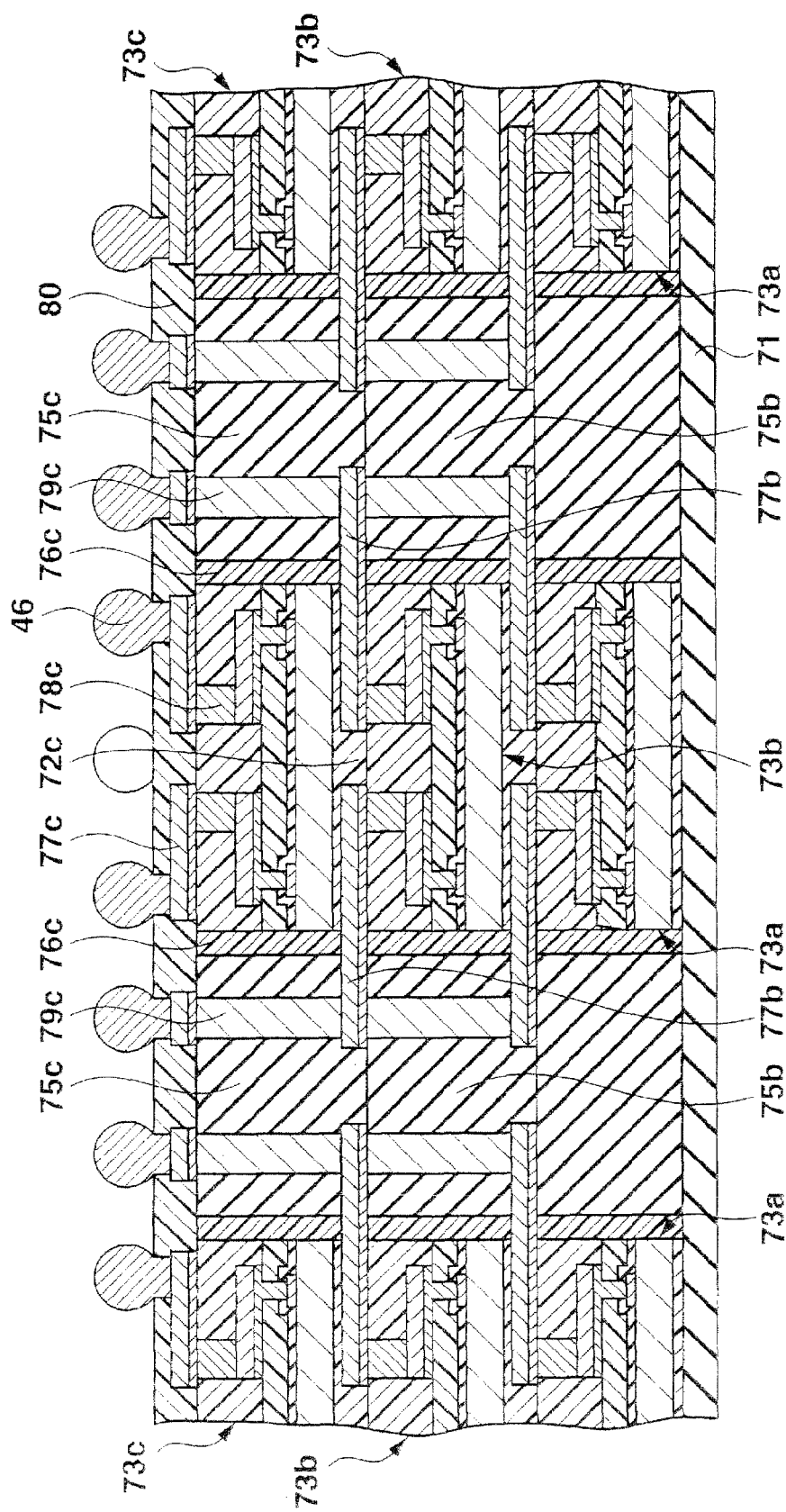
FIG. 43 is an enlarged sectional view showing a manufacturing step subsequent to FIG. 42.

As shown in FIG. 43, a grid-like third buried member 75c is thermally compression-bonded to the upper surface of the grid-like second buried member 75b including the second upper distribution wires 77b. In this case, vertical electrical connection members 79c are formed in advance at predetermined portions in the third buried member 75c. Steps by the second upper distribution wires 77b are eliminated by thermocompression bonding. The lower surfaces of the vertical electrical connection members 79c in the third buried member 75c are connected to the connection pads of the second upper distribution wires 77b.

The lower surface of a silicon substrate 74c of a third semiconductor construction assembly 73c is adhered to the upper surface of the second semiconductor construction assembly 73b including the second upper distribution wires 77b within the opening of the grid-like third buried member 75c via a third adhesive layer 72c which is adhered in advance to the lower surface of the silicon substrate 74c.

A third sealing film 76c is formed in a relatively narrow third gap which is formed between the third semiconductor construction assembly 73c and the square frame-like third buried member 75c around the third semiconductor construction assembly 73c. Third upper distribution wires 77c are formed at predetermined portions on the upper surfaces of the third semiconductor construction assembly 73c, third buried member 75, and third sealing film 76c, and connected to columnar electrodes 78c of the third semiconductor construction assembly 73c and the vertical electrical connection members 79c in the third buried member 75c.

Figure 44:
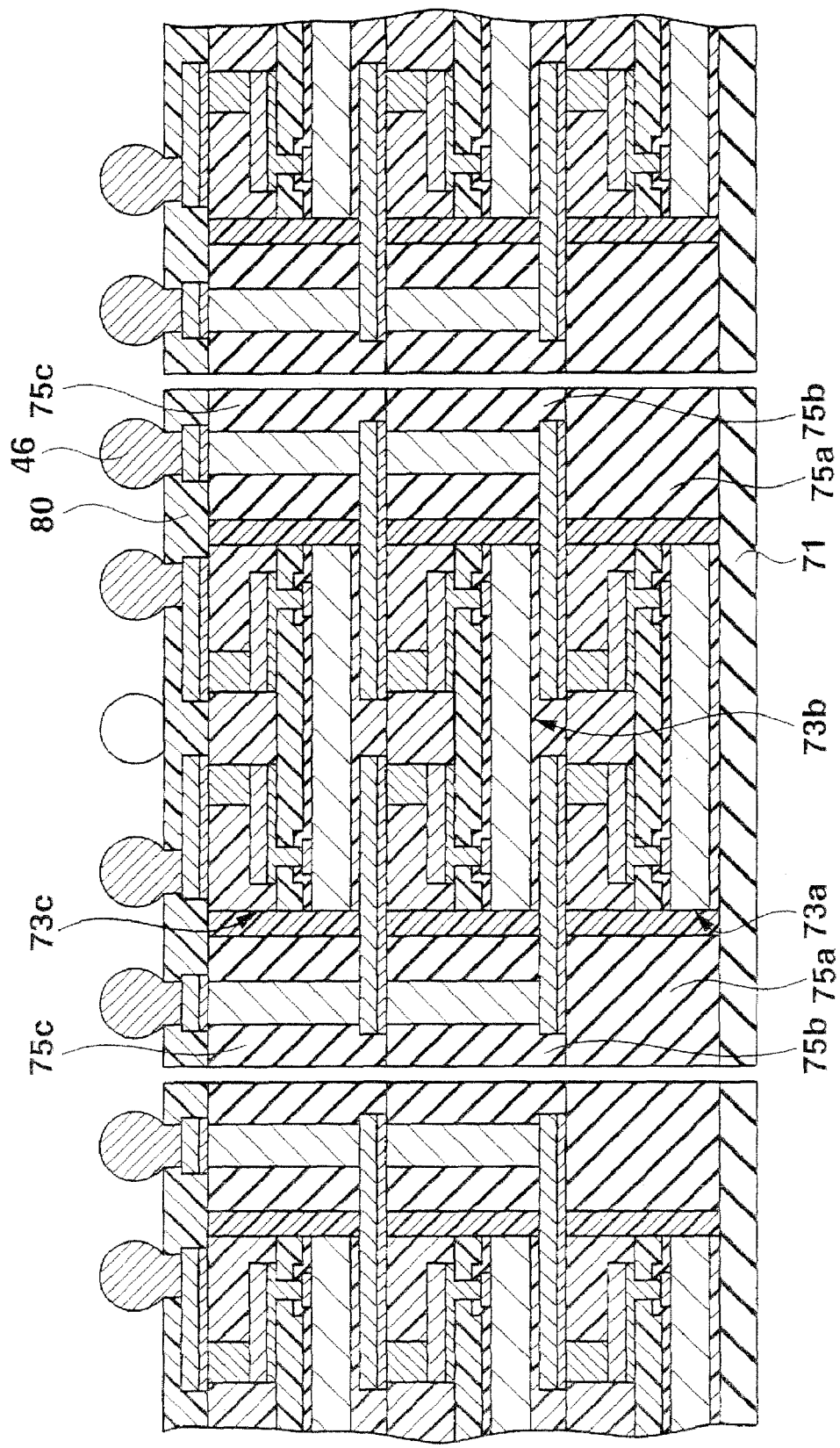
FIG. 44 is an enlarged sectional view showing a manufacturing step subsequent to FIG. 43.

An upper insulating film 80 is patterned on the upper surfaces of the third semiconductor construction assembly 73c including the third upper distribution wires 77c, the third buried member 75c, and the third sealing film 76c. Solder balls 81 are formed at predetermined portions on the upper insulating film 80, and connected to the connection pads of the third upper distribution wires 77c. As shown in FIG. 44, a plurality of semiconductor devices shown in FIG. 37 are obtained after a predetermined dicing step.

16th Modification of First Embodiment

Figure 45:
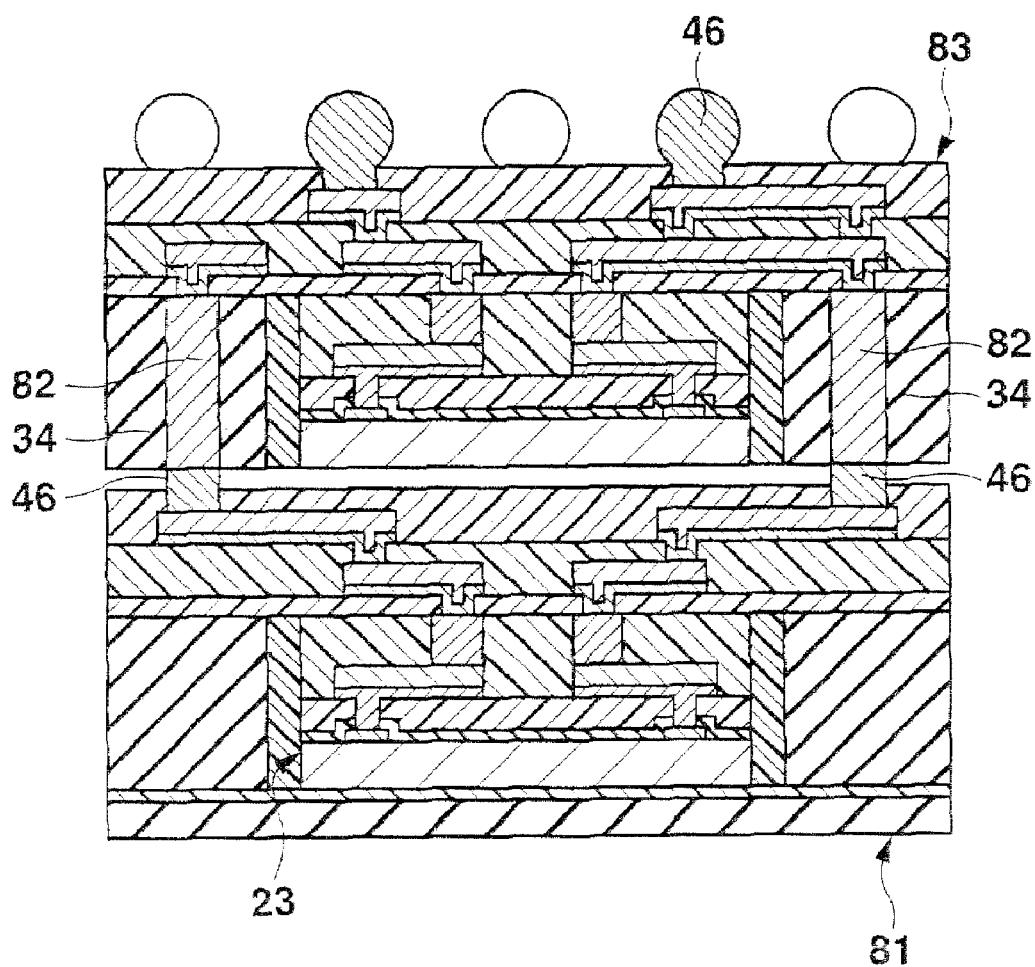
FIG. 45 is an enlarged sectional view showing the 16th modification to the semiconductor device according to the first embodiment of the present invention.

FIG. 45 is a sectional view showing a semiconductor device according to the 16th modification to the first embodiment of the present invention. A semiconductor device identical to that shown in FIG. 1 is prepared. The prepared semiconductor device will be referred to as a first semiconductor block 81. All the solder balls 46 of the first semiconductor block 81 are arranged only around the semiconductor construction assembly 23, and are slightly smaller in diameter than the solder balls shown in FIG. 1.

A semiconductor device almost identical to that shown in FIG. 24 except that vertical electrical connection members 82 are formed in the buried member 34 is prepared. The prepared semiconductor device will be referred to as a second semiconductor block 83. The second semiconductor block 83 is mounted on the first semiconductor block 81 by connecting the lower surfaces of the vertical electrical connection members 82 in the buried member 34 of the second semiconductor block 83 to the solder balls 46 of the first semiconductor block 81.

17th Modification of First Embodiment

Figure 46:
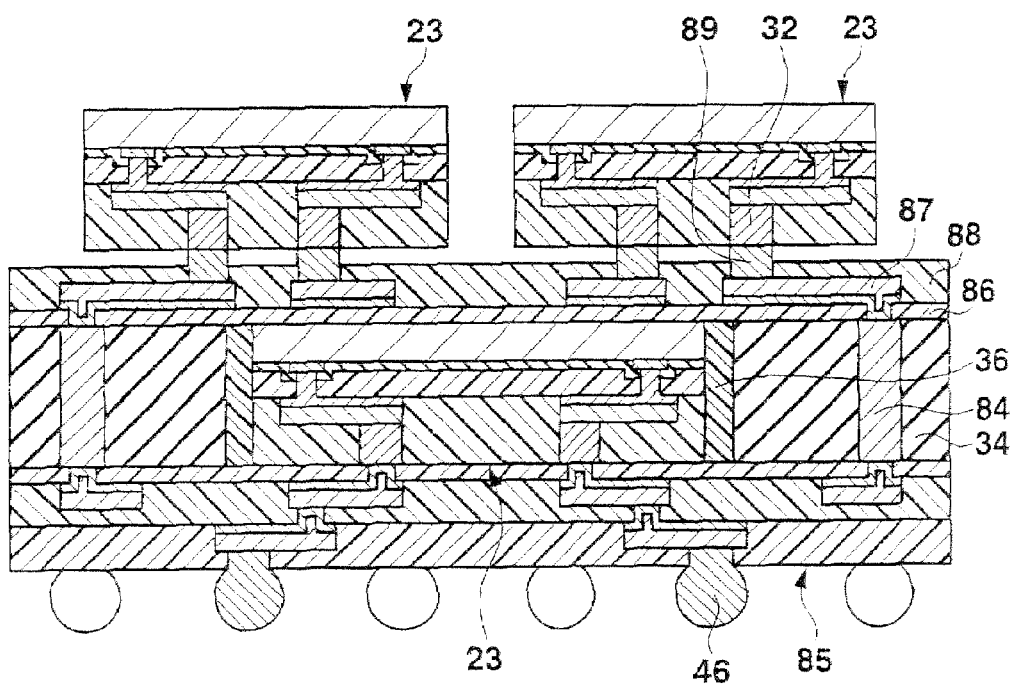
FIG. 46 is an enlarged sectional view showing the 17th modification to the semiconductor device according to the first embodiment of the present invention.

FIG. 46 is a sectional view showing a semiconductor device according to the 17th modification to the first embodiment of the present invention. A semiconductor device almost identical to that shown in FIG. 24 except that vertical electrical connection members 84 are formed in the buried member 34 is prepared. The prepared semiconductor device will be referred to as a semiconductor block 85.

In the semiconductor block 85, a first insulating film 86 is patterned on the upper surfaces of the semiconductor construction assembly 23, buried member 34, and sealing film 36. Interconnections 87 are formed on the upper surface of the first insulating film 86, and connected to the upper surfaces of the vertical electrical connection members 84. A second insulating film 88 is patterned on the upper surface of the first insulating film 86 including the interconnections 87. Small-diameter solder balls 89 are formed on the connection pads of the interconnections 87 which are exposed without being covered with the second insulating film 88.

A plurality of semiconductor construction assemblies 23 having almost the same structure as that shown in FIG. 1 are mounted on the semiconductor block 85 by connecting the columnar electrodes 32 of the semiconductor construction assemblies 23 to the solder balls 89 of the semiconductor block 85.

18th Modification of First Embodiment

Figure 47:
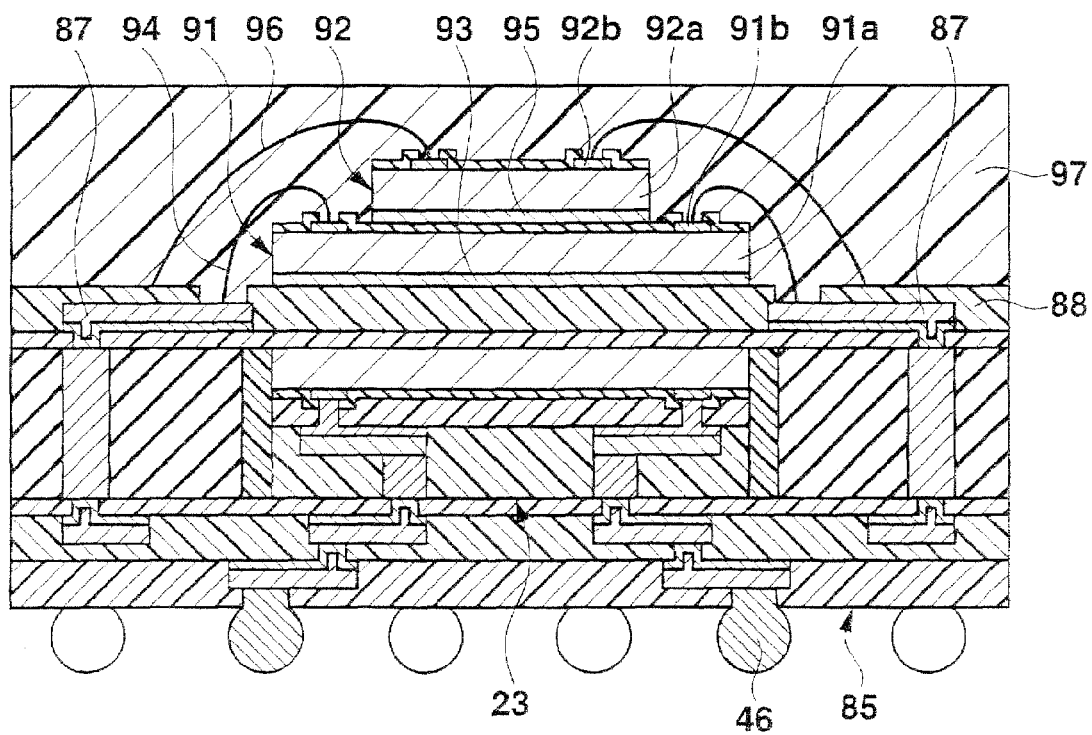
FIG. 47 is an enlarged sectional view showing the 18th modification to the semiconductor device according to the first embodiment of the present invention.

As the 18th modification shown in FIG. 47 to the first embodiment of the present invention, first and second semiconductor chips 91 and 92 formed from LSIs or the like may be mounted on the semiconductor block 85. All the connection pads of the interconnections 87 which are exposed without being covered with the second insulating film 88 of the semiconductor block 85 are arranged only around the semiconductor construction assembly 23.

The first and second semiconductor chips 91 and 92 have a structure in which a plurality of connection pads 91b and 92b are arranged at peripheries on chip main bodies 91a and 92a. The planer size of the first semiconductor chip 91 is almost equal to that of the semiconductor construction assembly 23. The planar size of the second semiconductor chip 92 is slightly smaller than that of the semiconductor chip 91.

The first semiconductor chip 91 is mounted on the upper center surface of the insulating film 88 of the semiconductor block 85 via an adhesive layer 93. The connection pads 91b are connected via wires 94 to the connection pads of the interconnections 87 which are exposed without being covered with the second insulating film 88 of the semiconductor block 85. The second semiconductor chip 92 is mounted on the upper center surface of the first semiconductor chip 91 via an adhesive layer 95. The connection pads 92b are connected via wires 96 to the connection pads of the interconnections 87 which are exposed without being covered with the second insulating film 88 of the semiconductor block 85. A sealing film 97 made of an epoxy resin or the like is formed on the entire upper surface of the insulating film 88 including the first and second semiconductor chips 91 and 92 and the wires 94 and 96.

19th Modification of First Embodiment

Figure 48:
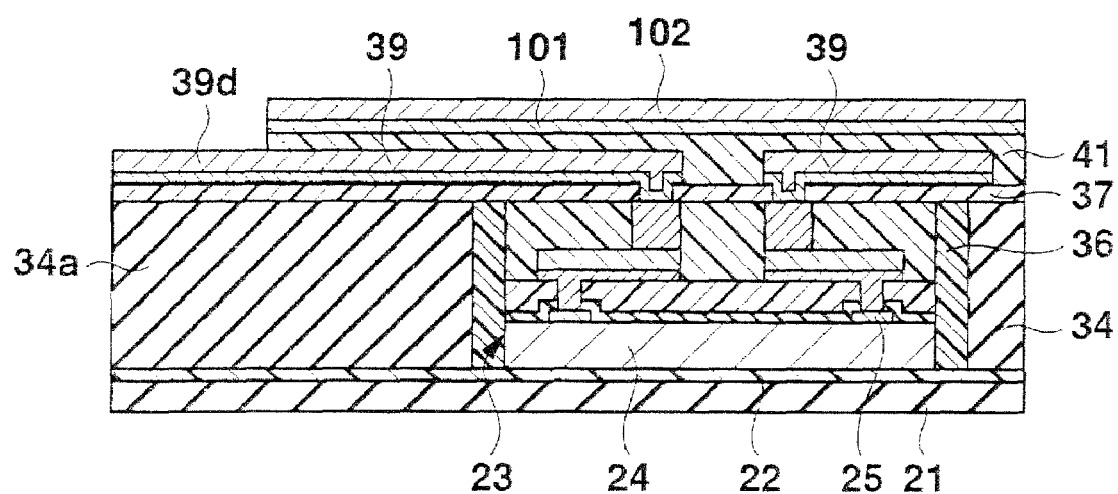
FIG. 48 is an enlarged sectional view showing the 19th modification to the semiconductor device according to the first embodiment of the present invention.

FIG. 48 is a sectional view showing a semiconductor device according to the 19th modification to the first embodiment of the present invention. A semiconductor device almost identical to that shown in FIG. 1 except that no second upper distribution wire 43, third upper insulating film 44, and solder ball 46 are arranged is prepared. In this case, one side 34a of the buried member 34 is two-dimensionally wide to a certain degree.

One end of one first upper distribution wire 39 extends to the end face of the one side 34a of the buried member 34. A portion near the end face forms a connection terminal 39d. A shield metal layer 102 is formed via an adhesive layer 101 on the upper surface of the second upper insulating film 41 including the first upper distribution wires 39 except a connection portion including the connection terminal 39d. The metal layer 102 is formed from, e.g., copper foil several ten μm in thickness.

As a concrete application of this semiconductor device is a memory module such as a DRAM which has a small number of terminals and must exhibit temperature cycle reliability of connection between the silicon substrate 24 (chip portion) and a module.

20th Modification to First Embodiment

Figure 49:
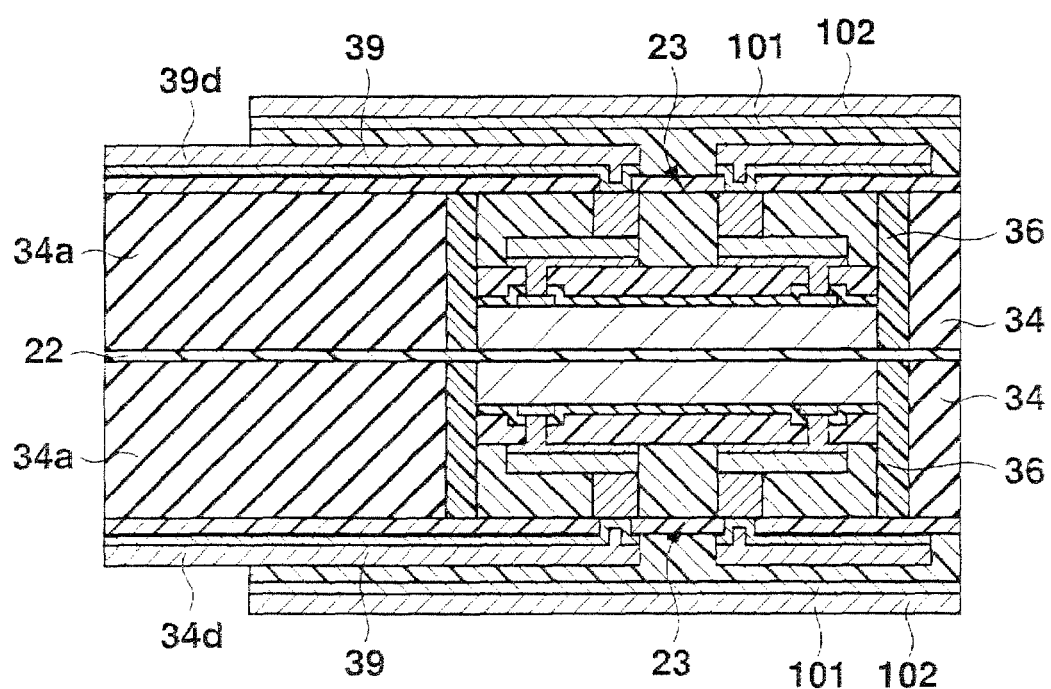
FIG. 49 is an enlarged sectional view showing the 20th modification to the semiconductor device according to the first embodiment of the present invention.

As the 20th modification shown in FIG. 49 to the first embodiment of the present invention, a couple of semiconductor devices shown in FIG. 48 from which the base plate 21 is removed may be adhered to each other via adhesive layers 22.

Figure 50:
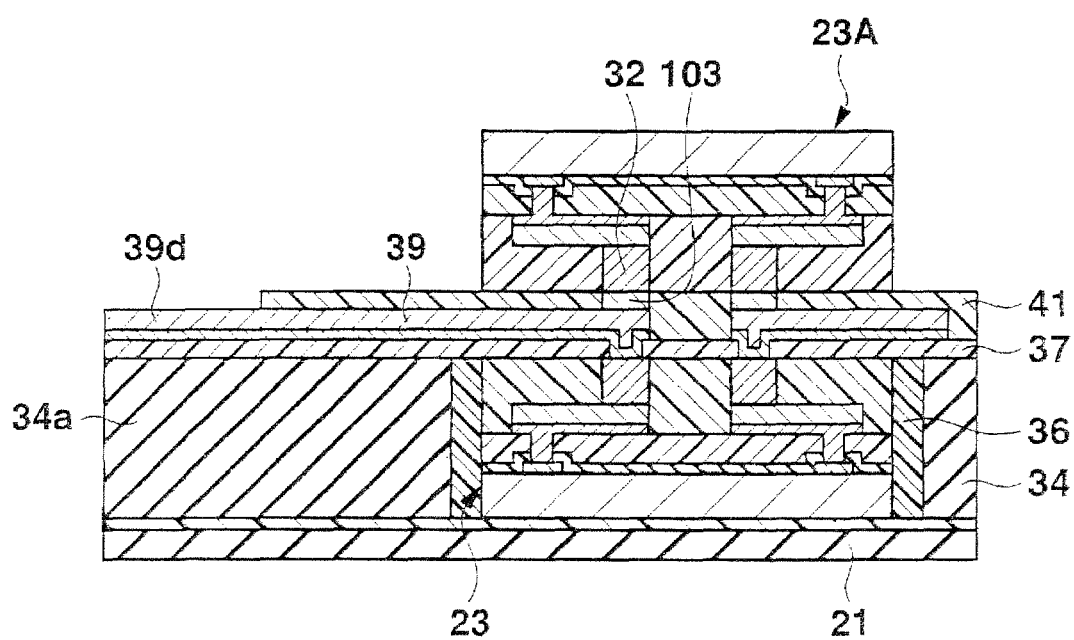
FIG. 50 is an enlarged sectional view for explaining repair in the semiconductor device shown in FIG. 48.

As a repair method, when the semiconductor construction assembly 23 is a defective in the semiconductor device shown in FIG. 48, some of the first upper distribution wires 39 may be cut by laser irradiation without adhering the metal layer 102 via the adhesive layer 101, and the defective semiconductor construction assembly 23 may be disabled. As shown in FIG. 50, another non-defective semiconductor construction assembly 23A may be mounted. In this case, openings may be formed at predetermined portions in the first upper insulating film 41 by $CO_2$ laser irradiation. Conductive members 103 of a conductive resin or the like may be buried in the openings. The columnar electrodes 32 of the non-defective semiconductor construction assembly 23A may be connected to the conductive members 103 via solder (not shown).

Another Manufacturing Method of First Embodiment

For example, a structure in which the semiconductor construction assembly 23 does not comprise any sealing film 33 in the state shown in FIG. 9 is prepared. More specifically, as shown in FIG. 5, the protective film 27, distribution wires 31, and columnar electrodes 32 are formed on the silicon substrate 24 in the wafer state on which the connection pads 25 and insulating film 26 are formed is formed. The resultant structure is then diced without forming any sealing film 33.

For example, in the manufacturing step shown in FIG. 10, the sealing films 33 and 36 may be simultaneously formed from the same sealing material in a region where the sealing films 33 and 36 are to be formed. The upper surfaces of the sealing films 33 and 36 (the sealing films are integrated without any boundary) may be polished into the state shown in FIG. 11.

Second Embodiment

Figure 51:
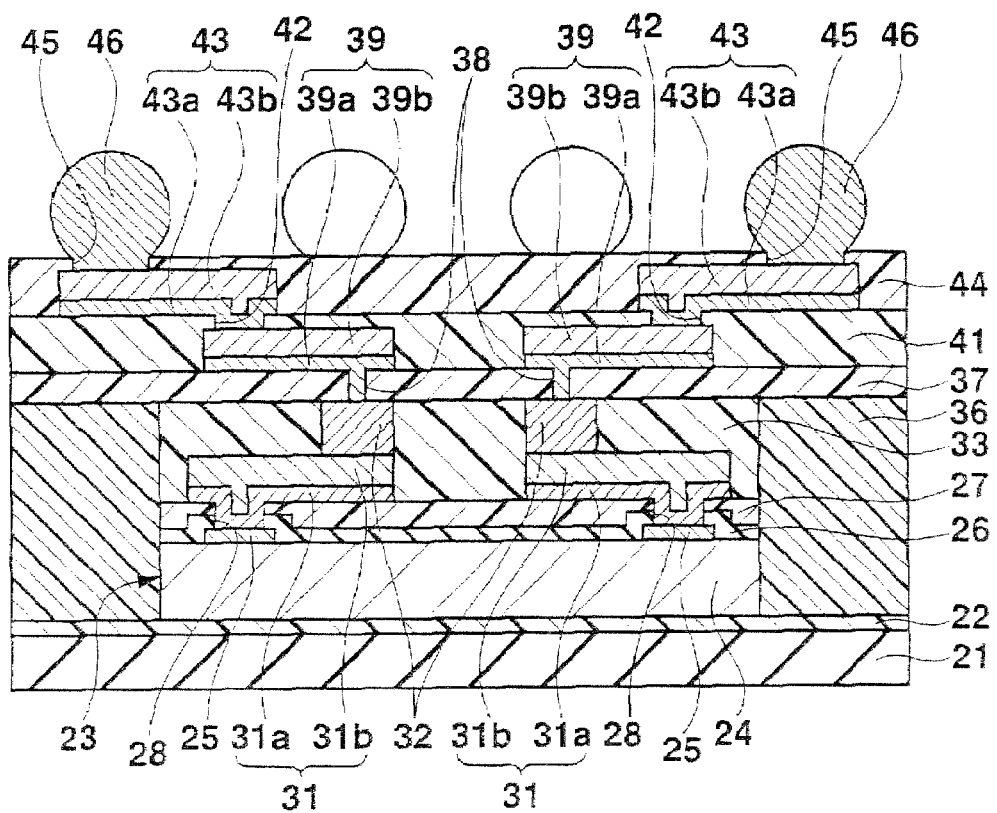
FIG. 51 is an enlarged sectional view showing a semiconductor device according to the second embodiment of the present invention.

FIG. 51 is a sectional view showing a semiconductor device according to the second embodiment of the present invention. The semiconductor device comprises a flat square base plate 21 made of silicon, glass, ceramic, a resin, a metal, or the like. An adhesive layer 22 is formed from an adhesive, pressure sensitive adhesive sheet, double-sided adhesive tape, or the like on the upper surface of the base plate 21.

The lower surface of a flat square semiconductor construction assembly 23 slightly smaller in size than the base plate 21 is adhered to the upper center surface of the adhesive layer 22. The semiconductor construction assembly 23 is identical to that described in the first embodiment of the present invention. The same reference numerals denote the same parts, and a description thereof will be omitted.

An epoxy resin sealing film (insulating film) 36 is formed on the upper surface of the adhesive layer 22 around the semiconductor construction assembly 23 such that the upper surface of the sealing film 36 becomes flush with that of a sealing film 33. A first upper insulating film 37 made of photosensitive or non-photosensitive polyimide or the like is formed on the upper surfaces of the sealing films 33 and 36 and the upper surfaces of columnar electrodes 32. Openings 38 are formed at portions of the first upper insulating film 37 that correspond to the upper center surfaces of the columnar electrodes 32. First upper distribution wires 39 each comprised of a first lower metal layer 39a and a first upper metal layer 39b formed on the first lower metal layer 39a are formed from the upper surfaces of the columnar electrodes 32 that are exposed via the openings 38 to predetermined portions on the upper surface of the first upper insulating film 37.

A second upper insulating film 41 made of photosensitive or non-photosensitive polyimide or the like is formed on the entire upper surface of the first upper insulating film 37 including the first upper distribution wires 39. Openings 42 are formed at portions of the second upper insulating film 41 that correspond to the connection pads of the first upper distribution wires 39. Second upper distribution wires 43 each comprised of a second lower metal layer 43a and a second upper metal layer 43b formed on the second lower metal layer 43a are formed from the upper surfaces of the connection pads of the first upper distribution wires 39 that are exposed via the openings 42 to predetermined portions on the upper surface of the second upper insulating film 41.

A third upper insulating film 44 made of photosensitive or non-photosensitive polyimide or the like is formed on the entire upper surface of the second upper insulating film 41 including the second upper distribution wires 43. Openings 45 are formed at portions of the third upper insulating film 44 that correspond to the connection pads of the second upper distribution wires 43. Solder balls (projecting connection terminals) 46 are formed in and on the openings 45, and connected to the connection pads of the second upper distribution wires 43. A plurality of solder balls 46 are arrayed in a matrix on the third upper insulating film 44.

The base plate 21 is slightly larger in size than the semiconductor construction assembly 23 in order to set the arrangement region of the solder balls 46 slightly larger than the size of the semiconductor construction assembly 23 in accordance with an increase in the number of connection pads 25 on the silicon substrate 24 and set the size and arrangement interval of the connection pads 25 larger than those of the columnar electrodes 32.

The connection pads (portions in the openings 45 of the third upper insulating film 44) of the second upper distribution wires 43 that are arrayed in a matrix are arranged not only in a region corresponding to the semiconductor construction assembly 23, but also in the region of the sealing film 36 around the semiconductor construction assembly 23. Of the solder balls 46 arrayed in a matrix, at least the outermost solder balls 46 are arranged around the semiconductor construction assembly 23.

In this case, as a modification, all the connection pads of the second upper distribution wires 43 may be arranged around the semiconductor construction assembly 23. The upper distribution wire can be formed from only one layer, i.e., the first distribution wire 39, and at least the outermost connection pads can be arranged around the semiconductor construction assembly 23.

According to the present invention, the first upper insulating film 37 which covers the upper surface of the semiconductor construction assembly 23, the first upper distribution wires 39 which are connected to the columnar electrodes 32 via the openings 38 formed in the first upper insulating film 37, and the sealing film 36 which covers the side surface of the semiconductor construction assembly 23 are formed on the semiconductor construction assembly 23 in which not only the connection pads 25 and insulating film 26, but also the protective film 27, distribution wires 31, columnar electrodes 32, sealing film 33, and the like are formed on the silicon substrate 24.

In general, a columnar electrode must be as high as 100 to 200 μm in order to reduce the stress on the columnar electrode that is caused by the difference in thermal expansion coefficient between a silicon substrate and a circuit board. As described above, in the present invention, the first upper distribution wire 39 and first upper insulating film 37 are formed on the columnar electrode 32. Since the first upper distribution wire 39 and first upper insulating film 37 function to relax the stress, the columnar electrode 32 can be designed as low as about 50 to 100 μm. As the columnar electrode 32 is higher, stress relaxation operation is enhanced. The columnar electrode 32 may be formed at the conventional height depending on the circuit board to be bonded.

An example of a semiconductor device manufacturing method will be explained. The semiconductor construction assembly 23 and the like are first formed in the steps shown in FIGS. 2 to 8 according to the first embodiment.

Figure 52:
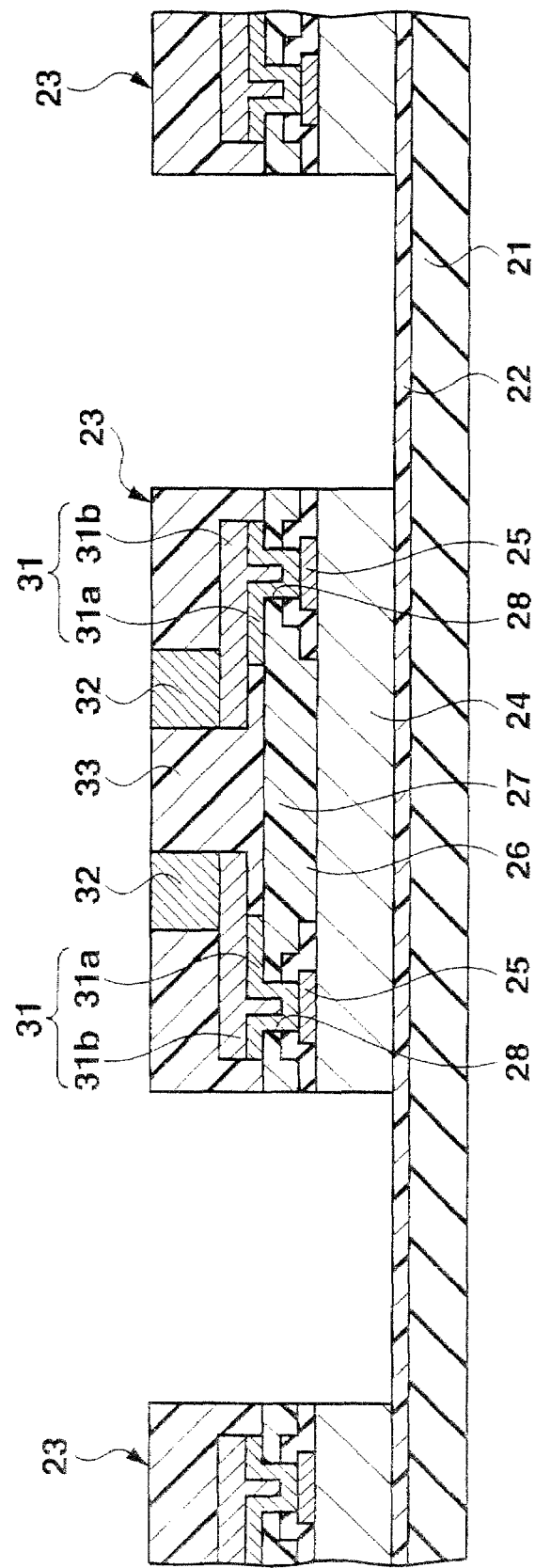
FIG. 52 is an enlarged sectional view showing an initial manufacturing step for the semiconductor device shown in FIG. 51.
Figure 53:
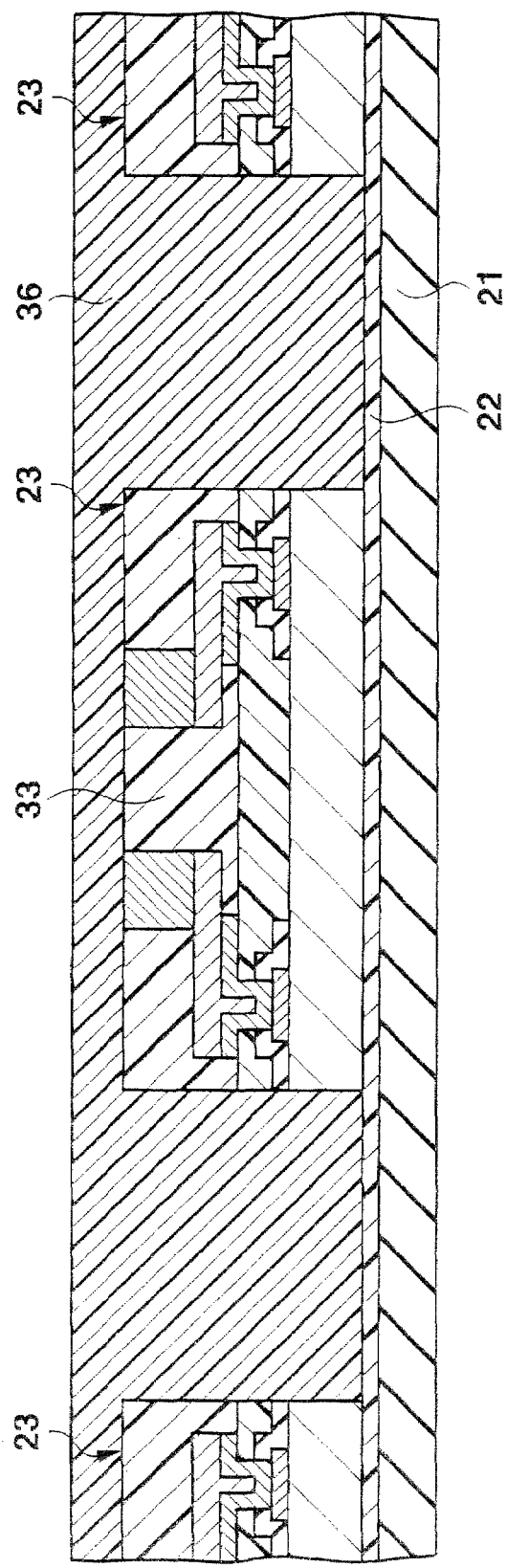
FIG. 53 is an enlarged sectional view showing a manufacturing step subsequent to FIG. 52.
Figure 54:
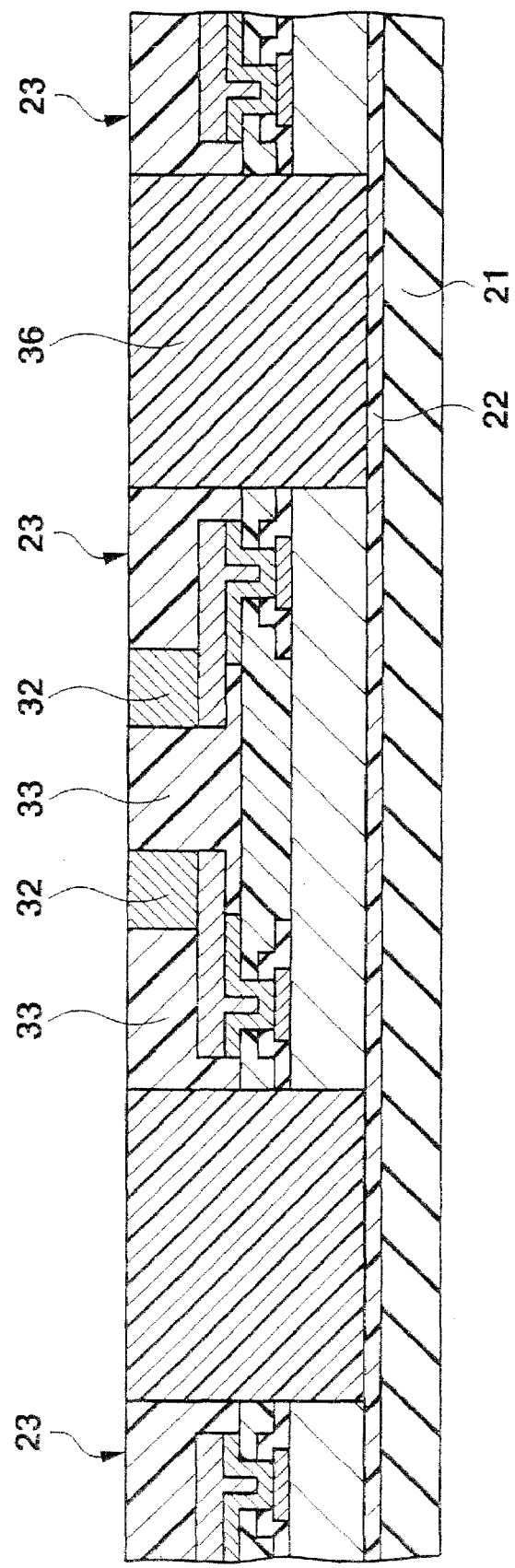
FIG. 54 is an enlarged sectional view showing a manufacturing step subsequent to FIG. 53.

As shown in FIG. 52, the lower surfaces of silicon substrates 24 of semiconductor construction assemblies 23 are adhered to predetermined portions on the upper surface of an adhesive layer 22. As shown in FIG. 53, a sealing film 36 made of polyimide, an epoxy resin, or the like is formed by printing on the upper surface of the adhesive layer 22 including the semiconductor construction assemblies 23 such that the thickness of the sealing film 36 becomes slightly larger than the height of the semiconductor construction assembly 23. In this state, the upper surface of the semiconductor construction assembly 23 is covered with the sealing film 36. The upper surfaces of the sealing film 36 and semiconductor construction assembly 23 are properly polished to expose the upper surfaces of columnar electrodes 32, as shown in FIG. 54.

Also in manufacturing the semiconductor construction assembly 23 shown in FIG. 52, a sealing film 33 is formed on the upper surface of the protective film 27 including the columnar electrodes 32 and distribution wires 31 such that the thickness of the sealing film 33 becomes slightly larger than the height of the columnar electrode 32, as described above. The upper surfaces of the sealing film 33 and columnar electrodes 32 are properly polished to expose the upper surfaces of the columnar electrodes. Hence, the polishing step is executed twice.

A case wherein the number of polishing steps can be decreased to one will be explained. A structure in which the semiconductor construction assembly 23 does not comprise any sealing film 33 in the state shown in FIG. 52 is prepared. That is, the protective film 27, distribution wires 31, and columnar electrodes 32 are formed on a semiconductor substrate in the wafer state on which the connection pads 25 and insulating film 26 are formed is formed. Thereafter, the resultant structure is diced without forming any sealing film 33.

In the step shown in FIG. 53, the sealing films 33 and 36 are simultaneously formed from the same sealing material in a region where the sealing films 33 and 36 are to be formed. The upper surface of the columnar electrode 32 is polished together with the sealing films 33 and 36 (the sealing films are integrated without any boundary). In other words, the number of polishing steps can be decreased to one by decreasing the number of sealing film formation steps to one.

When the polishing step is performed once, the heights of the columnar electrodes 32 of the semiconductor construction assembly 23 in the state shown in FIG. 52 vary owing to electroplating formation. When the polishing step is performed twice, the heights of the semiconductor construction assemblies 23 in the state shown in FIG. 52 become uniform. In the state shown in FIG. 52, the heights of the semiconductor construction assemblies 23 can be made uniform in advance.

At the end of the polishing step shown in FIG. 54, the same processes as the steps shown in FIGS. 12 to 18 can be performed to obtain a semiconductor device shown in FIG. 51.

As a method of manufacturing the semiconductor device shown in FIG. 51, the method of the first embodiment using another base plate 60 shown in FIGS. 19 and 20 can be applied.

As another semiconductor device manufacturing method of the second embodiment, the method of the first embodiment shown in FIGS. 21 and 22 can also be applied.

First Modification of Second Embodiment

Figure 55:
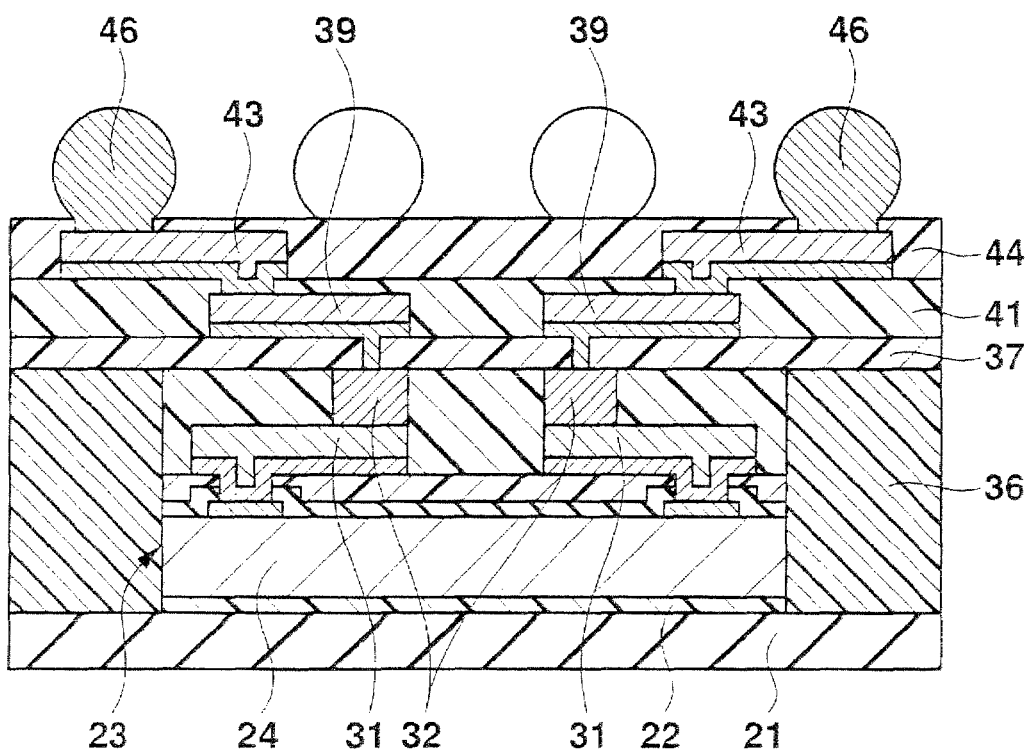
FIG. 55 is an enlarged sectional view showing the first modification to the semiconductor device according to the second embodiment of the present invention.

In the manufacturing step shown in FIG. 53, the adhesive layer 22 is formed on the lower surface of the silicon substrate 24 of the semiconductor construction assembly 23. The adhesive layer 22 is adhered to a predetermined portion on the upper surface of the base plate 21. In this case, a semiconductor device can be obtained as the first modification shown in FIG. 55 to the second embodiment of the present invention.

In the obtained semiconductor device, the lower surface of the silicon substrate 24 is adhered to the upper surface of the base plate 21 via the adhesive layer 22. The side surface of the silicon substrate 24 or the like is connected to the upper surface of the base plate 21 via the sealing film 36. The bonding strength of the semiconductor construction assembly 23 to the base plate 21 can be increased to a certain degree.

Second Modification of Second Embodiment

Figure 56:
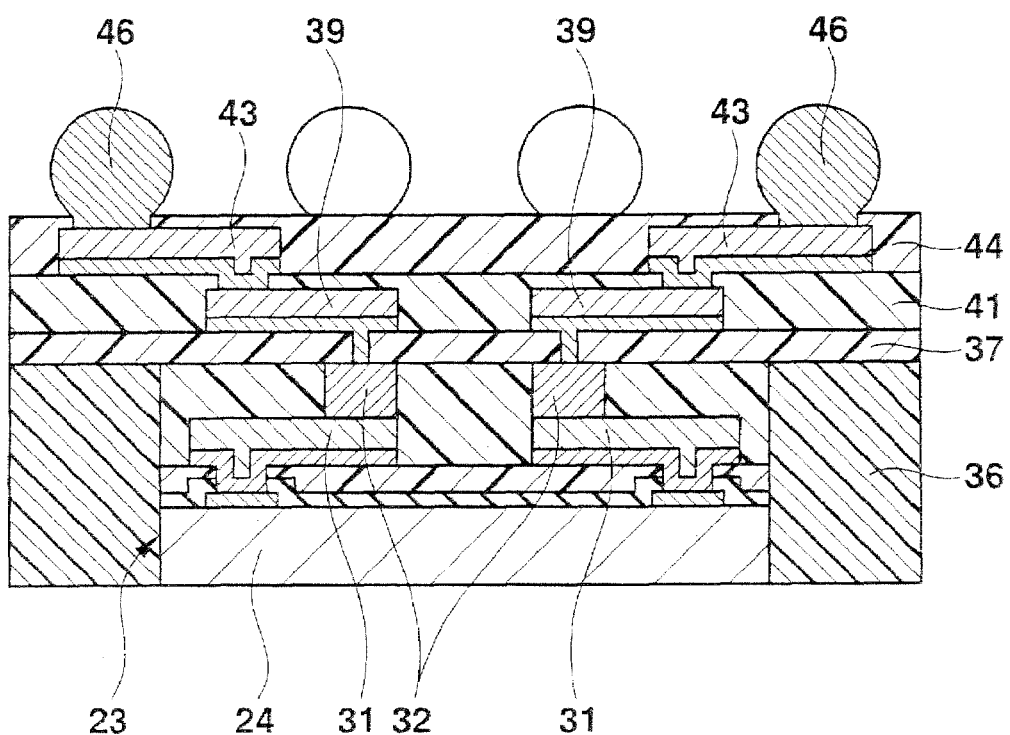
FIG. 56 is an enlarged sectional view showing the second modification to the semiconductor device according to the second embodiment of the present invention.

FIG. 56 is a sectional view showing a semiconductor device according to the second modification to the second embodiment of the present invention. This semiconductor device is different from the semiconductor device shown in FIG. 51 in the absence of the base plate 21 and adhesive layer 22.

In manufacturing the semiconductor device according to the second modification to the second embodiment, the base plate 21 is peeled from the adhesive layer 22, or the base plate 21 and adhesive layer 22 are removed by polishing, etching, or the like after the solder balls 46 are formed, as shown in FIG. 56. The three insulating films 44, 41, and 37 and the sealing film 36 are cut between adjacent semiconductor construction assemblies 23, obtaining a plurality of semiconductor devices shown in FIG. 56. The obtained semiconductor device does not comprise any base plate 21 and adhesive layer 22, and can be made lower in profile.

Third Modification of Second Embodiment

Figure 57:
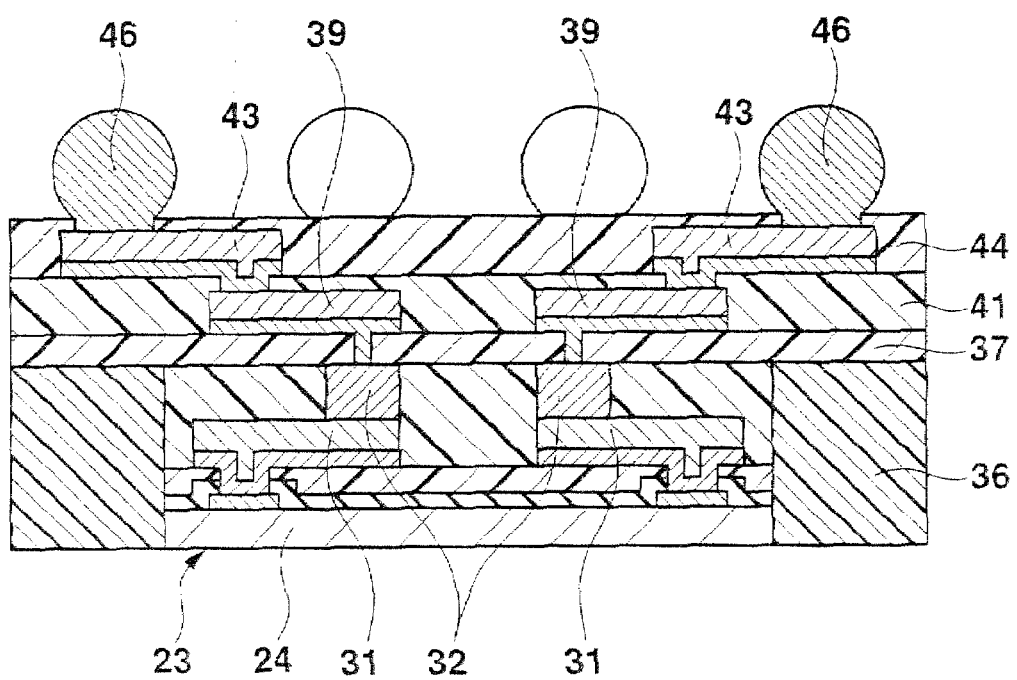
FIG. 57 is an enlarged sectional view showing the third modification to the semiconductor device according to the second embodiment of the present invention.

After the base plate 21 and adhesive layer 22 are removed by polishing, etching, or the like, the lower surfaces of the silicon substrate 24 and sealing film 36 are appropriately polished. The three upper insulating films 44, 41, and 37 and the sealing film 36 are cut between adjacent semiconductor construction assemblies 23, obtaining a plurality of semiconductor devices shown in FIG. 57 according to the third modification to the second embodiment of the present invention. The obtained semiconductor device can be made much lower in profile.

Before the solder balls 46 are formed, the base plate 21 and adhesive layer 22 may be removed by polishing, etching, or the like. (If necessary, the lower surfaces of the silicon substrate 24 and sealing film 36 are appropriately polished.) Thereafter, the solder balls 46 may be formed, and the three upper insulating films 44, 41, and 37 and the sealing film 36 may be cut between adjacent semiconductor construction assemblies 23.

Fourth Modification of Second Embodiment

Figure 58:
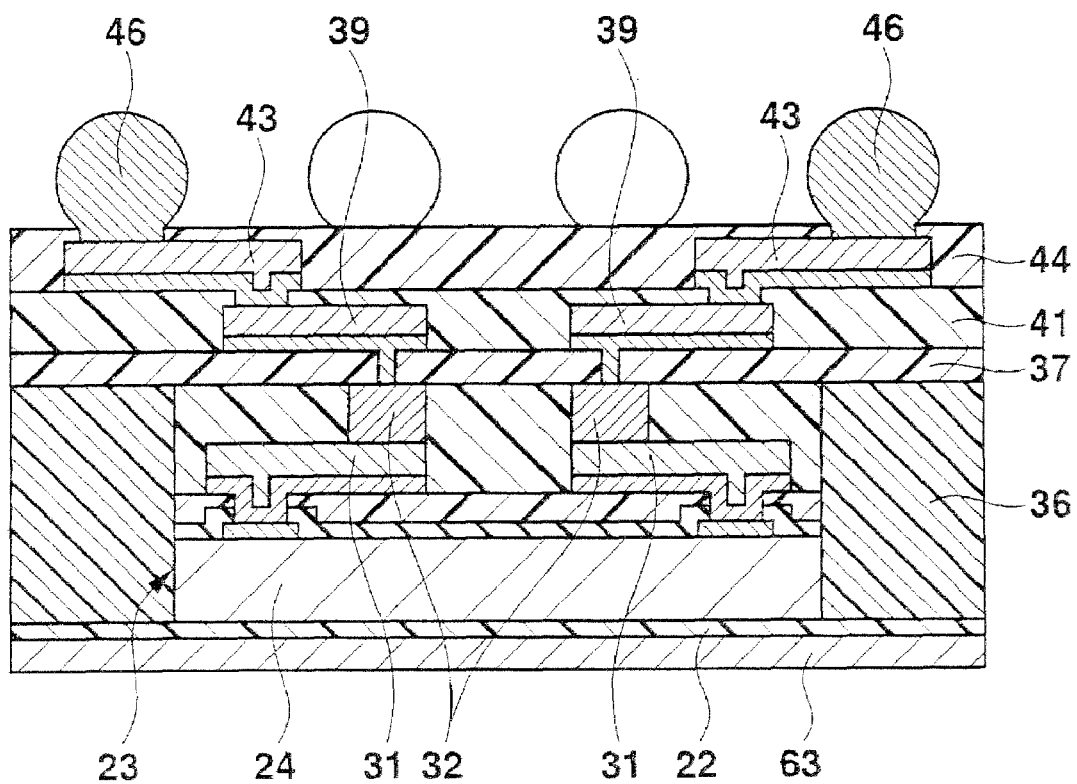
FIG. 58 is an enlarged sectional view showing the fourth modification to the semiconductor device according to the second embodiment of the present invention.

FIG. 58 is a sectional view showing a semiconductor device according to the fourth modification to the second embodiment of the present invention. This semiconductor device is different from the semiconductor device shown in FIG. 51 in that a heat dissipation metal layer 63 is adhered to the lower surface of the adhesive layer 22. The metal layer 63 is made of, e.g., copper foil several ten μm in thickness.

In manufacturing the semiconductor device according to the fourth modification to the second embodiment, the base plate 21 is removed by polishing, etching, or the like after the solder balls 46 are formed, as shown in FIG. 10. The metal layer 63 is adhered to the entire lower surface of the adhesive layer 22. The three upper insulating films 44, 41, and 37, the sealing film 36, the adhesive layer 22, and the metal layer 63 are cut between adjacent semiconductor construction assemblies 23, obtaining a plurality of semiconductor devices shown in FIG. 58.

The adhesive layer 22 may also be removed by polishing, etching, or the like. (If necessary, the lower surfaces of the silicon substrate 24 and sealing film 36 are appropriately polished.) The metal layer 63 may be adhered to the lower surfaces of the silicon substrate 24 and sealing film 36 via a new adhesive layer.

Fifth Modification of Second Embodiment

The structure may be cut for a set of two or more semiconductor construction assemblies 23. For example, as the fifth modification shown in FIG. 59 to the second embodiment of the present invention, the structure is cut for a set of three semiconductor construction assemblies 23, obtaining a multi-chip module semiconductor device. A set of three semiconductor construction assemblies 23 may be of the same type or different types.

Figure 59:
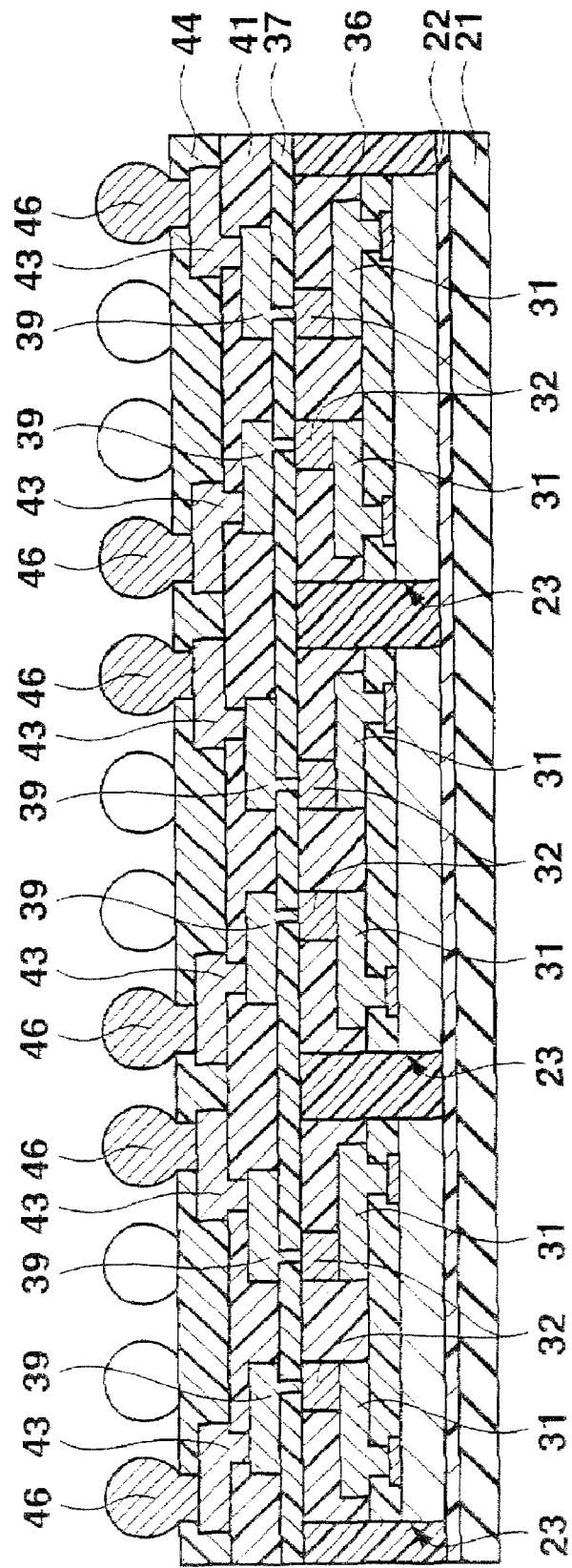
FIG. 59 is an enlarged sectional view showing the fifth modification to the semiconductor device according to the second embodiment of the present invention.

In FIG. 59, the lower metal layers of the distribution wires 31, 39, and 43 are omitted for illustrative convenience. Whether the connection pads (solder balls 46) of the second upper distribution wires 43 are arranged on the sealing film 36 around the semiconductor construction assembly 23 is not clear for illustrative convenience. In practice, the connection pads are arranged on the sealing film 36. This also applies to the following embodiment.

In FIG. 59, the semiconductor construction assembly 23 is adhered to the upper surface of the adhesive layer 22. Unlike conventional bonding, adhesive alignment does not require high precis on, and the arrangement interval between semiconductor construction assemblies 23 can be minimized. When the arrangement interval between semiconductor construction assemblies 23 is minimized, at least some of the second upper distribution wires 43 may be arranged on the sealing film 36.

Sixth Modification of Second Embodiment

Only the solder balls 46 are formed on the connection pads of the second upper distribution wires 43 in the case shown in FIG. 59, but the present invention is not limited to this. For example, as the sixth modification shown in FIG. 60 to the second embodiment of the present invention, connection pads 112 may be formed on the connection pads of the second upper distribution wires 43. The solder ball 46, a semiconductor chip 113 formed from an LSI or the like, and a chip component 114 formed from a capacitor or resistor may be arranged on the connection pads 112.

In this case, the semiconductor chip 113 and chip component 114 are arranged on the upper center surface of the third upper insulating film 44. The solder ball 46 is arranged at the periphery on the upper surface of the third upper insulating film 44. The semiconductor chip 113 is constituted by arranging a plurality of bump electrodes 113b at the periphery on the lower surface of a chip main body 113a. The bump electrodes 113b of the semiconductor chip 113 are electrically connected to the connection pads 112 via solder (not shown). A sealing material 115 is filled between the chip main body 113a and the third upper insulating film 44. Electrodes on the two sides of the chip component 114 are connected onto the connection pads 112 via solder members 116.

Seventh Modification of Second Embodiment

Figure 60:
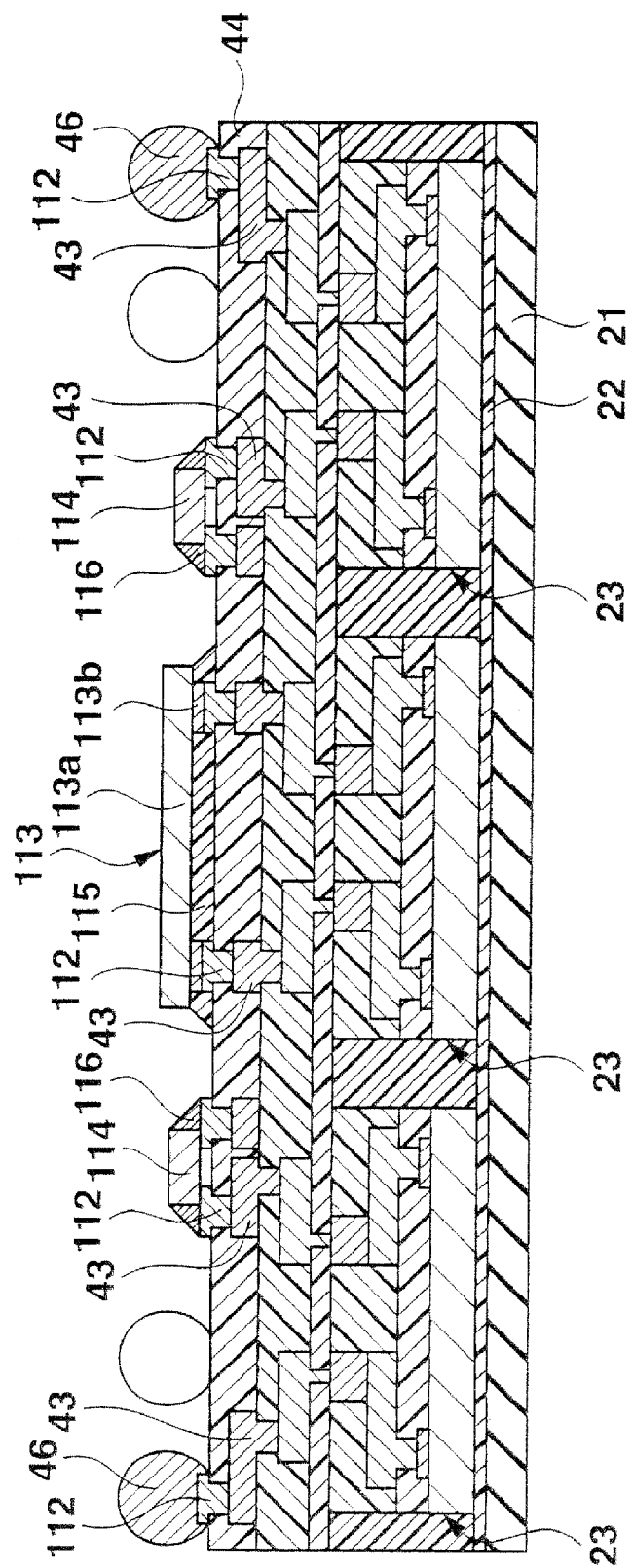
FIG. 60 is an enlarged sectional view showing the sixth modification to the semiconductor device according to the second embodiment of the present invention.
Figure 61:
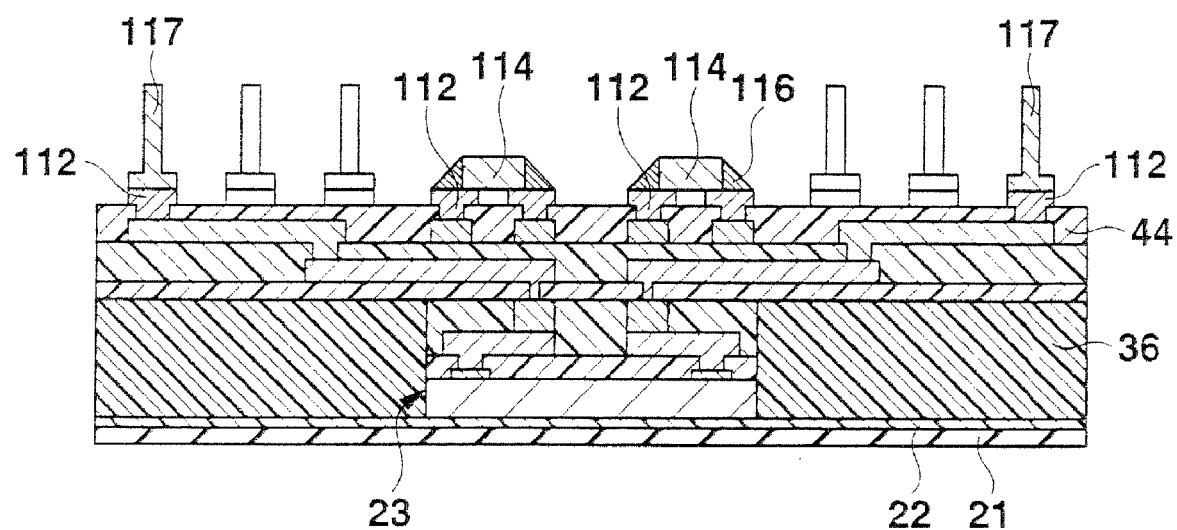
FIG. 61 is an enlarged sectional view showing the seventh modification to the semiconductor device according to the second embodiment of the present invention.

In FIG. 60, the chip component 114 and the like are mounted at the center of a structure formed from a set of three semiconductor construction assemblies 23, and the solder balls 46 are formed at the periphery. The present invention is not limited to this. For example, as the seventh modification shown in FIG. 61 to the second embodiment of the present invention, the size of the sealing film 36 around one semiconductor construction assembly 23 may be designed large to a certain degree. The chip component 114 and the like may be mounted on the connection pads 112 arranged at the center of the third upper insulating film 44. The lower portions of connection pins 117 may be connected to the connection pads 112 arranged at the periphery via solder members (not shown). The connection pins 117 are soldered to the connection pads 112. Although not shown, the connection pins 117 are inserted into through holes formed in a circuit board, and soldered to pads formed around the through holes on the lower surface.

Eighth Modification of Second Embodiment

Figure 62:
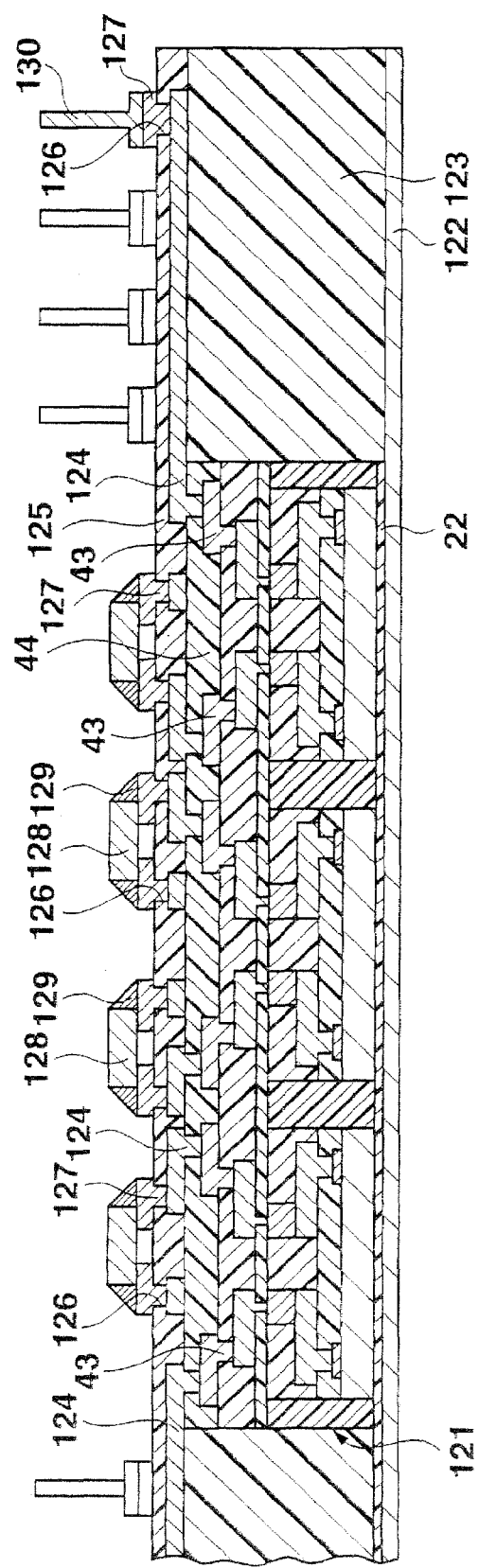
FIG. 62 is an enlarged sectional view showing the eighth modification to the semiconductor device according to the second embodiment of the present invention.

FIG. 62 is a sectional view showing a semiconductor device according to the eighth modification to the second embodiment of the present invention. The structure of the semiconductor device will be explained together with its manufacturing method. Referring to FIG. 59, a semiconductor device in which the base plate 21 is removed without forming any solder ball 46 in FIG. 59 is prepared. The prepared semiconductor device will be referred to as a semiconductor block 121.

The center of the upper surface of a heat dissipation metal plate 122 slightly larger in size than the semiconductor block 121 is adhered to the lower surface of the adhesive layer 22 of the semiconductor block 121. A sealing film 123 is formed by molding or printing on the upper surface of the metal plate 122 around the semiconductor block 121 such that the upper surface of the sealing film 123 becomes flush with that of the third upper insulating film 44 of the semiconductor block 121. The adhesive layer 22 may be removed, the metal plate 122 may be arranged in a mold, and the semiconductor block 121 may be arranged on the upper center surface of the metal plate 122.

Third upper distribution wires (including the third lower metal layers) 124 are formed on the upper surfaces of the third upper insulating film 44 and sealing film 123, and connected to the connection pads of the second upper distribution wires 43. A fourth upper insulating film 125 is formed on the upper surface of the third upper insulating film 44 including the third upper distribution wires 124. Openings 126 are formed at portions of the fourth upper insulating film 125 that correspond to the connection pads of the third upper distribution wires 124. Connection pads 127 are formed in the openings 126 and on the fourth upper insulating film 125 around the openings 126, and connected to the connection pads of the third upper distribution wires 124.

Electrodes on the two sides of each chip component 128 formed from a capacitor or resistor are connected via solder members 129 to the upper surfaces of the connection pads 127 on the semiconductor block 121. The lower portions of connection pins 130 are connected via solder (not shown) to the upper surfaces of the connection pads 127 on the sealing film 123, thus obtaining a semiconductor device shown in FIG. 62.

Ninth Modification to Second Embodiment

Figure 63:
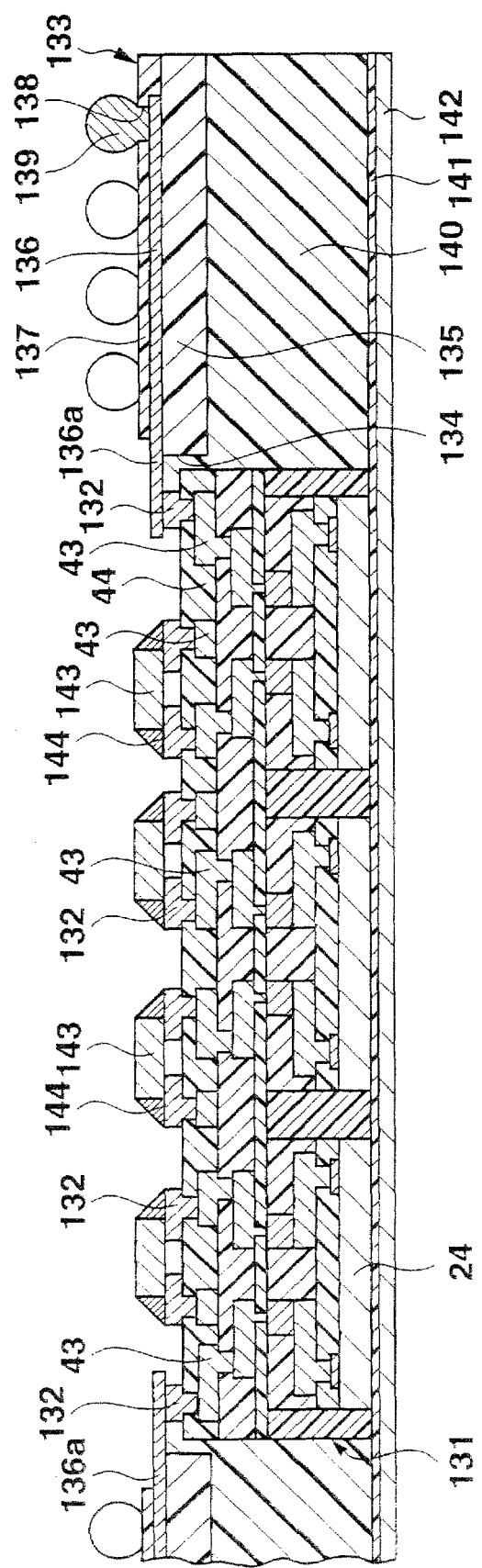
FIG. 63 is an enlarged sectional view showing the ninth modification to the semiconductor device according to the second embodiment of the present invention.

FIG. 63 is a sectional view showing a semiconductor device according to the ninth modification to the second embodiment of the present invention. The structure of the semiconductor device will be explained together with its manufacturing method. Also referring to FIG. 59, a semiconductor device in which the base plate 21 and adhesive layer 22 are removed without forming any solder ball 46 in FIG. 59 is prepared. The prepared semiconductor device will be referred to as a semiconductor block 131. For illustrative convenience, the arrangement of the second upper distribution wires (including the second lower metal layers) 43 is different between FIGS. 59 and 63. In FIG. 63, connection pads 132 are formed at predetermined portions on the upper surface of the third upper insulating film 44, and connected to the connection pads of the second upper distribution wires 43.

A flexible wiring board 133 is prepared. The flexible wiring board 133 comprises a film substrate 135 having at the center an opening 134 slightly larger in size than the semiconductor block 131. An interconnection 136 is formed on the upper surface of the film substrate 135. One end of the interconnection 136 projects into the opening 134, and serves as a connection terminal 136a. A protective film 137 is formed on the upper surface of the film substrate 135 including the interconnection 136. An opening 138 is formed at a portion of the protective film 137 that corresponds to the other end of the interconnection 136. A solder ball 139 is arranged on the other end of the interconnection 136 that is exposed via the opening 138. When the flexible wiring board 133 is prepared, no solder ball 139 is formed.

The connection terminal 136a of the flexible wiring board 133 is connected via solder (not shown) to the connection pad 132 arranged at the periphery on the semiconductor block 131. A sealing film 140 is formed by molding or printing on the lower surface of the flexible wiring board 133 around the semiconductor block 131 such that the lower surface of the sealing film 140 becomes flush with that of the silicon substrate 24 of the semiconductor block 131 or the like. A heat dissipation metal plate 142 is adhered via an adhesive layer 141 to the lower surface of the silicon substrate 24 of the semiconductor block 131 or the like and the lower surface of the sealing film 140.

Electrodes on the two sides of each chip component 143 formed from a capacitor or resistor are connected via solder members 144 to the upper surfaces of the connection pads 132 arranged at the center of the semiconductor block 131. A solder ball 139 is formed on the other end of the interconnection 136 of the flexible wiring board 133 that is exposed via the opening 138, obtaining a semiconductor device shown in FIG. 63.

10th Modification of Second Embodiment

Figure 64:
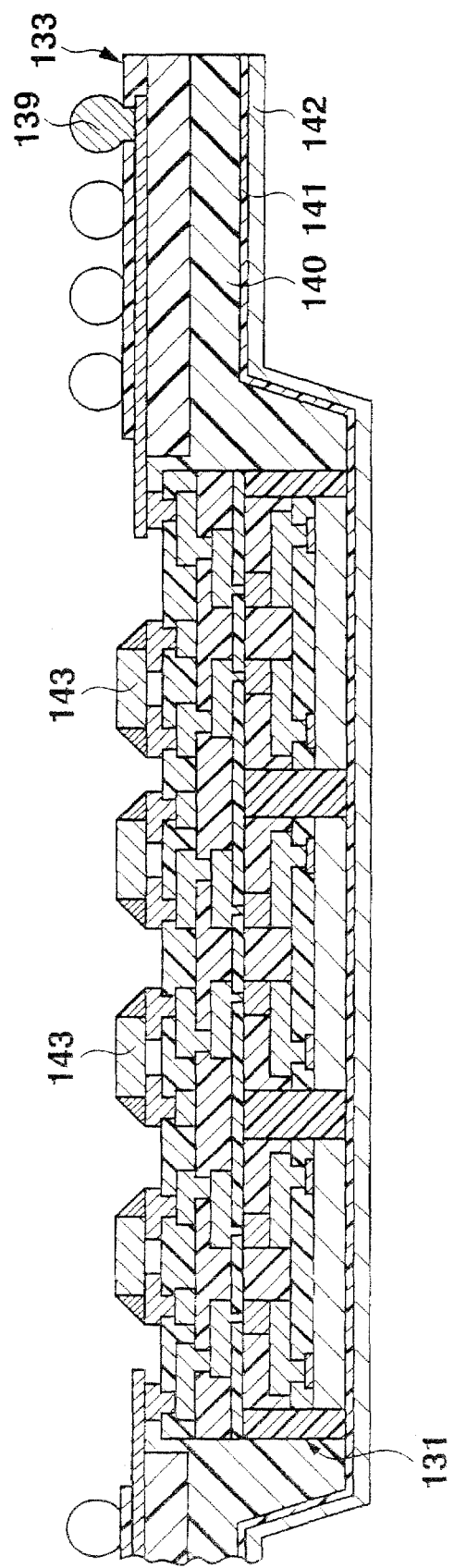
FIG. 64 is an enlarged sectional view showing the 10th modification to the semiconductor device according to the second embodiment of the present invention.

In the case shown in FIG. 63, the sealing film 140 at the periphery may be made thinner than the sealing film 140 near the circumferential surface of the semiconductor block 131, as the 10th modification shown in FIG. 64 to the second embodiment of the present invention. In this case, the sealing film 140 is formed by molding.

11th Modification of Second Embodiment

Figure 65:
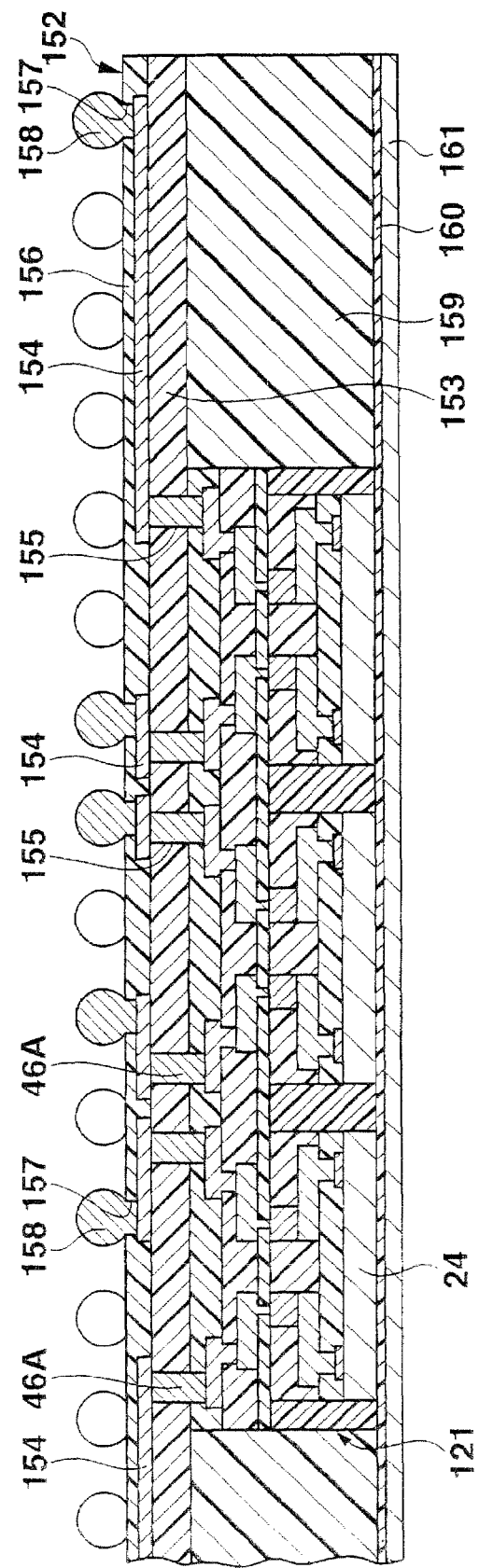
FIG. 65 is an enlarged sectional view showing the 11th modification to the semiconductor device according to the second embodiment of the present invention.

FIG. 65 is a sectional view showing a semiconductor device according to the 11th modification to the second embodiment of the present invention. The structure of the semiconductor device will be explained together with its manufacturing method. Also referring to FIG. 59, a semiconductor device in which the base plate 21 and adhesive layer 22 are removed in FIG. 59 is prepared. The prepared semiconductor device will be referred to as a semiconductor block 151. In this case, solder balls shown in FIG. 65 are slightly smaller in diameter than those shown in FIG. 59, and are formed as columnar solder bumps 46A.

A flexible wiring board 152 is prepared. The flexible wiring board 152 comprises a film substrate 153 which is slightly larger in size than the semiconductor block 151. Interconnections 154 are formed on the upper surface of the film substrate 153. A through hole 155 is formed at a portion of the film substrate 153 that corresponds to one end of each interconnection 154. A protective film 156 is formed on the upper surface of the film substrate 153 including the interconnections 154. An opening 157 is formed at a portion of the protective film 156 that corresponds to the other end of each interconnection 154. A solder ball 158 is arranged on the other end of the interconnection 154 that is exposed via the opening 157. When the flexible wiring board 152 is prepared, no solder ball 158 is formed.

The solder bumps 46A of the semiconductor block 151 are inserted into the through holes 155 of the flexible wiring board 152. Each solder bump 46A is connected to the lower surface of one end of a corresponding interconnection 154 in the through hole 155. A sealing film 159 is formed by molding or printing on the lower surface of the flexible wiring board 152 around the semiconductor block 151 such that the lower surface of the sealing film 159 becomes flush with that of the silicon substrate 24 of the semiconductor block 151 or the like.

A heat dissipation metal plate 161 is adhered via an adhesive layer 160 to the lower surface of the silicon substrate 24 of the semiconductor block 151 or the like and the lower surface of the sealing film 159. A solder ball 158 is formed on the other end of each interconnection 154 that is exposed via the opening 157 of the flexible wiring board 152. Accordingly, a semiconductor device shown in FIG. 65 is attained.

12th Modification of Second Embodiment

Figure 66:
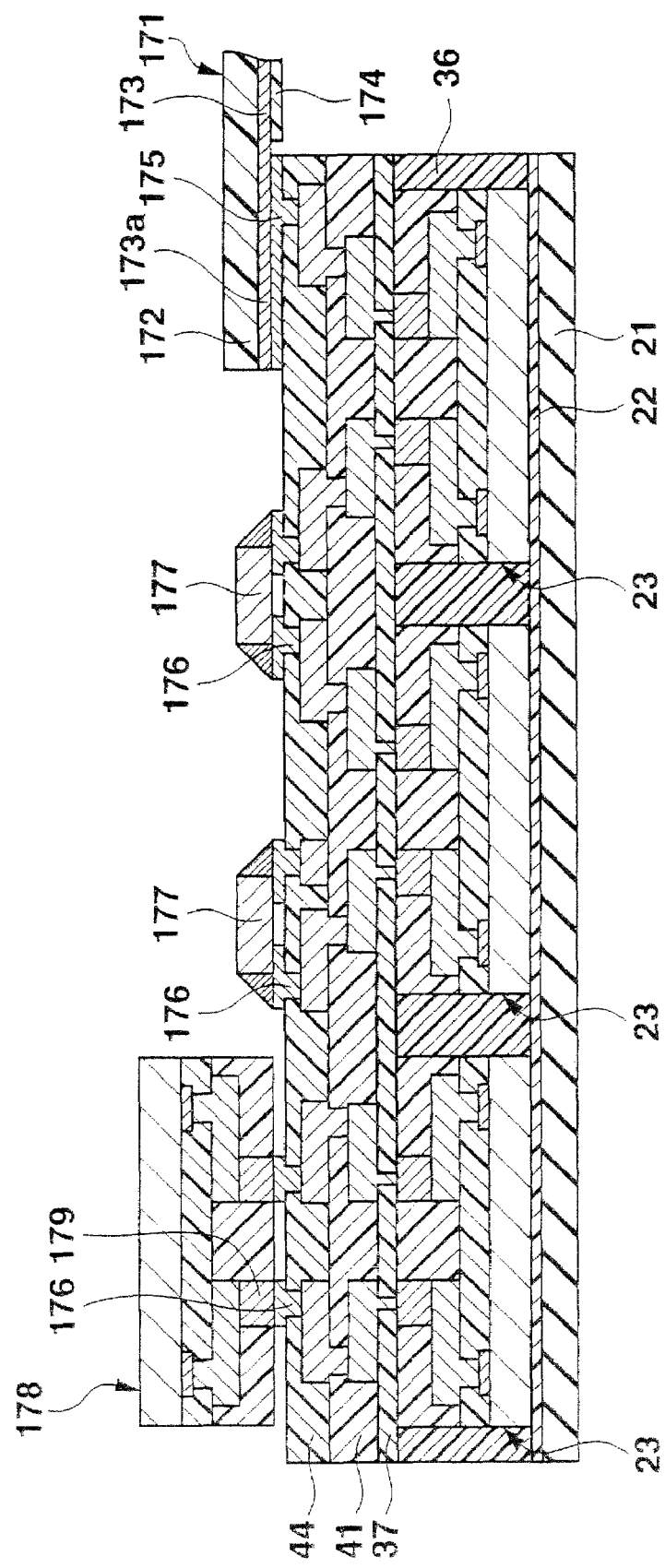
FIG. 66 is an enlarged sectional view showing the 12th modification to the semiconductor device according to the second embodiment of the present invention.

FIG. 66 is a sectional view showing a semiconductor device according to the 12th modification to the second embodiment of the present invention. This semiconductor device is greatly different from the semiconductor device shown in FIG. 59 in that no solder ball 46 is arranged but a flexible wiring board 171 is adopted instead.

On the flexible wiring board 171, an interconnection 173 is formed on one surface of a film substrate 172. A protective film 174 is formed on one surface of the film substrate 172 except connection terminals 173a (the other connection terminal 173a is not shown) formed from the two ends of the interconnection 173. A plurality of connection terminals 175 are formed at one end of the upper surface of the third upper insulating film 44, and connected to the connection pads of predetermined second upper distribution wires 43. One connection terminal 173a of the flexible wiring board 171 is connected to the connection terminal 175 via an anisotropic conductive adhesive or solder (not shown).

Connection pads 176 are formed on the connection pads of the remaining second upper distribution wires 43. A chip component 177 formed from a capacitor or resistor and a CSP type semiconductor construction assembly 178 are mounted on the connection pads 176. In this case, the semiconductor construction assembly 178 can take the same structure as that of the semiconductor construction assembly 23. The lower surfaces of columnar electrodes 179 of the semiconductor construction assembly 178 are connected to the upper surfaces of the connection pads 176 via solder (not shown).

13th Modification of Second Embodiment

Figure 67:
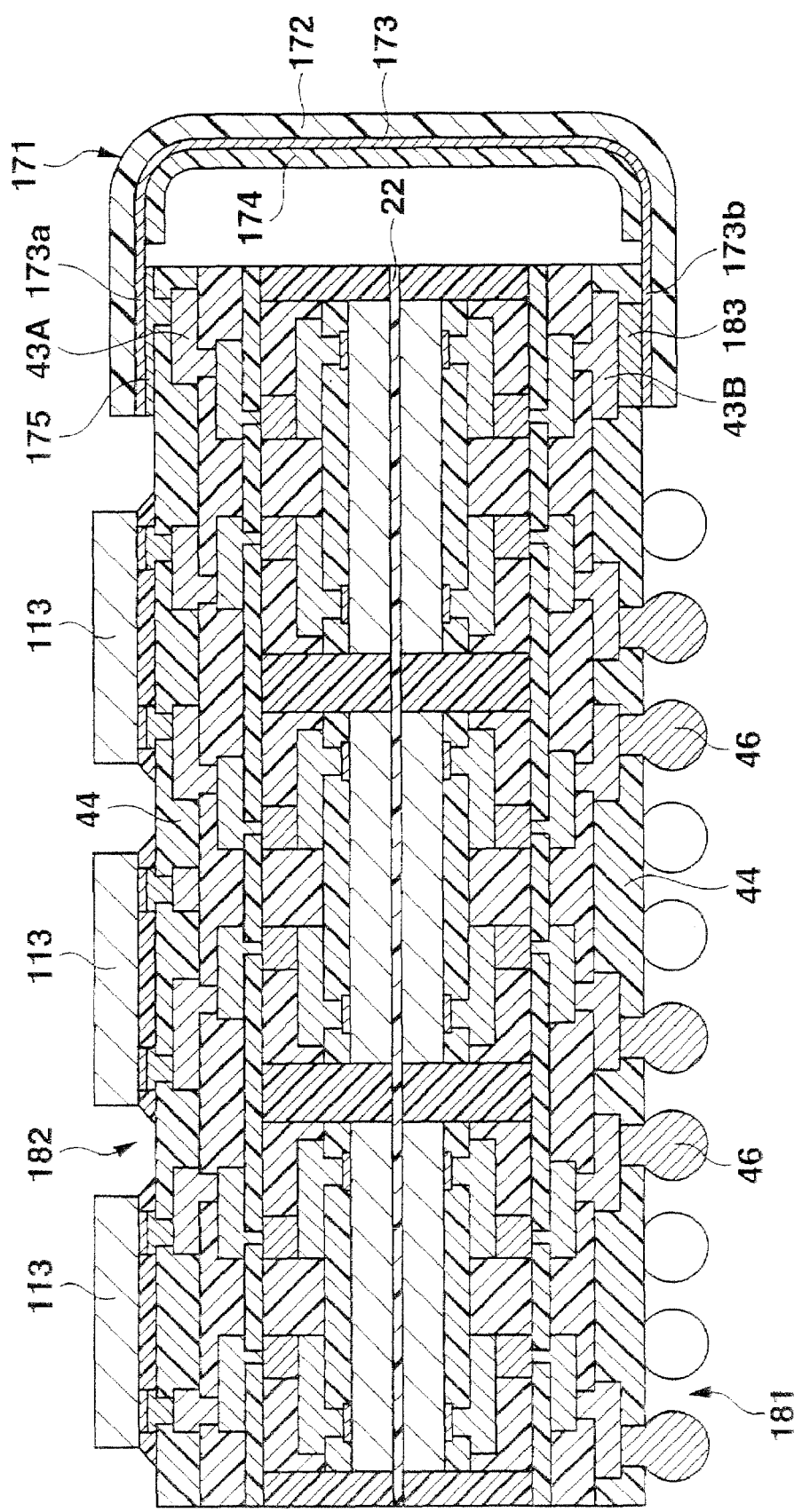
FIG. 67 is an enlarged sectional view showing the 13th modification to the semiconductor device according to the second embodiment of the present invention.

FIG. 67 is a sectional view showing a semiconductor device according to the 13th modification to the second embodiment of the present invention. In the semiconductor device, a semiconductor block 181 in which the base plate 21 is removed from the semiconductor device shown in FIG. 59, and a semiconductor block 182 in which the base plate 21 and adhesive layer 22 are removed from the semiconductor device shown in FIG. 60 without forming any solder ball 46 are adhered to each other via the adhesive layer 22. In this case, only a plurality of semiconductor chips 113 are mounted on the upper semiconductor block 182.

The semiconductor blocks 181 and 182 are connected to each other via, e.g., the flexible wiring board 171 as shown in FIG. 66. More specifically, a plurality of connection terminals 175 are formed at one end of the upper surface of the third upper insulating film 44 of the upper semiconductor block 182, and connected to the connection pads of predetermined second upper distribution wires 43A. One connection terminal 173a of the flexible wiring board 171 is connected to the connection terminal 175 via an anisotropic conductive adhesive or solder (not shown).

A connection terminal is formed from a predetermined second upper distribution wire 43B at one end of the lower surface of the third upper insulating film 44 of the lower semiconductor block 181. The other connection terminal 173b of the flexible wiring board 171 is connected via an anisotropic conductive adhesive (or solder) 183 to the connection terminal formed from a predetermined second upper distribution wire 43B.

14th Modification of Second Embodiment

Figure 68:
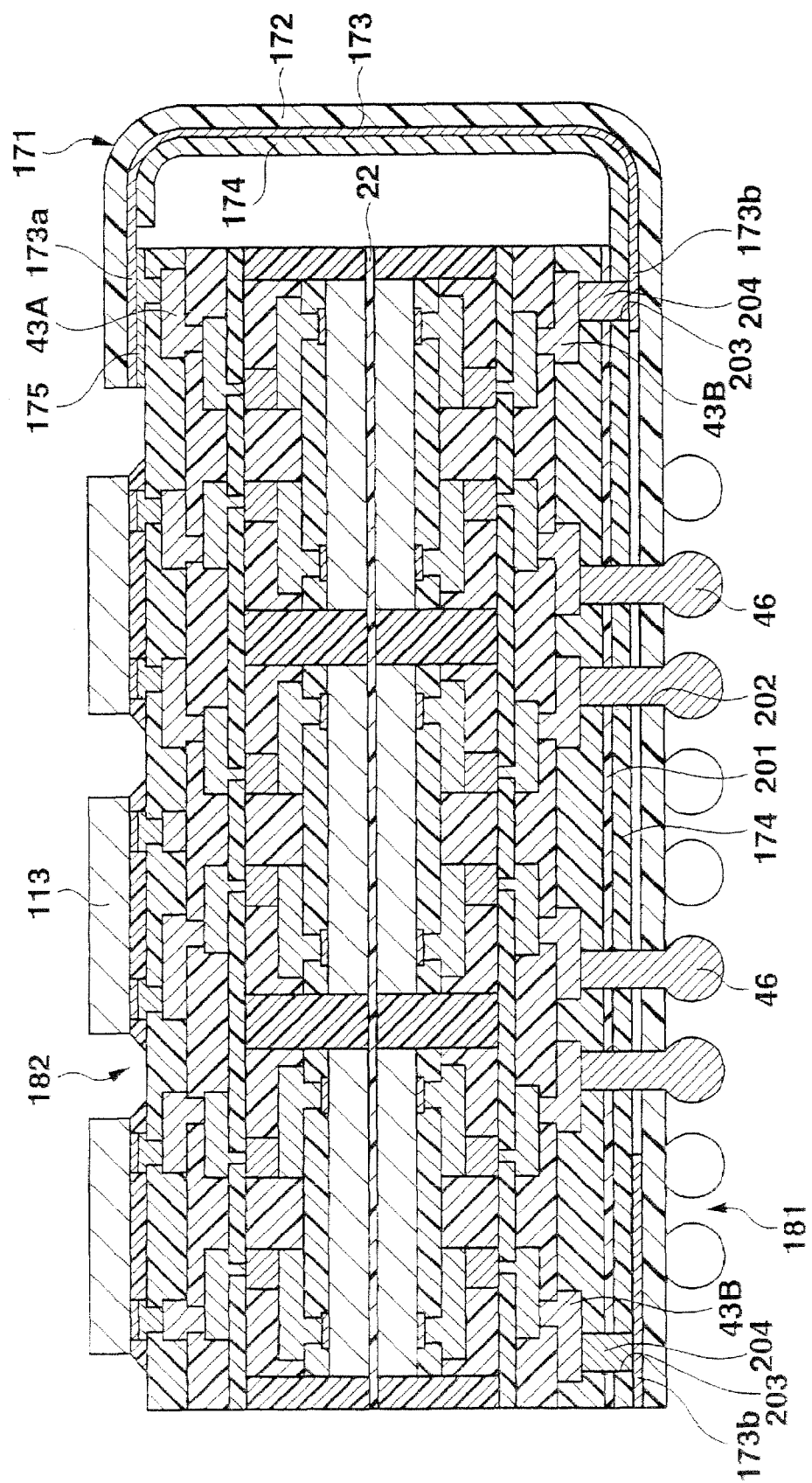
FIG. 68 is an enlarged sectional view showing the 14th modification to the semiconductor device according to the second embodiment of the present invention.

FIG. 68 is a sectional view showing a semiconductor device according to the 14th modification to the second embodiment of the present invention. This semiconductor device is greatly different from the semiconductor device shown in FIG. 67 in that the flexible wiring board 171 is made longer and connected to the lower surface of the third upper insulating film 44 of the lower semiconductor block 181 via an adhesive layer 201.

In this case, the solder balls 46 project outside the film substrate 172 via openings 202 formed in the adhesive layer 201, protective film 174, and film substrate 172. The other connection terminal 173b of the flexible wiring board 171 is connected to connection terminals formed from predetermined second upper distribution wires 43B at the two ends of the other semiconductor block 181, via solder members 204 arranged in openings 203 formed in the adhesive layer 201 and protective film 174.

Third Embodiment

Figure 69:
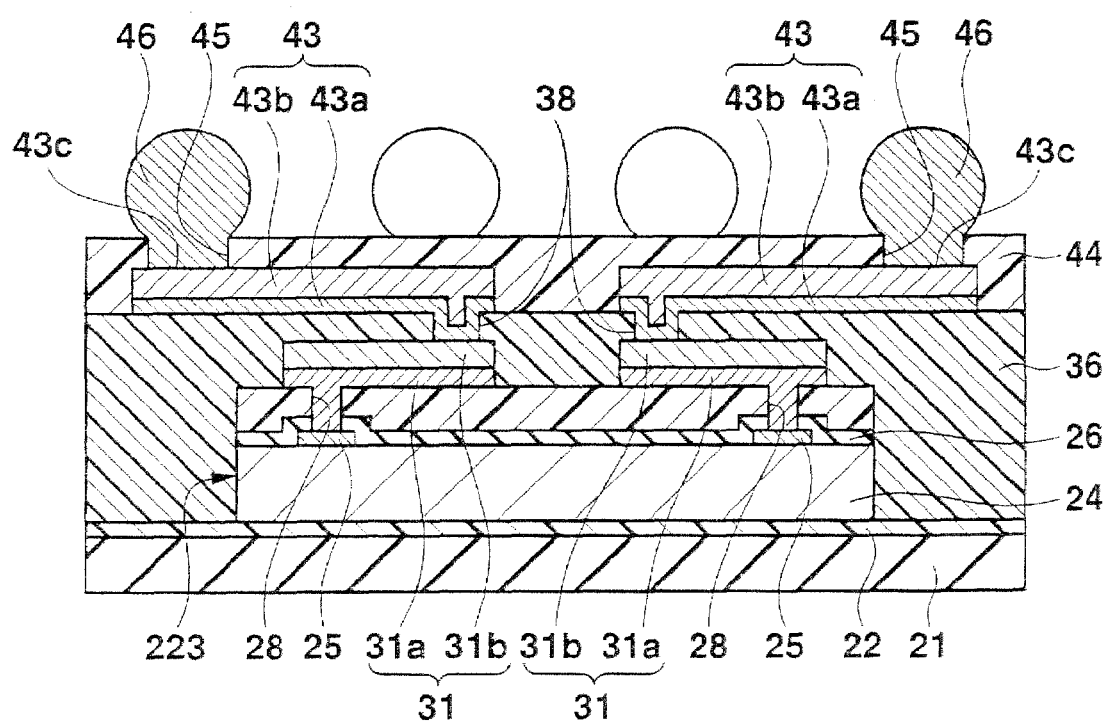
FIG. 69 is an enlarged sectional view showing a semiconductor device according to the third embodiment of the present invention.

FIG. 69 is a sectional view showing a semiconductor device according to the third embodiment of the present invention. The semiconductor device comprises a flat square base plate 21 made of silicon, glass, ceramic, a resin, a metal, or the like. An adhesive layer 22 is formed from an adhesive, pressure sensitive adhesive sheet, double-sided adhesive tape, or the like on the upper surface of the base plate 21. The lower surface of a flat square semiconductor construction assembly 223 slightly smaller in size than the base plate 21 is adhered to the upper center surface of the adhesive layer 22.

The semiconductor construction assembly 223 comprises a silicon substrate 24, a plurality of connection pads 25 which are formed at the periphery on the upper surface of the silicon substrate 24, an insulating film 26 which is made of silicon oxide or the like and formed on the upper surface of the silicon substrate 24 and has openings 28 for exposing the centers of the connection pads 25, a protective film 27 which is made of photosensitive or non-photosensitive polyimide or the like, and distribution wires 31 which are formed from the upper surfaces of the connection pads 25 exposed via the openings 28 in the protective film 27 to predetermined portions on the upper surface of the protective film 27. Each distribution wire 31 has a layered structure of a lower metal layer 31a and an upper metal layer 31b formed on the lower metal layer 31a.

In FIG. 69, only the lower metal layer 31a is formed in the opening 28 of the protective film 27 for illustrative convenience. In practice, the upper metal layer 31b is also formed.

An epoxy resin sealing film (insulating film) 36 is formed on the upper surface of the protective film 27 including the distribution wires 31 of the semiconductor construction assembly 223 and the upper surface of the adhesive layer 22 around the semiconductor construction assembly 223. Openings 38 are formed at portions of the sealing film 36 that corresponds to the pads of the distribution wires 31. Upper underlying metal layers 43a are formed from the upper surfaces of the pads of the distribution wires 31 that are exposed via the openings 38 to predetermined portions on the upper surface of the sealing film 36. Upper metal layers 43b are formed on the entire upper surfaces of the upper underlying metal layers 43a. The upper underlying metal layers 43a and upper metal layers 43b form distribution wires 43.

An insulating film 44 made of a solder resist or the like is formed on the entire upper surface of the sealing film 36 including the upper distribution wires 43. Openings 45 are formed at portions of the insulating film 44 that correspond to connection pads 43c of the upper distribution wires 43. Solder balls 46 are formed in and on the openings 45, and connected to the connection pads 43c of the upper distribution wires 43. A plurality of solder balls 46 are arrayed in a matrix on the insulating film 44.

The base plate 21 is slightly larger in size than the semiconductor construction assembly 223 in order to set the arrangement region of the solder balls 46 slightly larger than the size of the semiconductor construction assembly 223 in accordance with an increase in the number of connection pads 25 on the silicon substrate 24 and set the size and arrangement interval of the connection pads 43c larger than those of the connection pads 25.

The connection pads 43c of the upper distribution wires 43 that are arrayed in a matrix are arranged not only in a region corresponding to the semiconductor construction assembly 223, but also in a region corresponding to the film sealing film 36 around the semiconductor construction assembly 223. Of the solder balls 46 arrayed in a matrix, at least the outermost solder balls 46 are arranged around the semiconductor construction assembly 223.

Figure 70:
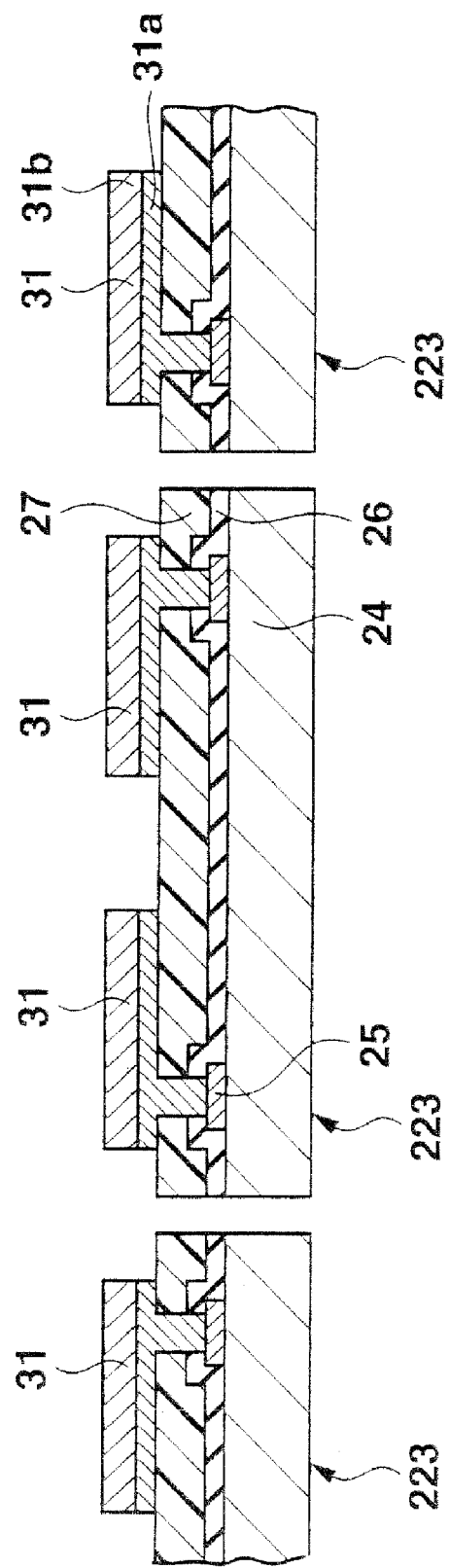
FIG. 70 is an enlarged sectional view for explaining a method of manufacturing the semiconductor device shown in FIG. 69.

An example of a semiconductor device manufacturing method will be explained. As shown in FIG. 70, by the steps shown in FIGS. 2 to 4 according to the first embodiment, aluminum connection pads 25, silicon oxide insulating films 26, and a photosensitive polyimide protective film 27 are formed on a silicon substrate 24 in the wafer state. Distribution wires 31 each constituted by stacking a lower metal layer 31a and upper metal layer 31b are formed on the protective film 27. A plating resist film 51 shown in FIG. 3 is peeled, and unnecessary portions of the lower metal layer 31a are etched using the upper metal layers 31b as a mask.

The resultant structure is diced into a plurality of semiconductor construction assemblies 223 shown in FIG. 70.

Figure 71:
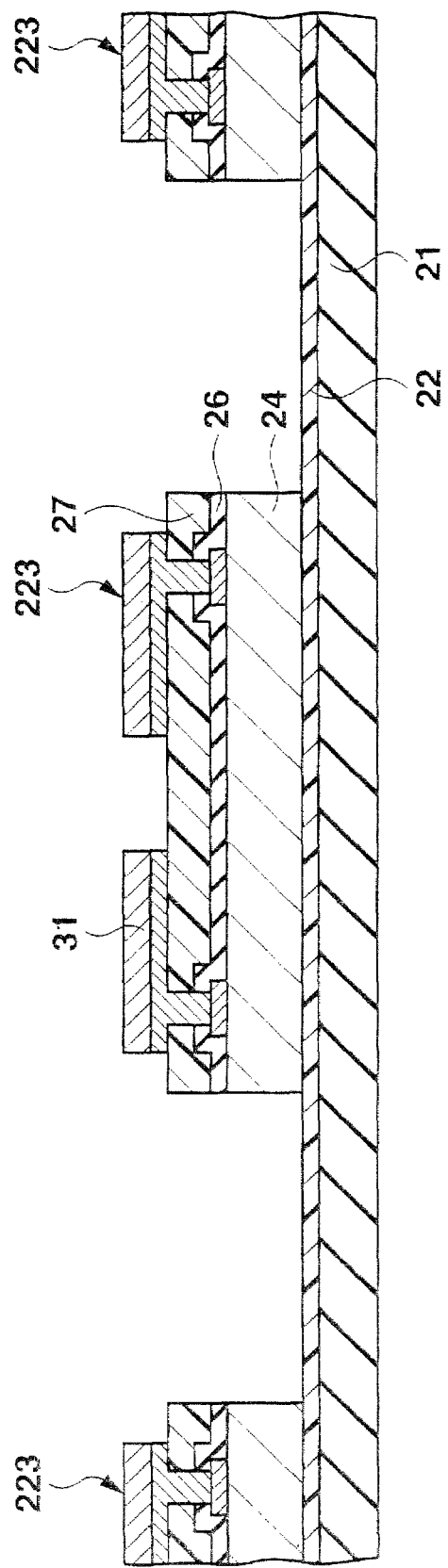
FIG. 71 is an enlarged sectional view showing a manufacturing step subsequent to FIG. 70.

As shown in FIG. 71, a structure in which an adhesive layer 22 is formed on the entire upper surface of a base plate 21 capable of forming a plurality of base plates 21 shown in FIG. 69 is prepared. The lower surfaces of the silicon substrates 24 of the semiconductor construction assemblies 223 are adhered to predetermined portions on the upper surface of the adhesive layer 22.

Figure 72:
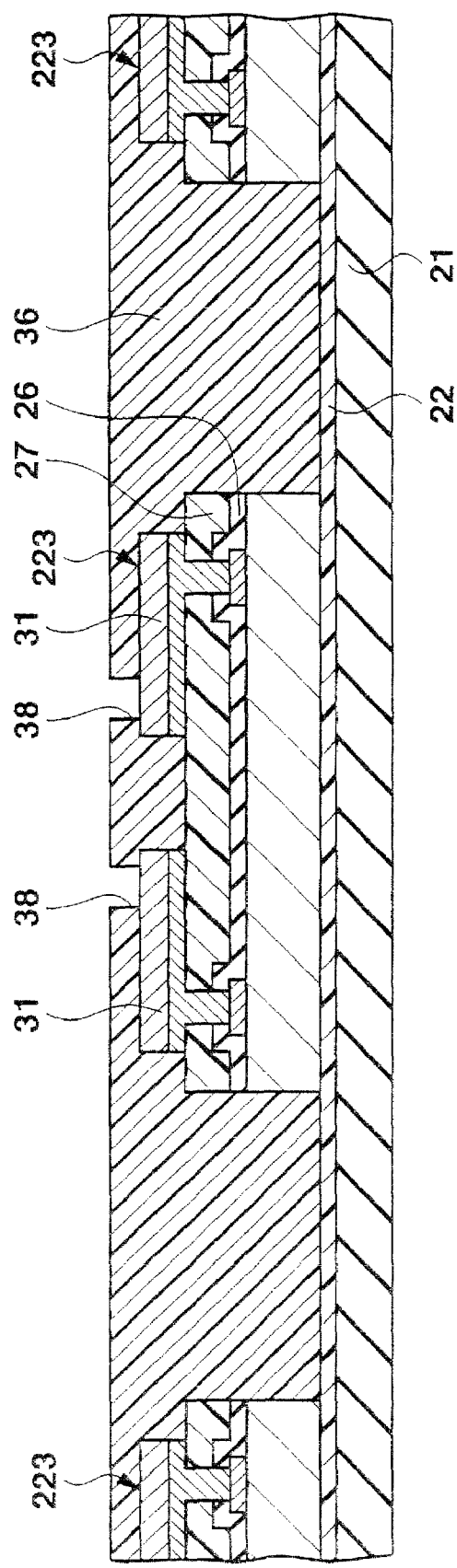
FIG. 72 is an enlarged sectional view showing a manufacturing step subsequent to FIG. 71.

As shown in FIG. 72, an epoxy resin sealing film 36 is formed by printing, molding, or the like on the entire upper surface of the adhesive layer 22 including a plurality of semiconductor construction assemblies 223 such that the thickness of the sealing film 36 becomes slightly larger than the height of the semiconductor construction assembly 223. In this state, the upper surface of the semiconductor construction assembly 223 is covered with the sealing film 36. If necessary, the upper surface of the sealing film 36 is properly polished and planarized. Openings 38 are formed by photolithography or $CO_2$ laser irradiation at portions of the sealing film 36 that correspond to the pads of the distribution wires 31.

Figure 73:
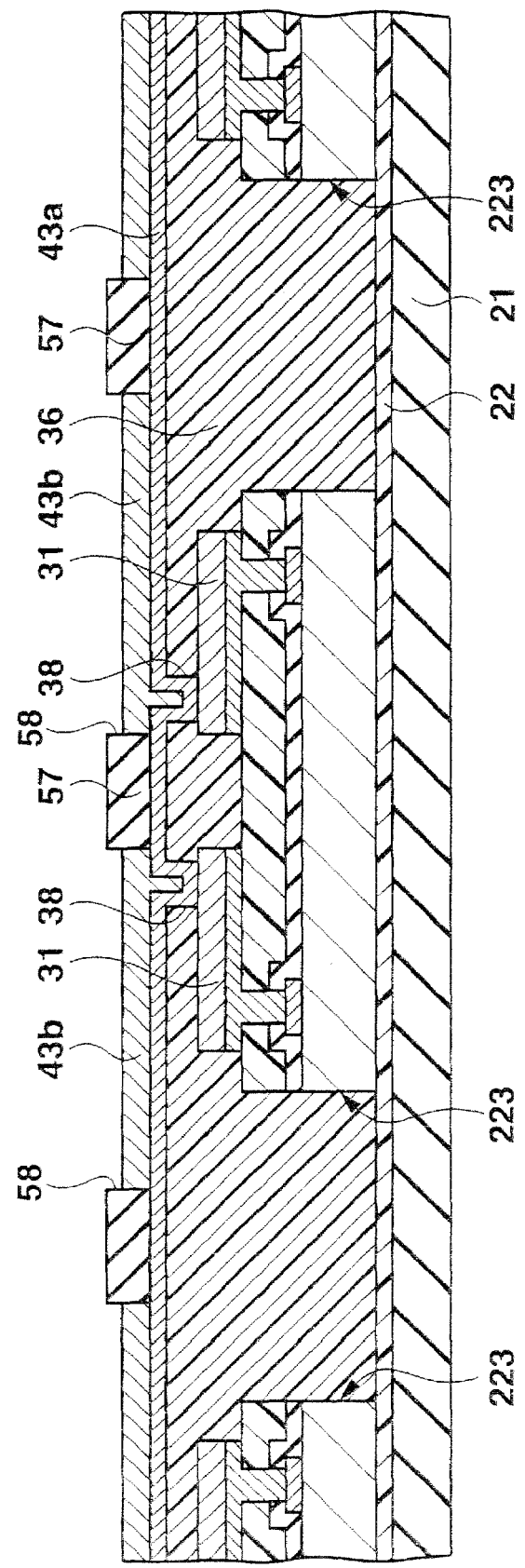
FIG. 73 is an enlarged sectional view showing a manufacturing step subsequent to FIG. 72.

As shown in FIG. 73, an upper underlying metal layer 43a is formed by electroless plating of copper on the entire upper surface of the sealing film 36 including the pads of the distribution wires 31 that are exposed via the openings 38. A plating resist film 57 is patterned on the upper surface of the upper underlying metal layer 43a. In this case, openings 58 are formed in the plating resist film 57 at portions corresponding to the formation regions of the upper distribution wires 43. Copper is electroplated using the upper underlying metal layer 43a as a plating current path, forming upper metal layers 43b on the upper surfaces of the upper underlying metal layers 43a in the openings 58 of the plating resist film 57.

Figure 74:
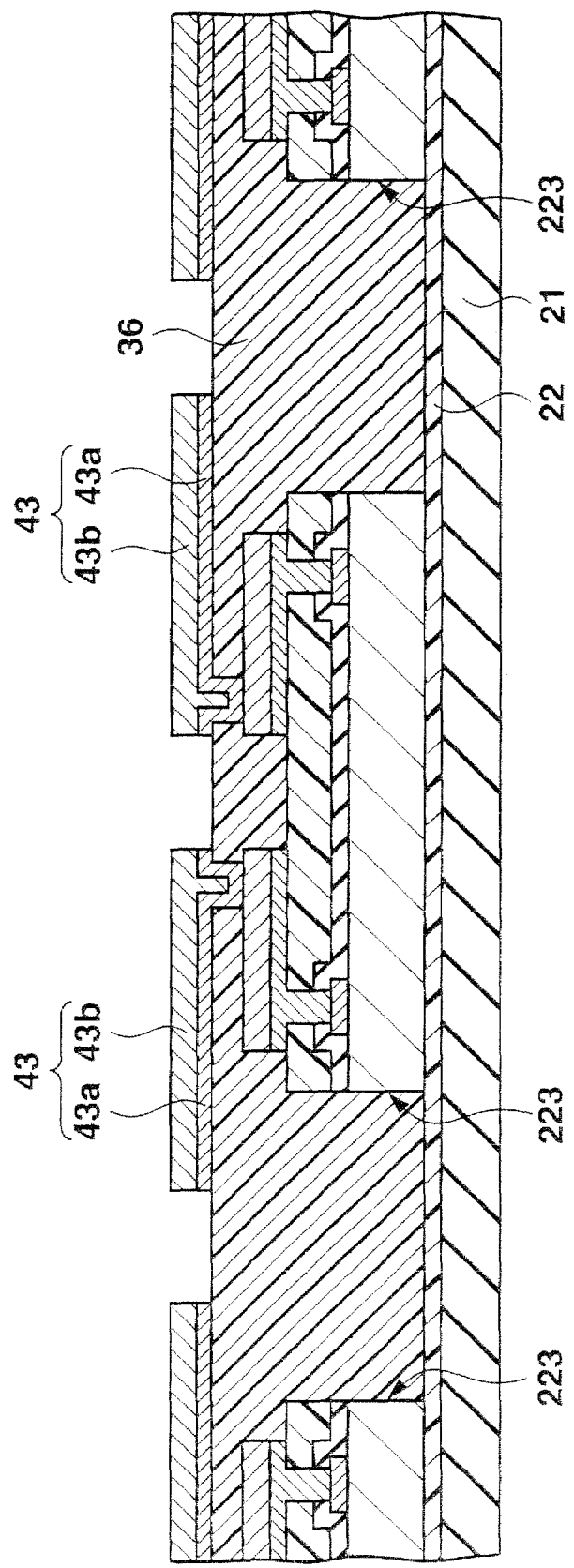
FIG. 74 is an enlarged sectional view showing a manufacturing step subsequent to FIG. 73.

The plating resist film 57 is peeled, and unnecessary portions of the upper underlying metal layer 43a are etched away using the upper metal layers 43b as a mask. As shown in FIG. 74, the upper underlying metal layers 43a remain only below the upper metal layers 43b.

Figure 75:
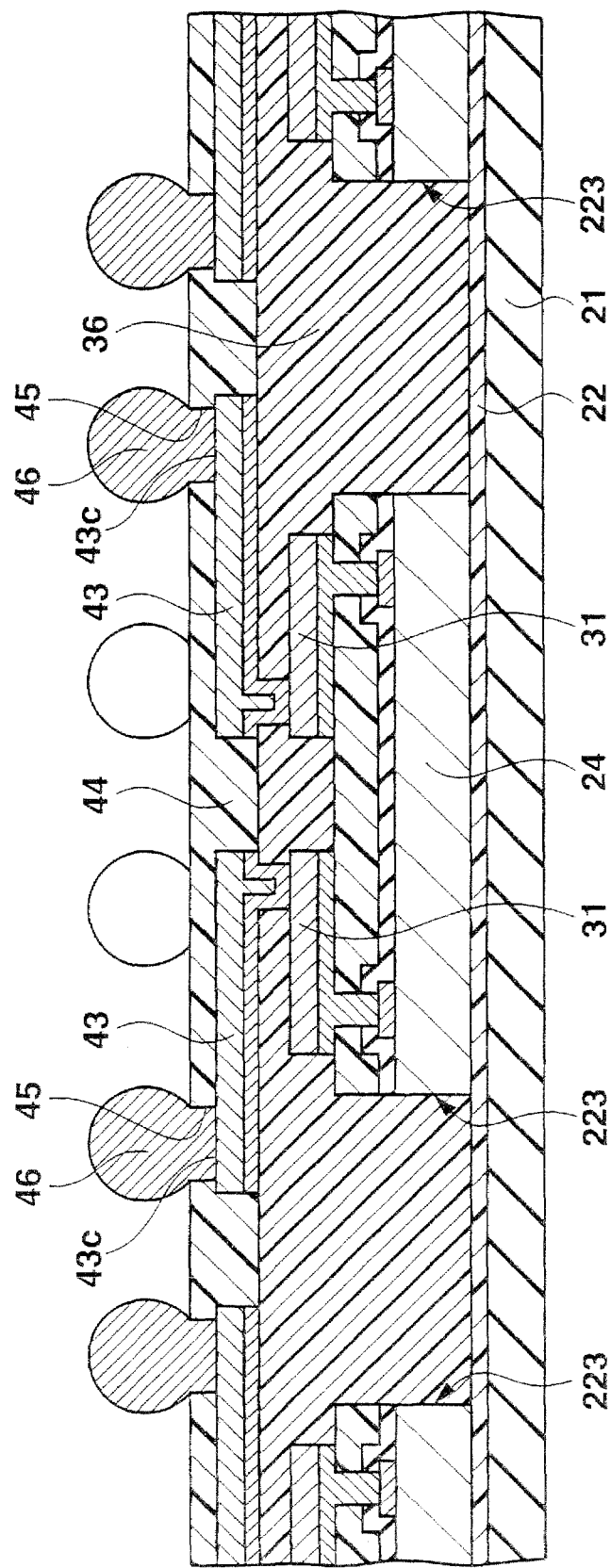
FIG. 75 is an enlarged sectional view showing a manufacturing step subsequent to FIG. 74.

As shown in FIG. 75, a solder resist insulating film 44 is patterned on the entire upper surface of the sealing film 36 including the upper distribution wires 43. Openings 45 are formed at portions of the insulating film 44 that correspond to the connection pads 43c of the upper distribution wires 43. Solder balls 46 are formed in and on the openings 45, and connected to the connection pads 43c of the upper distribution wires 43.

Figure 76:
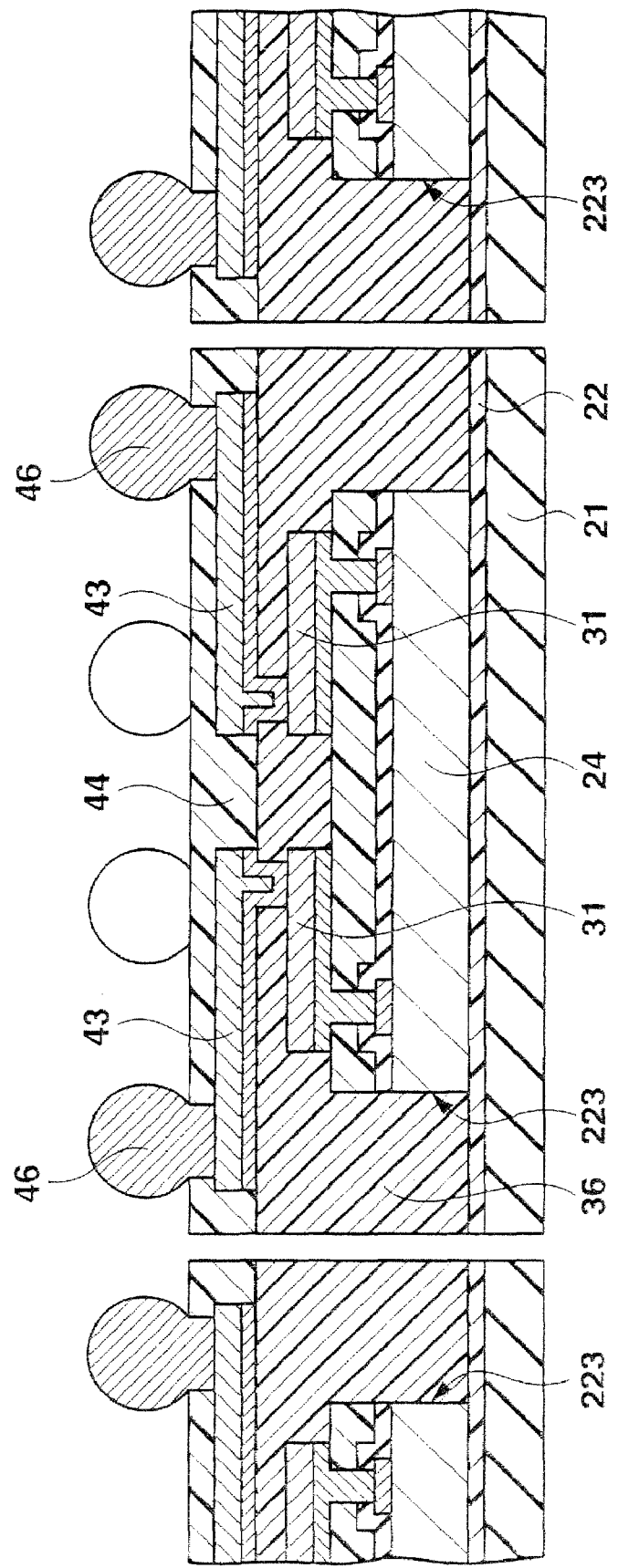
FIG. 76 is an enlarged sectional view showing a manufacturing step subsequent to FIG. 75.

As shown in FIG. 76, the insulating film 44, sealing film 36, adhesive layer 22, and base plate 21 are cut between adjacent semiconductor construction assemblies 223 to obtain a plurality of semiconductor devices shown in FIG. 69.

In the semiconductor device obtained in this way, the upper underlying metal layer 43a and upper metal layer 43b which are connected to the distribution wire 31 of the semiconductor construction assembly 223 are formed by electroless plating (or sputtering) and electroplating. The distribution wire 31 of the semiconductor construction assembly 223 and the upper distribution wire 43 can be electrically connected without bonding.

The upper distribution wire 43 is directly bonded by plating to the pad of the distribution wire 31 of the semiconductor construction assemble 223. The opening 38 of the upper insulating film 44 is strong enough as far as the opening 38 has a 10 μm×10 μm square area or the same circular area.

Figure 84:
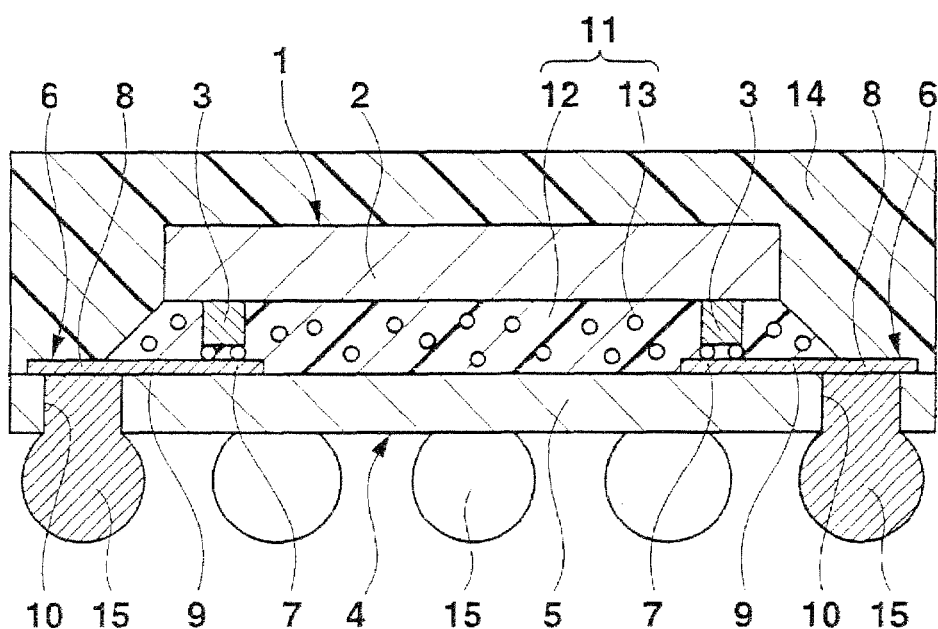
FIG. 84 is an enlarged sectional view showing an example of a conventional semiconductor device.

To the contrary, in the conventional semiconductor chip shown in FIG. 84, the diameter of the bump electrode 3 is about 100 to 150 μm (pitch is generally twice). Compared to a conventional method of bonding a bump electrode and distribution wire, the pad size of the distribution wire 31 is much smaller. Hence, the size and arrangement interval of the connection pad 43c connected to the pad of the distribution wire 31 can be greatly decreased, and the process becomes efficient.

Since the size and arrangement interval of the connection pad 43c can be decreased, the semiconductor device of the present invention having the upper distribution wire can also be downsized.

In the above manufacturing method, the semiconductor construction assemblies 223 are arranged and adhered to predetermined portions on the adhesive layer 22 of the base plate 21. The sealing film 36, upper underlying metal layer 43a, upper distribution wire 43, insulating film 44, and solder ball 46 are formed at once for a plurality of semiconductor construction assemblies 223. The resultant structure is cut into a plurality of semiconductor devices, which can simplify the manufacturing process.

A plurality of semiconductor construction assemblies 223 can be transferred together with the base plate 21, and the manufacturing process can also be simplified. If the outer size of the base plate 21 is set constant, the transfer system can be shared regardless of the outer size of a semiconductor device to be manufactured.

In the semiconductor device shown in FIG. 69, the protective film 27, sealing film 36, and insulating film 44 are stacked on the silicon substrate 24. The three resin layers can reduce the stress caused by the difference in thermal expansion coefficient between the silicon substrate 24 and a circuit board.

As a method of manufacturing the semiconductor device shown in FIG. 69, the method of the first embodiment using another base plate 60 shown in FIGS. 19 and 20 can be applied.

As another semiconductor device manufacturing method of the third embodiment, the method of the first embodiment shown in FIGS. 21 and 22 can also be applied.

First Modification of Third Embodiment

Figure 77:
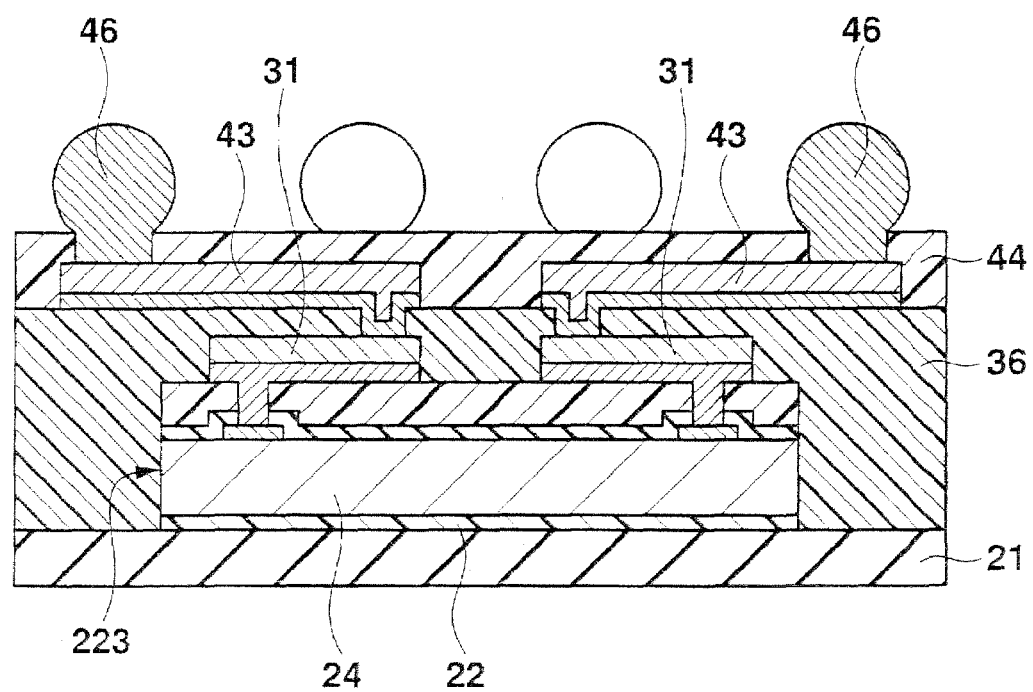
FIG. 77 is an enlarged sectional view showing the first modification to the semiconductor device according to the third embodiment of the present invention.

In the manufacturing step shown in FIG. 71, the adhesive layer 22 is formed on the lower surface of the silicon substrate 24 of the semiconductor construction assembly 223, and adhered to a predetermined portion on the upper surface of the base plate 21. In this case, a semiconductor device can be obtained as the first modification shown in FIG. 77 to the third embodiment of the present invention.

In the obtained semiconductor device, the lower surface of the silicon substrate 24 is adhered to the upper surface of the base plate 21 via the adhesive layer 22. The side surface of the silicon substrate 24 or the like is connected to the upper surface of the base plate 21 via the sealing film 36. The bonding strength of the semiconductor construction assembly 223 to the base plate 21 can be increased to a certain degree.

Second Modification of Third Embodiment

Figure 78:
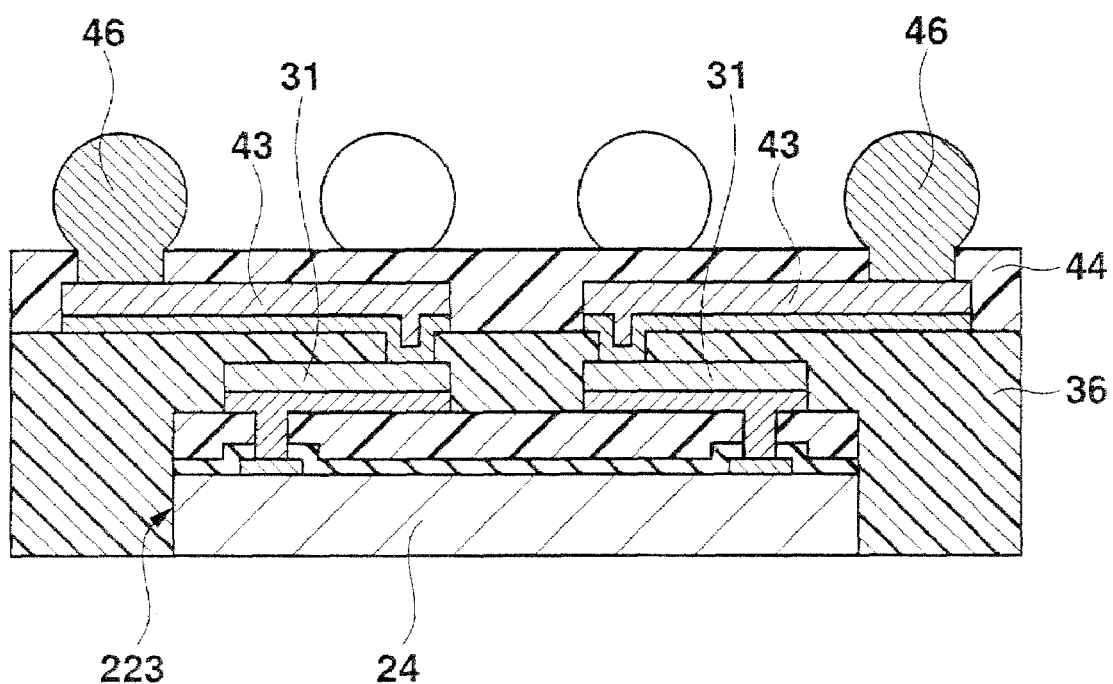
FIG. 78 is an enlarged sectional view showing the second modification to the semiconductor device according to the third embodiment of the present invention.

FIG. 78 is a sectional view showing a semiconductor device according to the second modification to the third embodiment of the present invention. This semiconductor device is different from the semiconductor device shown in FIG. 69 in the absence of the base plate 21 and adhesive layer 22.

In manufacturing the semiconductor device according to the third embodiment, the base plate 21 is peeled from the adhesive layer 22, or the base plate 21 and adhesive layer 22 are removed by polishing, etching, or the like after the solder balls 46 are formed, as shown in FIG. 75. The insulating film 44 and sealing film 36 are cut between adjacent semiconductor construction assemblies 223, obtaining a plurality of semiconductor devices shown in FIG. 78. The obtained semiconductor device does not comprise any base plate 21 and adhesive layer 22, and can be made lower in profile.

Third Modification of Third Embodiment

Figure 79:
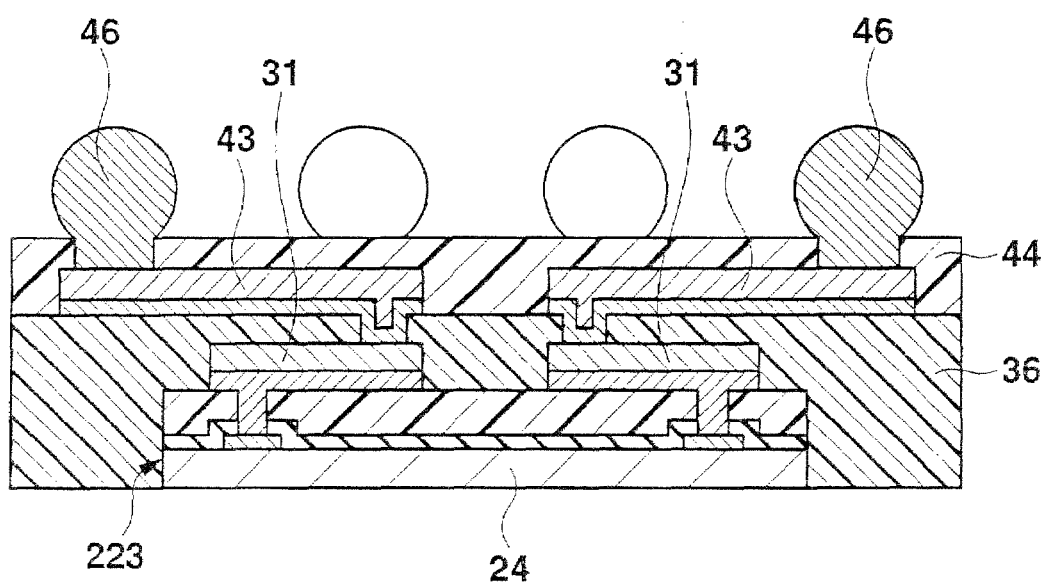
FIG. 79 is an enlarged sectional view showing the third modification to the semiconductor device according to the third embodiment of the present invention.

In FIG. 75, the base plate 21 and adhesive layer 22 are removed, and the lower surfaces of the silicon substrate 24 and sealing film 36 are appropriately polished. The insulating film 44 and sealing film 36 are cut between adjacent semiconductor construction assemblies 223, obtaining a plurality of semiconductor devices shown in FIG. 79 according to the third modification to the third embodiment of the present invention. The obtained semiconductor device can be made much lower in profile.

Before the solder balls 46 are formed, the base plate 21 and adhesive layer 22 may be removed by polishing, etching, or the like. (If necessary, the lower surfaces of the silicon substrate 24 and sealing film 36 are appropriately polished.) The solder balls 46 may be formed, and the insulating film 44 and sealing film 36 may be cut between adjacent semiconductor construction assemblies 223.

Fourth Modification of Third Embodiment

Figure 80:
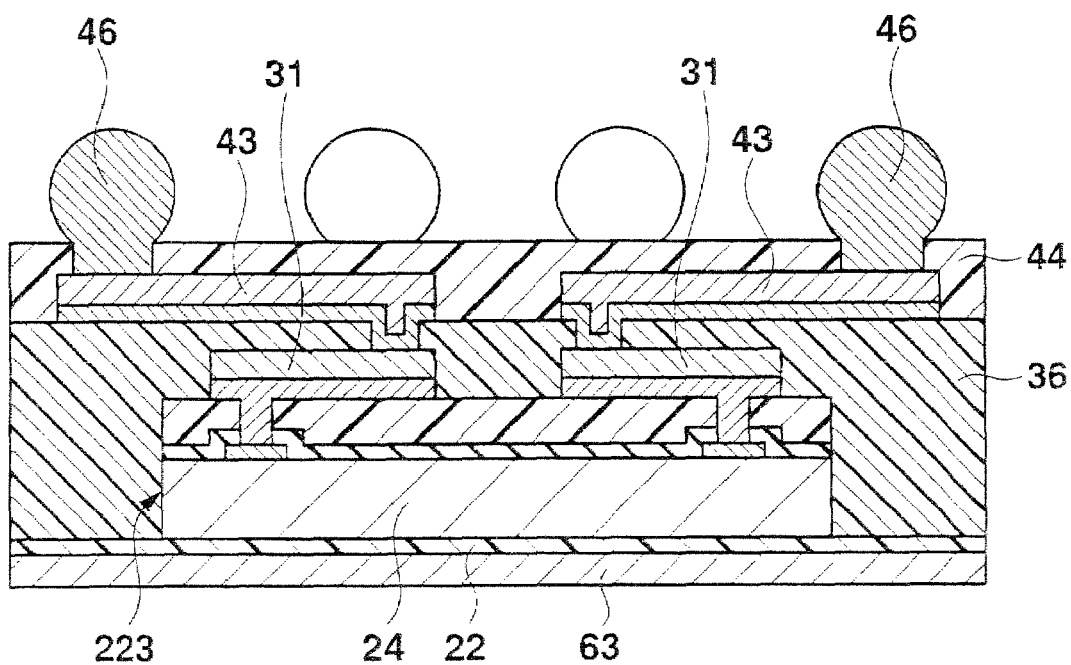
FIG. 80 is an enlarged sectional view showing the fourth modification to the semiconductor device according to the third embodiment of the present invention.

FIG. 80 is a sectional view showing a semiconductor device according to the fourth modification to the third embodiment of the present invention. This semiconductor device is different from the semiconductor device shown in FIG. 69 in that a heat dissipation metal layer 61 is adhered to the lower surface of the adhesive layer 22. The metal layer 61 is made of, e.g., copper foil several ten μm in thickness.

Fifth Modification of Third Embodiment

Figure 81:
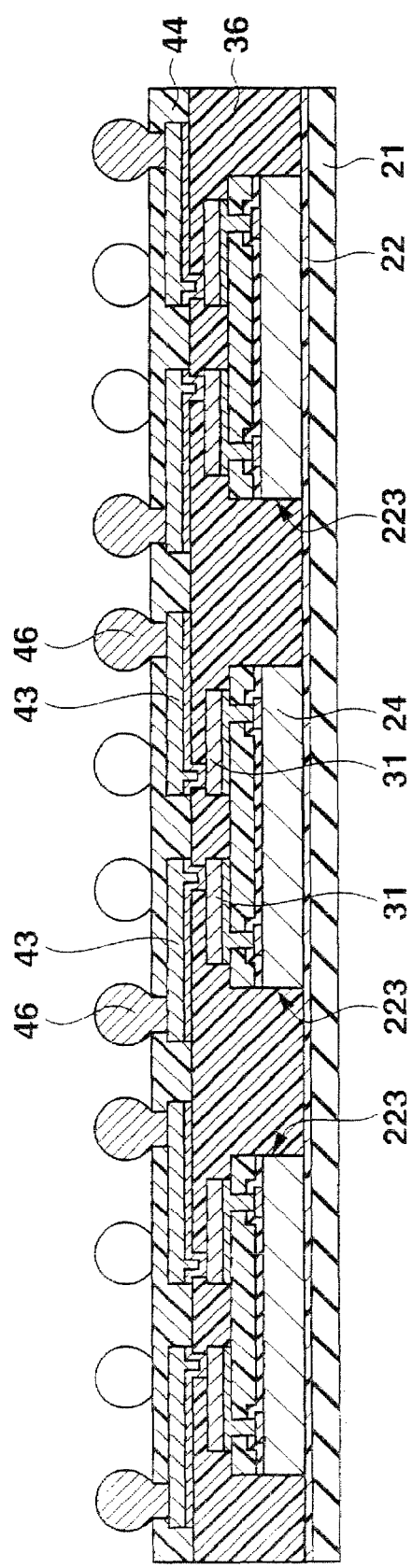
FIG. 81 is an enlarged sectional view showing the fifth modification to the semiconductor device according to the third embodiment of the present invention.

In the case shown in FIG. 69, the structure is cut between adjacent semiconductor construction assemblies 223. The present invention is not limited to this, and the structure may be cut for a set of two or more semiconductor construction assemblies 223. For example, as the fifth modification shown in FIG. 81 to the third embodiment of the present invention, the structure may be cut for a set of three semiconductor construction assemblies 223 to obtain a multi-chip module semiconductor device. A set of three semiconductor construction assemblies 223 may be of the same type or different types.

Sixth Modification of Third Embodiment

Figure 82:
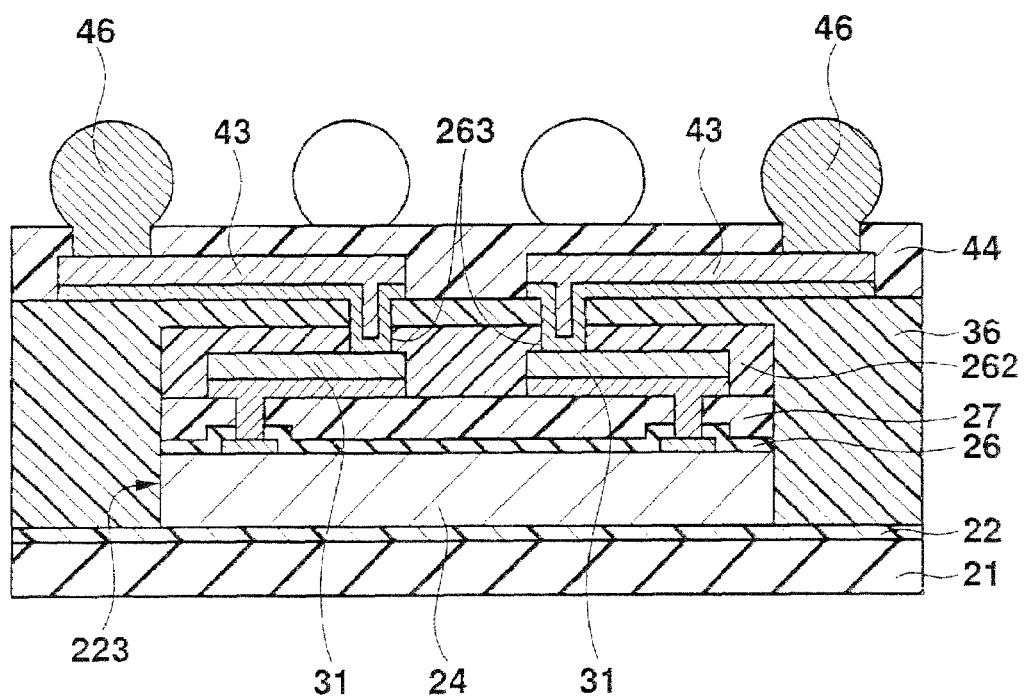
FIG. 82 is an enlarged sectional view showing the sixth modification to the semiconductor device according to the third embodiment of the present invention.

FIG. 82 is a sectional view showing a semiconductor device according to the sixth modification to the third embodiment of the present invention. This semiconductor device is different from the semiconductor device shown in FIG. 69 in that in the semiconductor construction assembly 223, an upper protective film 262 made of photosensitive polyimide or the like is formed on the upper surface of the protective film 27 including the distribution wires 31, and openings 263 are formed at portions of the upper protective film 262 that correspond to the pads of the distribution wires 31.

Seventh Modification of Third Embodiment

Figure 83:
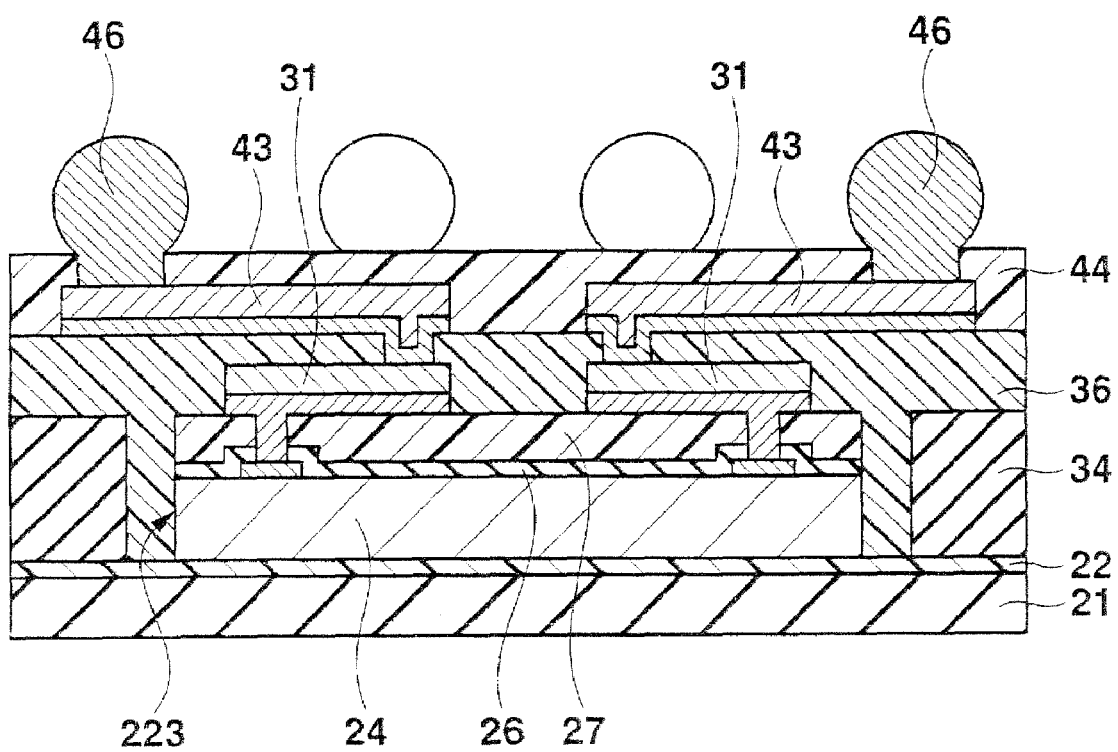
FIG. 83 is an enlarged sectional view showing the seventh modification to the semiconductor device according to the third embodiment of the present invention.

FIG. 83 is a sectional view showing a semiconductor device according to the seventh modification to the third embodiment of the present invention. This semiconductor device is different from the semiconductor device shown in FIG. 69 in that a square frame-like buried member 34 is formed on the upper surface of the adhesive layer 22 around the semiconductor construction assembly 223.

In this case, the thickness of the buried member 34 may be equal to that of the silicon substrate 24, a thickness including that of the insulating film 26, a thickness including that of the protective film 27, or a thickness including that of the distribution wire 31. The upper surface of the burled member 34 is therefore covered with the sealing film 36. The sealing film 36 is filled between the semiconductor construction assembly 223 and the buried member 34.

Another Embodiment

In each of the first to third embodiments, a modification to another embodiment can be applied, or modifications to the embodiment or modifications to another embodiment can be properly combined.

What is claimed is:

1. A semiconductor device, comprising:
   a first semiconductor construction assembly which includes a semiconductor substrate having a plurality of pads, a plurality of external connection electrodes connected to the connection pads, and a sealing film formed around the external connection electrodes;
   an insulating layer which covers side surfaces of the first semiconductor construction assembly;
   an upper insulating film which covers an entire upper surface of the first semiconductor construction assembly except the external connection electrodes;
   an upper wire which is formed on the upper insulating layer and which is connected to the external connection electrodes;
   an uppermost insulating film which is formed to cover the upper insulating film and the upper wire except the connection pad of the upper wire; and
   a second semiconductor construction assembly which includes at least one semiconductor substrate and a plurality of external connection electrodes connected to connection pads of the upper wire, and which is arranged on the uppermost insulating film.

2. The semiconductor device according to claim 1, wherein the external connection electrodes of the second semiconductor construction assembly are connected to the connection pads of the upper wire with a wire.

3. The semiconductor device according to claim 2, wherein the semiconductor substrate of the second semiconductor construction assembly is bonded to the uppermost insulating film by a bonding layer.

4. The semiconductor device according to claim 3, wherein the sealing film of the second semiconductor construction assembly is formed to be in contact with an upper surface of the uppermost insulating film, and to cover an entire upper surface of the semiconductor substrate and an entire peripheral member of the wire.

5. The semiconductor device according to claim 3, wherein the second semiconductor construction assembly comprises a first semiconductor substrate bonded to the uppermost insulating film, and a second semiconductor substrate which has a smaller planar size than the first semiconductor substrate and which is mounted on the first semiconductor substrate.

6. The semiconductor device according to claim 1, wherein the external connection electrodes of the second semiconductor construction assembly are columnar shaped and bonded onto the connection pads of the upper wire via a solder layer.

7. A semiconductor device comprising a first semiconductor block and a second semiconductor block,
    wherein the first semiconductor block comprises:
        a semiconductor construction assembly which includes a semiconductor substrate having a plurality of pads, a plurality of external connection electrodes connected to the connection pads, and a sealing film formed around the external connection electrodes;
        an insulating layer which covers side surfaces of the semiconductor construction assembly;
        an upper insulating film which covers an entire upper surface of the semiconductor construction assembly except the external connection electrodes; and
        an upper wire which is formed on the upper insulating layer and which is connected to the external connection electrodes, and
    wherein the second semiconductor block is arranged on the first semiconductor block and comprises:
        a semiconductor construction assembly which includes a semiconductor substrate having a plurality of pads, a plurality of external connection electrodes connected to the connection pads, and a sealing film formed around the external connection electrodes;
        an insulating layer which covers side surfaces of the semiconductor construction assembly;
        an upper insulating film which covers an entire upper surface of the semiconductor construction assembly except the external connection electrodes;
        an upper wire which is formed on the upper insulating layer and which is connected to the external connection electrodes; and
        a conductor which connects the upper wire of the first semiconductor block to the upper wire of the second semiconductor block.

8. The semiconductor device according to claim 7, wherein the conductor comprises upper and lower conducting members connected to the upper wire of the second semiconductor block through the insulating layer of the second semiconductor block, and a solder layer which connects the upper and lower conducting members of the second semiconductor block to the upper wire of the first semiconductor block.

* * * * *